(12) United States Patent
Modi et al.

(10) Patent No.: US 11,559,097 B2
(45) Date of Patent: Jan. 24, 2023

(54) SYSTEM AND METHOD OF ASCERTAINING A DESIRED FIT FOR ARTICLES OF CLOTHING UTILIZING DIGITAL APPAREL SIZE MEASUREMENTS

(71) Applicant: Short Circuit Technologies LLC, Rochester, NY (US)

(72) Inventors: Sankalp Sandeep Modi, Acton, MA (US); Shailesh Nirgudkar, Acton, MA (US)

(*) Notice: Subject to any disclaimer, the term of this patent is extended or adjusted under 35 U.S.C. 154(b) by 124 days.

(21) Appl. No.: 16/819,097

(22) Filed: Mar. 15, 2020

(65) Prior Publication Data

US 2020/0293701 A1    Sep. 17, 2020

Related U.S. Application Data

(60) Provisional application No. 62/819,543, filed on Mar. 16, 2019.

(51) Int. Cl.
*G06T 17/00* (2006.01)
*G06F 30/17* (2020.01)
(Continued)

(52) U.S. Cl.
CPC .............. *A41H 1/02* (2013.01); *A41H 1/00* (2013.01); *A41H 43/005* (2013.01); *G06F 30/17* (2020.01);
(Continued)

(58) Field of Classification Search
CPC .......... A41H 1/02; A41H 1/00; A41H 43/005; G06F 30/17; G06T 17/00; G06T 17/20
See application file for complete search history.

(56) References Cited

U.S. PATENT DOCUMENTS 8,364,561 B2   1/2013  Wolper et al.
9,971,854 B1 * 5/2018  Bowen ................. G06F 3/0484
(Continued)

FOREIGN PATENT DOCUMENTS

CN        104182880 A  * 12/2014
WO    WO-02057964 A2  *  7/2002 ............... A41H 1/00
(Continued)

OTHER PUBLICATIONS https://www.consumerreports.org/cro/news/2014/07/fitting-apps-help-you-get-the-right-size-the-first-time/index.htm; Fitting apps help you get the right size the first time Online clothes shopping is a breeze with these handy sizing tools; (Year: 2014).*
(Continued)

*Primary Examiner* — Rehana Perveen
*Assistant Examiner* — Nupur Debnath
(74) *Attorney, Agent, or Firm* — Zaretsky Group PC; Howard Zaretsky

(57) ABSTRACT

A novel and useful system and method for ascertaining a desired fit for at least one article of clothing (AOC) for a user using a digital size measurement that may include a memory, at a rendering device which may include a speaker or a display, a controller configured to obtain digital size certificate information (DSCI) comprising digital size information (DSI) related to the form of the AOC and corresponding identification information related to the AOC from the memory, reconstruct a 3D model of the AOC in accordance with the DSI, render the 3D model on the rendering device, modify the 3D model in accordance with an input of the user, form desired fitting DSI ($DSI_{DF}$) in accordance with the modified 3D model, and may store the $DSI_{DF}$ in the memory.

20 Claims, 32 Drawing Sheets

(51) Int. Cl.
  A41H 1/00     (2006.01)
  G06T 17/20    (2006.01)
  G06T 19/20    (2011.01)
  A41H 1/02     (2006.01)
  A41H 43/00    (2006.01)
(52) U.S. Cl.
  CPC .............. *G06T 17/00* (2013.01); *G06T 17/20* (2013.01); *G06T 19/20* (2013.01)

(56) References Cited

U.S. PATENT DOCUMENTS

| | | | |
|---|---|---|---|
| 9,996,981 | B1 * | 6/2018 | Tran .................. G06K 9/4671 |
| 10,282,914 | B1 * | 5/2019 | Tran .................. G01G 19/44 |
| 10,321,728 | B1 * | 6/2019 | Koh .................... G06T 11/203 |
| 10,460,525 | B1 | 10/2019 | Buuck |
| 11,140,936 | B2 * | 10/2021 | Oden .................. D06C 23/02 |
| 2010/0023426 | A1 * | 1/2010 | Wannier ............ G06Q 30/0603 705/26.1 |
| 2010/0030590 | A1 | 12/2010 | Wolper et al. |
| 2012/0310791 | A1 * | 12/2012 | Weerasinghe ... H04N 21/47815 705/27.2 |
| 2014/0165265 | A1 * | 6/2014 | Tulin .................. A41D 1/06 2/234 |
| 2015/0154691 | A1 * | 6/2015 | Curry ................. G06Q 30/0631 705/27.2 |
| 2015/0287242 | A1 * | 10/2015 | Kim .................... G06T 15/04 345/420 |
| 2016/0092956 | A1 | 3/2016 | Su et al. |
| 2016/0210602 | A1 * | 7/2016 | Siddique ............ G06Q 20/384 |
| 2016/0292779 | A1 * | 10/2016 | Rose .................. G06Q 30/0643 |
| 2017/0011452 | A1 * | 1/2017 | Beckham ............ G06Q 20/204 |
| 2017/0046769 | A1 * | 2/2017 | Jackson ............. G06Q 30/0643 |
| 2017/0352091 | A1 * | 12/2017 | Chen .................. G06F 3/04845 |
| 2018/0049498 | A1 * | 2/2018 | Koh .................... G05B 19/4097 |
| 2018/0068205 | A9 * | 3/2018 | Hill ..................... G06K 9/6215 |
| 2018/0197331 | A1 * | 7/2018 | Chen ................... G06T 19/20 |
| 2019/0057428 | A1 * | 2/2019 | Su ...................... G06Q 30/0621 |
| 2019/0122424 | A1 * | 4/2019 | Moore ................ G06T 7/50 |

FOREIGN PATENT DOCUMENTS

| | | | | |
|---|---|---|---|---|
| WO | WO-2018165239 | A1 * | 9/2018 | ............ A41H 3/007 |
| WO | WO-2019008360 | A1 * | 1/2019 | ............ A41B 11/14 |
| WO | WO-2019043734 | A1 * | 3/2019 | ............ G06T 19/20 |

OTHER PUBLICATIONS

Tingting Zhang et al.; "The Impact of Virtual Try-on Image Interaction Technology on Online Shoppers' Purchase Decision"; IC4E '17, Jan. 5-7, 2017 (Year: 2017).*
Lei Jiang and Kang Zhang; "Apparel Brand Overlap Based on Customer Perceived Value and Eye-Tracking Technology"; Tsinghua Science and Technology, Feb. 2018, 23(1): 47-64 (Year: 2018).*
Yueh-Chin Chen et al.; "Online Apparel Shopping Behavior Effects of Consumer Information Search on Purchase Decision Making in the Digital Age"; 2017 IEEE 8th International Conference on Awareness Science and Technology (iCAST 2017) (Year: 2017).*
https://www.mckinsey.com/~/media/mckinsey/industries/retail/our%20insights/digitization%20the%20next%20stop%20for%20the%20apparel%20sourcing%20caravan/the-next-stop-for-the-apparel-sourcing-caravan-digitization.pdf; Achim Berg et al. (Year: 2017).*
Agnieszka Cichocka et al. "3D Garment Modelling—Conception of its Structure in 3D"; (Year: 2016).*
Aric Bartie et al.; "Physics-driven Pattern Adjustment for Direct 3D Garment Editing"; (Year: 2016).*
Jituo Li et al.; "Fitting 3D garment models onto individual human models"; Computers & Graphics 34 (2010) 742-755 (Year: 2010).*
Li Duan et al; "Automatic three-dimensional-scanned garment fitting based on virtual tailoring and geometric sewing"; Journal of Engineered Fibers and Fabrics (Year: 2018).*
Aric Bartie et al.; "Physics-driven Pattern Adjustment for Direct 3D Garment Editing"; ACM Trans. Graph., vol. 35, No. 4, Article 50, Publication Date: Jul. 2016 (Year: 2016).*
Rajkishore Nayak et al.; "RFID in textile and clothing manufacturing: technology and challenges"; Fashion and Textiles (2015) 2:9 (Year: 2015).*
Jin Wang et al.; "Customer participating 3D garment design for mass personalization"; Textile Research Journal 81(2) 187-204 (Year: 2011).*
S. Thomassey et al;. "A template of ease allowance for garments based on a 3D reverse methodology"; International Journal of Industrial Ergonomics 43 (2013) 406-416 (Year: 2013).*
Deborah Weinswig, Fung Global Retail & Technology, 3D Body-Scanning Technology: Creating the Perfect Fit, Jun. 13, 2017.
Nadia Magnanet-Thulmann, www.Miralab.ch, Modelling for 3D Avatar for Virtual Try on, Oct. 9, 2018.
Hong Kong Polytechnic University, Intelligent 3-D human modelling technology projects body shape and size accurately within 10 seconds, https://phys.org/news/2018-04-d-human-technology-body-size.html, Apr. 11, 2018.
Yueh-Ling Lin, et al., Automated body feature extraction from 2D images, Science Direct, https://www.sciencedirect.com/science/article/pii/S0957417410 . . . , Expert Systems with Applications, vol. 38, Issue 3, pp. 2585-2591, Mar. 2011.
Hyunsook Han, et al., Automatic body landmark identification for various body figures, Science Direct, International Journal of Industrial Ergonomics, vol. 41, Issue 6, pp. 592-606, Nov. 2011.
Tan Xiaohui, et al., Automatic human body feature extraction and personal size measurement, Journal of Visual Languages and Computing, vol. 47, pp. 9-18, May 8, 2018.
Stefanie Wuhrer, et al., Estimating 3D Human Shapes from Measurements, Oct. 9, 2018.
Fadl elmoula Abd alia Hassan, University of Gezira, Development of Human Body Measurements Size System for Clothing, https://www.researchgate.netpublication/259829301_Development_of_Human_Body_Measurements_Size_System_for_Clothing, Jan. 2009.
Taeyoung Uhm, et al., Fully vision-based automatic human body measurement system for apparel application, Science Direct, https://www.sciencedirect.com/science/article/pii/S0263224114 . . . , Measurement, vol. 61, pp. 169-179, Feb. 2015.
Kaixuan Liu, et al., Fit evaluation of virtual garment try-on by learning from digital pressure data, https://www.researchgate.net/publication/318127007_Fit_evalua . . . , Knowledge-Based Systems, 13:174-182, Jul. 2017.
How it works, https://www.virtusize.com/site/how-it-works, Oct. 17, 2018.
Chris Dunn, How Sizing Technology Can Bring Online Apparel Returns Down to Zero, Total Retail, https://www. mytotalretail.com/article/sizing-technology-can-bri . . . , May 11, 2015.

* cited by examiner

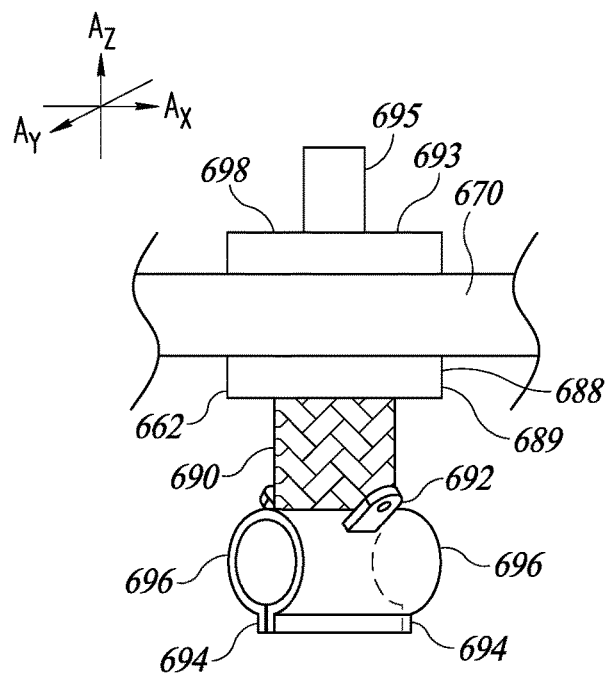
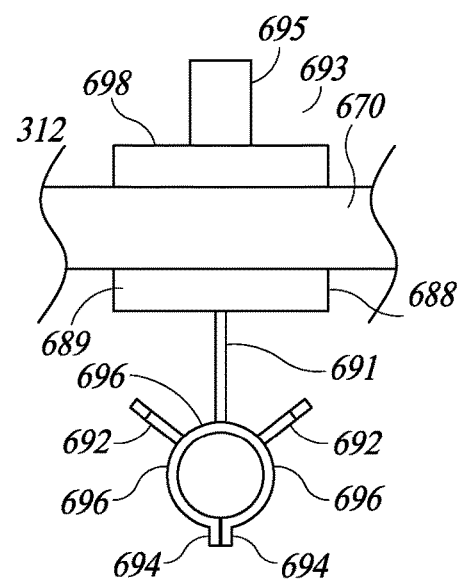
FIG. 12    FIG. 13
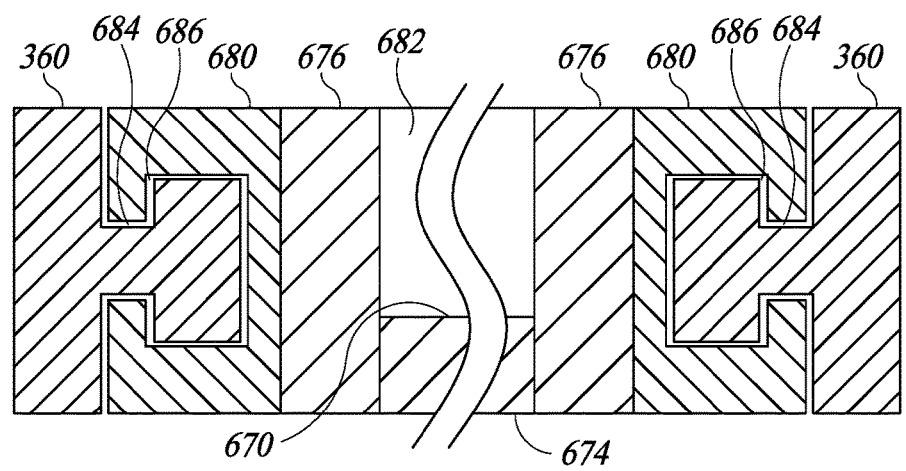
FIG. 14

SYSTEM AND METHOD OF ASCERTAINING A DESIRED FIT FOR ARTICLES OF CLOTHING UTILIZING DIGITAL APPAREL SIZE MEASUREMENTS

REFERENCE TO PRIORITY APPLICATION

This application claims the benefit of U.S. Provisional Application No. 62/819,543, filed on Mar. 16, 2019, entitled "DigiSize And Virtual Alterations: System And Methods To Reduce Apparel Trials And Returns Due To Undesirable Fitting," the contents of which are incorporated herein by reference in their entirety.

FIELD OF THE INVENTION

The present invention relates generally to size measuring and fitting articles of clothing and in particular to an apparatus and method for generating digital size measurements for articles of clothing and a method of fitting articles of clothing.

BACKGROUND OF THE INVENTION

There are two main types of channels which a consumer may use to purchase ready-made clothing: brick and mortar sales channels (e.g., using physical stores) and online sales channels (e.g., Internet channels using online stores). In both types of sales channels, the consumer may select an article of clothing based upon one or more factors such as specified size (e.g., size 1, 2, 3 . . . or S, M, L, XL, . . . as may be indicated on a size label of an apparel) and the like. Unfortunately, specified sizes are selected by a manufacturer of clothing and typically do not correspond with industry-wide standard. As such, specified sizes may vary based upon brand, manufacturer, etc., making it difficult to determine an exact fit. Further, as conventional clothing is to some extent hand-made or hand-assembled, variations in physical size from item-to-item may vary widely and may be difficult to control without adequate and quality control measures which are costly and time-consuming. For these reasons and others indicated clothing size may not accurately reflect actual sizes of clothing. Lastly, existing sizing methods do not convey information related to elasticity of articles of clothing which information may be desirable to a user to use to find determine a correct fit.

For these reasons and others, conventional sizing methods for clothing may only provide a first cut approximation of clothing dimensions and does not provide an indication as to how an article of clothing will fit shoppers with a multitude of body shapes and/or sizes. Accordingly, information conveyed by conventional sizing methods is limited, inadequate, non-standard, confusing, and unreliable. This may make it difficult for shoppers to select clothing by size with certainty. Often, to find a correct fit, shoppers must typically try on several articles of clothing and may select to purchase only one of them. This may inconvenience shoppers as well as increase costs incurred by vendors. For example, vendors with physical stores may incur additional costs due to fitting rooms and associated personnel which are necessary for monitoring fitting rooms and returning clothes that were tried on by a shopper and not purchased. Further, online vendors may incur additional costs due to returns and associated shipping charges for clothing that was tried on by a shopper and returned because of an incorrect fit. Unfortunately, this may increase costs to merchants and may inconvenience the consumer. Additionally, clothing that is shipped to the consumer to be tried on during a trial period is tied up and are not available for sale to other consumers during this trial period. Further, as clothing styles may be seasonal, a delay in access for sale may result in apparel going out-of-style or out-of-season which may result in a loss of value.

Accordingly, it is desirable to have a sizing method which may more accurately reflect sizing and/or fit of an article of clothing as well as a system which may accurately determine at least one correctly fitting article of clothing that may be recommended to a consumer.

SUMMARY OF THE INVENTION

In accordance with embodiments of the present system, there is provided a system and method for ascertaining a desired fit for at least one article of clothing (AOC) for a user, the device may include one or more of: at least one memory; at least one rendering device which may include at least one of a speaker or a display; at least one controller configured to: obtain digital size certificate information (DSCI) comprising digital size information (DSI) related to at least one of form of the at least one AOC and corresponding identification information related to the at least one AOC from the at least one memory; reconstruct a 3D model of the at least one AOC in accordance with the DSI; render the 3D model on the at least one rendering device; modify the 3D model in accordance with an input of the user; form desired fitting DSI ($DSI_{DF}$) in accordance with the modified 3D model; and may store the $DSI_{DF}$ in the at least one memory.

In accordance with some embodiments, the at least one controller may be configured to render a measurement related to at least one location in response to the user selecting the at least one location on the 3D model. It is envisioned that the at least one controller may be further configured to modify the rendered measurement in accordance with an input of the user and modify the $DSI_{DF}$ accordingly. In some embodiments, the at least one controller may be further configured to obtain DSI for a plurality of articles of clothing of a vendor (DSI-V). It is envisioned that the at least one controller is further configured to determine a match score (MS) for each of the plurality of articles of clothing of the vendor based upon a comparison of the DSI of the at least one AOC and the DSI-V. It is envisioned that the at least one controller may be further configured to render the determined match score (MS) for each of the plurality of articles of clothing of the vendor. It is envisioned that the least one controller may be further configured to select one or more articles of clothing of the vendor that have a match score (MS) that is greater than a threshold value. In some embodiments, it is envisioned that the controller may be further configured to render an image of the selected one or more articles of clothing of the vendor and their associated match score (MS).

In accordance with embodiments of the present system, there is also provided a method for ascertaining a desired fit for at least one article of clothing (AOC) for a user, the method may be performed by at least one controller, the method include one or more acts of: configuring the at least one controller to: obtain digital size certificate information (DSCI) comprising digital size information (DSI) related to at least one of form of the at least one AOC and corresponding identification information related to the at least one AOC from a memory of the system; reconstruct a 3D model of the at least one AOC in accordance with the DSI; render the 3D model on the at least one rendering device comprising at least one display; modify the 3D model in accordance with an input of the user; form desired fitting DSI ($DSI_{DF}$) in accordance with the modified 3D model; and store the $DSI_{DF}$ in the memory.

It is envisioned that the at least one controller may be further configured to render a measurement related to at least one location in response to the user selecting the at least one location on the 3D model. The at least one controller may be further configured to modify the rendered measurement in accordance with an input of the user and modify the $DSI_{DF}$ accordingly. It is envisioned that the at least one controller may be further configured to obtain DSI for a plurality of articles of clothing of a vendor (DSI-V). In some embodiments, the at least one controller may be further configured to determine a match score (MS) for each of the plurality of articles of clothing of the vendor based upon a comparison of the DSI of the at least one AOC and the DSI-V. It is envisioned that the at least one controller may be further configured to render the determined match score (MS) for each of the plurality of articles of clothing of the vendor. It is envisioned that the at least one controller may be further configured to select one or more articles of clothing of the vendor that have a match score (MS) that is greater than a threshold value. In some embodiments, the controller may be further configured to render an image of the selected one or more articles of clothing of the vendor and their associated match score (MS) on the at least one rendering device.

In accordance with embodiments of the present system, there is further provided method for determining a desired fit for at least one article of clothing (AOC) for a user, the method may be performed by at least one controller and may include acts of: configuring the at least one controller to: obtain digital size certificate information (DSCI) comprising digital size information (DSI) related to at least one AOC and from a memory of the system; reconstruct a 3D model of the at least one AOC in accordance with the DSI; render the 3D model on the at least one rendering device comprising at least one display; modify the 3D model in accordance with an input of the user; form desired fitting DSI ($DSI_{DF}$) in accordance with the modified 3D model; and/or may store the $DSI_{DF}$ in the memory.

In some embodiments, it is also envisioned that the at least one controller may be further configured to perform an act of rendering a measurement related to at least one location in response to the user selecting the at least one location on the 3D model. It is envisioned that the at least one controller may be further configured to perform an act of obtaining DSI for a plurality of articles of clothing of a vendor (DSI-V). It is further envisioned that the at least one controller may be further configured to perform an act of determining a match score (MS) for each of the plurality of articles of clothing of the vendor based upon a comparison of the DSI of the at least one AOC and the DSI-V.

This summary is provided to introduce a selection of concepts in a simplified form that are further described below in the Detailed Description section. This Summary is not intended to identify key features or essential features of the claimed subject matter, nor is it intended to be used as an aid in determining the scope of the claimed subject matter.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein:

FIG. 12 is a detailed front perspective view of a portion of the apparel coupler of FIG. 9 in accordance with embodiments of the present invention;

FIG. 13 is a detailed side view of a portion of the apparel coupler of FIG. 12 in accordance with embodiments of the present invention;

FIG. 14 is a cross sectional view of a portion of the APS coupled to feeder lines taken along lines 14-14 of FIG. 4 in accordance with embodiments of the present invention;

DETAILED DESCRIPTION OF THE INVENTION

Figure 1:
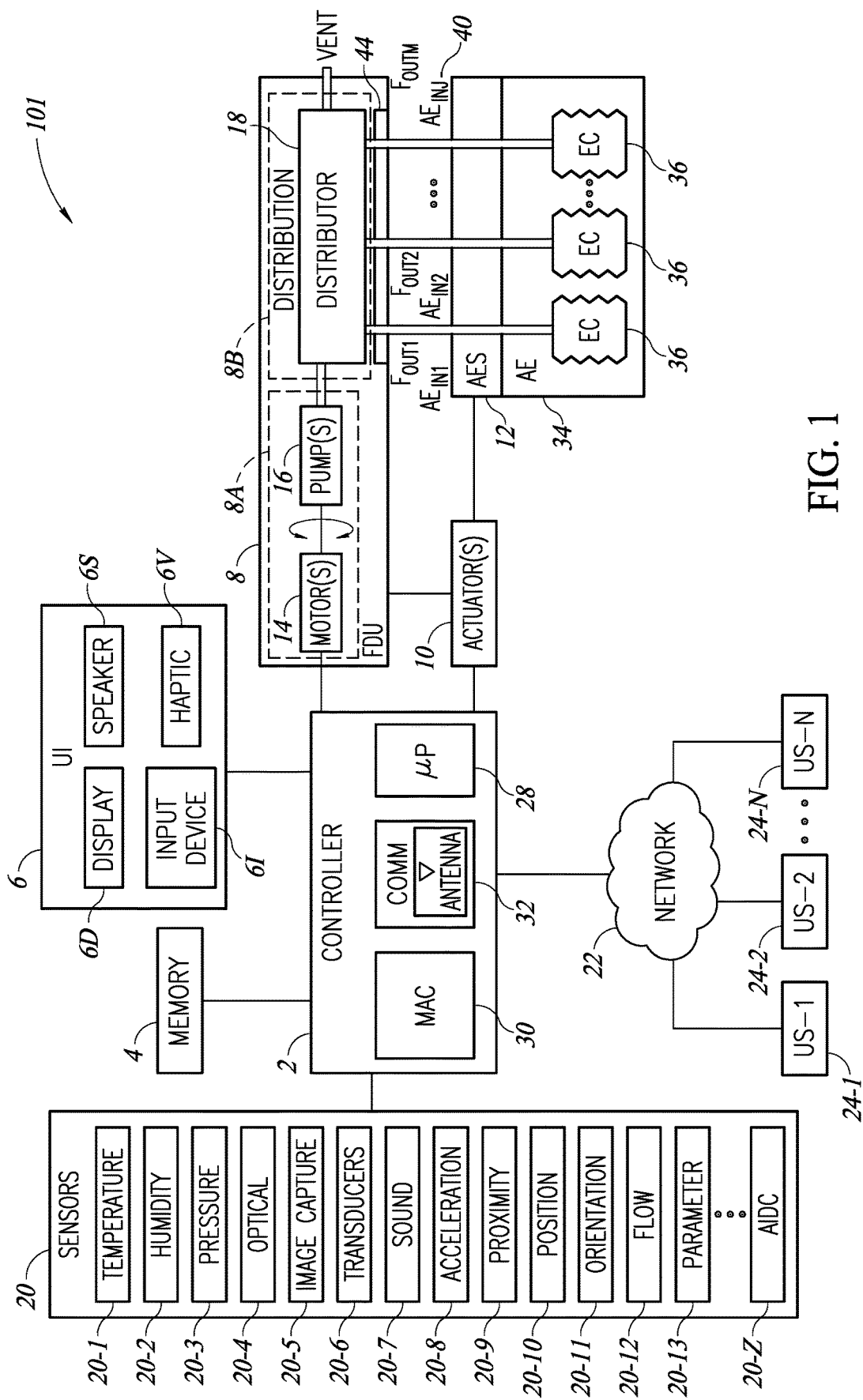
FIG. 1 is a block diagram of a portion of a digiforming system in accordance with embodiments of the present invention.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The terminology used herein is for the purpose of describing particular embodiments only and is not intended to be limiting of the invention. As used herein, the singular forms "a", "an" and "the" are intended to include the plural forms as well, unless the context clearly indicates otherwise. In addition, throughout the specification, the meaning of "a," "an," and "the" include plural references.

It will be further understood that the terms "comprises" and/or "comprising," when used in this specification, specify the presence of stated features, integers, steps, acts, operations, elements, and/or components, but do not preclude the presence or addition of one or more other features, integers, steps, acts, operations, elements, components, and/or groups thereof.

The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention. In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. The meaning of "in" includes "in" and "on."

The terminology used herein is for the purpose of describing particular embodiments only and is not intended to be limiting of the invention. It will be further understood that the terms "comprises" and/or "comprising," when used in this specification, specify the presence of stated features, integers, steps, acts, operations, elements, and/or components, but do not preclude the presence or addition of one or more other features, integers, steps, acts, operations, elements, components, and/or groups thereof.

In addition to conventional terminology the following terms may apply without limitation. For example, the term coupling, coupled, and/or the like, may include a mechanical and/or fluid coupling unless the context indicates otherwise. Further, without limitation, as used herein the terms fluid coupling(s), fluidly coupled, fluidic coupling, and/or the like may be used to denote any fluid or gas communication pathway in which a fluid such as a liquid or a gas may flow. For example, fluid couplings may be used to denote any fluid (e.g., liquid or gas) communication pathway which may include one or more conduits, hoses, pipes, pumps, valves, pathways, and/or other intermediate members. Further, a fluid coupling may further include a valve, a pump, a flow control device, and/or a pressure control device to control the flow and/or pressure of a fluid such as a liquid or a gas which may be active or passively controlled.

The terms presented in Table 1 below apply without limitation unless the context indicates otherwise.

TABLE 1

| Term | Definitions |
|---|---|
| AAI | Apparel Alteration Information |
| AC | Alternating Current |
| AE | Apparel Expander |
| AES | Apparel Expander Support |
| AIDC | Automatic Data Identification And Data Capture |
| AOC | Article Of Clothing |
| APS | Apparel Support |
| AR | Augmented Reality |
| B&M | Brick and Mortar |
| CAN | Controller Area Network |
| CI | Context Information |
| CM | Comparison Mode |
| CNTRL | Control Signal |
| CSM | Cross Section Mode |
| DA | Desired AOC |
| DC | Direct Current |
| DCM | Digiform Comparison Mode |

TABLE 1-continued

Term Definitions

| | |
|---|---|
| DFA | Desired Fitting Apparel |
| DSC | Digiform Certificate |
| DSCI | Digiform Certificate Information |
| DSI | Digital Size Information |
| DVM | Digiform Visualization Mode |
| EC | Expansion Chamber |
| ECP | Estimated Customer Physique |
| ECPM | Estimated Customer Physique Mode |
| ECPMI | Estimated Customer Physique Model Information |
| ETM | Elasticity Tool Mode |
| FCV | Flow Control Valve |
| FDC | Fluid Distribution Channel |
| FDU | Fluid Distribution Unit |
| FR | Flow Rate |
| FTM | Fold Tool Mode |
| GUI | Graphical User Interface |
| HAN | Home Area Network |
| IAN | Internet Area Network |
| ID | Identification |
| IH | Inflation Hanger |
| LAN | Local Area Network |
| LCD | Liquid-Crystal Display |
| LM | Locate Mode |
| LRA | List Of Registered Apparel |
| MAC | Motor/Actuator Controller |
| MI | Meta Information |
| MIB | Mannequin Inflation Board |
| MIBA | Mannequin Inflation Board Assembly |
| MS | Match Or Matching Score |
| MSA | Match Or Matching Score AOC |
| MTTM | Measure Tape Tool Mode |
| NFC | Near Field Communication |
| OCR | Optical Character Recognition |
| OLED | Organic Light-Emitting-Diode |
| OPF | Operating Fluid |
| PAN | Personal Area Network |
| PI | Pressure Information |
| PLD | Programmable Logic Device |
| PTV | Pressure Threshold Value |
| QR | Quick Response Code |
| RD | Rendering Device |
| RFID | Radio Frequency Identification |
| SESI | Sensor Selection Information |
| SM | Scan Mode |
| SSI | Shopper Information |
| SSS | Shape Sensing Sensors |
| SUID | Shopper Provided Unique Identifier |
| TTV | Text to Voice |
| UI | User Interface |
| US | User Station |
| VAA | Virtually Altered Apparel |
| VAM | Virtual Alteration Mode |
| VEI | Vendor Information |
| VMM | View And Measure Mode |
| VR | Virtual Reality |
| VTT | Voice to Text |
| WAN | Wide-Area Network |

Embodiments of the present invention may include a digital sizing, grouping, rendering, fitting, and prediction system which may employ a digital size certificate information which may be referred to as a digiform certificate information (DSCI) and may include digital size information (DSI) and associated meta information (MI) as may be discussed elsewhere in this application in further detail. The DSI may include information related to at least one of form, shape, and size of a scanned article of clothing (AOC) as may be represented by a two-dimensional (2D), three-dimensional (3D), or four-dimensional (4D) information such as a 2D, 3D, or 4D model that may include information related to shape, size, time, and/or elasticity of one or more scanned AOC. Generally, the DSCI for an AOC may be referred to as a DigiSize. Thus, for a plurality of AOCs each may have their own unique Digi Size. A plurality of AOC may be referred to as AOCs. As used herein the terms digiform, digiformed, and digiforming may be used interchangeably with the terms digisize, digisized, and digisizing, respectively.

A process, method, and/or operation of scanning or otherwise measuring an AOC to determine at least corresponding DSI and/or DSCI may be referred to as digiforming operation and/or digiforming as may described in accordance with embodiments of the present invention elsewhere in this document. Thus, after an AOC undergoes digiforming, it may be considered to be digiformed. A digiforming center may be third-party operation which may perform digiforming on AOCs for vendors and/or shoppers.

Embodiments of the present invention may overcome disadvantages of conventional apparel sizing and fitting systems, apparatus, and/or methods, and may provide one or more of a system, a device, a computer program, a method, an algorithm, and/or an apparatus (hereinafter each of which may be referred to as a system unless the context indicates otherwise) which may scan an apparel during a digiforming operation and determine and/or generate, change, update, modify, store, and/or access information related to the scanned apparel such as DSI and associated DSCI. The system may modify DSCI, or portions thereof, in accordance with system and/or user settings. The system may perform these acts for a plurality of articles of clothing (AOCs) and may group the DSCI, or portions thereof, in accordance with system settings, as may be set by the system and/or user such as a vendor and/or shopper, and may store the DSCI in a memory of the system for later use.

It is envisioned that DSCI for at least one AOC may be parameterized, grouped, sub-grouped, and/or may be associated with vendor information (VEI) or shopper information (SSI). For example, the DSCIs of AOCs of a vender, such as a manufacturer, may be parameterized, grouped and/or sub-grouped in association with the VEI for the corresponding vendor and may be stored in memory of the system for later use. Thus, the VEI may include parameterized information. It is envisioned that parameterization may be distinguished from grouping or sub grouping. For example, when a DSCI is not parameterized, it may include fixed digital dimensions and/or elasticity, which may represent information such as an inner cavity of AOCs with substantially the same shape, size, and/or characteristics. A user may compare two DSCI. But when DSCI is parameterized, it may represent a much wider range of sizes and/or other variations and comparison may be meaningful after one or more parameters have been specified for comparison of this DSCI. A non-parameterized DSCI may represent the fitting of a ready-made AOC while a parameterized DSCI may represent more of particular style provided by vendor in catalog which may be tailor made. Note that this should not be confused with virtual alteration described later on. In parameterized DSCI, a vendor already has an idea what variability customers want and which may be offered for a specific style of AOC, while in virtual alterations users may provide information by specifically indicating what the user desires. For example, a vendor may offer DSCI of a men's shirt where it has a fixed material, elasticity, and a fixed ratio of chest and belly diameter, however, a user may parameterize, sleeve length, chest diameter, and length of the shirt within certain limits. While in-virtual alterations, a user may specify any desired change including any custom ratio of chest and belly diameter.

It is further envisioned that the VEI may include information corresponding with a vender of a plurality of vendors as may be set by the system and/or user. Thus, each vendor may have associated VEI or a plurality of vendors may have associated VEI. For example, a merchant belonging to a retailer's cooperative or the like may have VEI which may include VEI of a plurality of manufactures which may supply the merchant with the AOCs. For the sake of clarity, however, it will be assumed that VEI may be associated with a corresponding vendor. It is envisioned that DSCI or portions thereof may be associated with a corresponding vendor and stored in the VEI associated with the vendor. For example, an apparel or clothing vender may have VEI which may include DSCI for at least one AOC associated with the vender such as AOCs which the vender may sell, distribute, offer for sale, lease, advertise, etc. and which may have been digiformed so as to have corresponding DSCI available.

As used herein, the term vender may refer to a user of the system such as a vender, a merchant, a wholesaler, a manufacturer, a supplier, distributor, a lessor, a renter, a seller, and/or the like (each of which, or each of whom may be referred to as a vendor hereinafter for the sake of clarity unless the context indicates otherwise) who may import, manufacture, produce, lease, rent, provide, supply, offer for sale, advertise, distribute, and/or sell apparel, clothing and/or the like (hereinafter each of which may be referred to as clothing or the like). This clothing (e.g., at least one AOC) may have corresponding DSCI, DSI, MI, and/or the like which may be formed in accordance with embodiments of the present invention. It is further envisioned that the term vendor may include third parties which may perform digiform operations to digiform AOCs for other vendors and form corresponding DSCI. For example, it is envisioned that one or more AOCs belonging to a shopper may be digiformed by digiforming Centers to form corresponding DSCI. Such a center may be operated by a vendor such as a retailer or an independent vendor and may digiform AOCs for vendors and/or shoppers.

It should be understood that the term clothing may include any suitable article of clothing such as apparel, accessories, and/the like, and/or portions thereof such as, pants individually or pants of a suit, etc. Thus, the term clothing may include any suitable article(s) of clothing (AOC) or portions thereof. It should be understood that clothing may refer to a physical (e.g., real) clothing or portions thereof, virtual clothing, and/or combinations thereof.

The MI may include information which may assist shoppers or vendors in recognizing or identifying the apparel such as an identification, name, color, image, style, etc. The MI may include information which may be provided by a user such as a shopper or vendor. For example, a shopper may provide a unique identifier for a corresponding apparel such as: a user defined label such as ("My Blue Dress"); a description of the apparel such as ("Black Levi's Jeans"); photo of the apparel or a label thereof; any other photo to be associated with the AOC. This unique identifier may then form at least a portion of the MI that may be associated with the DSI and corresponding DSCI which may then be associated with the SSI of the shopper. This MI may then be used to identify the AOC from among one or more AOCs of the shopper which may be saved in the SSI of the shopper. It is envisioned that the system may generate, change, modify, update, store, and/or access the DSCI of a shopper or a vendor. It is further envisioned that the MI may include location information associated with one or more AOCs. This location information may include any suitable location information such as geophysical location and/or storage area information which may identify a location of an AOC within a building of a vendor. Such storage area information may include, for example, floor, storage area, rack identifier, shelf identifier, etc.

It is envisioned that clothing (e.g., AOC) may be grouped or sub-grouped or otherwise defined in accordance with a type (e.g., pants, shirts, suits, jackets, skirts, leggings, blouses, vests, shoes, boots, sneakers, men's, women's, children's, etc.) and/or DigiSize. These groups may be associated with a vender or a shopper. For example, one DSCI may be associated with one or more groups or subgroups of clothing of the vender and stored as DSCI in the VEI of the vendor. It is envisioned that DSCI for one or more AOCs may be associated with VEI and may be grouped, sub-grouped, and/or parameterized as desired. Accordingly, embodiments of the system may provide an interface with which a user may interact with the system in accordance with embodiments of the invention.

As used herein, the term shopper may refer to a user of the system such as a shopper, a consumer, a purchaser, a lessee, a customer, and/or the like who may purchase, rent, wear, try on, consume, shop for, trial, etc., one or more AOCs. Each user of the system may have an associated profile. For example, a shopper may have an associated user profile (aka shopper profile information or profile information) which may include information related to an account of the shopper such as account information, profiles, system settings, preferences, etc. The shopper profile information may be stored in association with the SSI and vendor profile information may be stored in association with the VEI. The system may render profile information in response to a request from a corresponding user such as a corresponding shopper and may store this information in a memory of the system for later use. Thus, the system may render information associated with a shopper's account in response to a request for this information from the shopper. Such information may include, for example, user profile and/or DSCI or portions thereof such as DSI, MI, and/or the like which may be stored as shopper information (SSI) in a memory of the system. The SSI may include information associated with an account of a shopper such as a profile information of an account of the shopper and associated DSCI.

A block diagram of a portion of a digiforming system 101 (hereinafter system 101 for the sake of clarity unless the context indicates otherwise) in accordance with embodiments of the prevent invention is shown in FIG. 1. The system 101 may include one or more of a controller 2, a memory 4, a user interface (UI) 6, a fluid distribution unit (FDU) 8, an actuator 10, an apparel expander support (AES) 12, an apparel expander (AE) 34, an apparel support (APS) (e.g., see, 338, FIG. 3), sensors 20, a network 22, and user stations (USs) 24-1 through 24-N (generally USs), where N is an integer. In some embodiments of the present invention only a single US of the USs may be discussed for the sake of clarity unless the context indicates otherwise.

The controller 2 may control the overall operation of the system 101 and may include a motor/actuator controller (MAC) 30, a communications portion 32, and one or more logic devices such as programmable logic devices (PLDs), microprocessors, logic circuits, and/or logic gates, etc. For example, the one or more logic devices may include one or more microprocessors 28. It is further envisioned that the one or more portions of the controller 2 such as the logic devices may be local and/or remotely located relative to each other. For example, the controller 2 may include a plurality of microprocessors (μPs) 28 which may be distributed through the network 22. The controller 2 may generate, change, store, and/or access information generated by the system 101 such as operating instructions, settings, parameter information, content, DSCs, DSI, DSCI, MI, VEI, SSI, profile information, and/or other information. The controller 2 may further include comparison engine for performing comparisons to, for example, determine a match score (MS) to find an apparel that may fit a shopper as may be discussed below. It is envisioned that the controller 2 may implement one or more algorithms in accordance with embodiments of the present invention.

The sensors 20 may include one or more sensors which may sense, generate corresponding sensor information, and provide this sensor information to the controller 2 of the system for further processing. For example, the sensors 20 may include Z sensors 20-1 through 20-Z, where Z is an integer, such as one or more of temperature sensors 20-1, humidity sensors 20-2, pressure sensors 20-3, optical sensors 20-4, image capture sensors 20-5 (e.g., a camera or the like), transducers 20-6 (e.g., ultrasound, X-ray, microwave, millimeter wave, etc.), sound sensors 20-7 (e.g., a microphone, etc.), acceleration sensors 20-8, proximity sensors 20-9, position sensors 20-10, and orientation sensors 20-11, flow sensors 20-12, parameter sensors 20-13, and automatic data identification and data capture (AIDC) compatible sensors 20-Z each of which sense a corresponding condition (e.g., a parameter, etc.) and may generate corresponding information such as temperature information, humidity information, pressure information, optical information (e.g., infrared or laser beam sensors and the like), image information, echo information (e.g., ultrasound, X-ray, microwave, millimeter wave, etc.), sound information, acceleration information, proximity information, position information, orientation information, flow information, parameter information, and AIDC information respectively, in one or more portions of the system, and provide this sensor information to the controller 2 for further processing as may be discussed elsewhere in this application. In some embodiments, one or more of the sensors may be combined with one or more other sensors. It is further envisioned that one or more of the sensors may be local and/or distributed throughout the system 101.

The AIDC compatible sensors 20-Z (hereinafter AIDC sensors) may be operative to read AIDC compatible tags and may include sensors which may be operative with one or more sensors of the system and/or other sensor of the system which may be configured to operate in accordance with AIDC methods to communicate with compatible tags such as the AIDC compatible tags (hereinafter AIDC tags) and/or the like which may be unique to a corresponding apparel and which may be used to identify the apparel, and collect data related to the apparel such as identification information and/or DSCI. The controller 2 may process the collected data and/or store the collected data into a memory of the system for later use. It is envisioned that the AIDC sensors may include one or more of QR codes, bar codes, near-field communication (NFC) tags, radio-frequency identification (RFID) tags, biometric markers (e.g., iris, fingerprints, facial recognition, etc.), magnetic stripes, and/or smart cards or simply a printed label with text, which may read corresponding tags and form corresponding sensor information. This information may then be processed by the controller 2 and may be stored in a memory of the system, such as the memory 4, for later use. It is also envisioned that the AIDC sensors may operate under the control of the controller 2 and the memory 4, to perform optical character recognition (OCR), form corresponding sensor information, process this sensor information, and/or store this sensor information in a memory of the system, such as the memory 4, for later use.

The controller 2 may obtain and process the sensor information, by itself or with other information, and make one or more determinations based upon the processed information. Thereafter, the controller 2 may control the system 101 accordingly. It should be understood that other sensors may be employed in accordance with embodiments of the present invention. The sensor information and processing may be discussed elsewhere in accordance with embodiments of the present invention.

The MAC 30 may include one or more circuits configured to drive one or more motors, valves, and/or actuators of the system 101 as may be discussed elsewhere in this application. For example, the MAC 30 may include a motor controller to drive a corresponding motor.

The memory 4 may include any suitable memory such as a non-transitory memory or memories which may store information desired by the system 101 such as the operating instructions, VEI, SSI, DSCI, DSI, AM, MI, history information, content and/or other information generated, accessed, process, and/or otherwise used by the system 101. The memory and/or memories may be situated locally and/or remotely from each other and may be accessed via any suitable bus or network such as the network 22. For example, the memory 4 may include any suitable distributed memory or memory systems, one or more portions of which may be accessed via suitable bus or network such as the network 22.

The FDU 8 may be operative under the control of the controller 2 and may output a fluid such as a liquid (e.g., water, oil, silicone, etc.) or a gas (e.g., air, nitrogen, helium, etc.) at one or more outputs such as at outputs $F_{out1}$ through $F_{outM}$ (e.g., generally $F_{outm}$) via corresponding fluid distribution channels 40, where M is assumed to be an integer. This fluid may be referred to as the operating fluid (OPF) and may have a desired flow rate and/or pressure at the corresponding output $F_{outm}$. It should be appreciated that the OPF may include any suitable fluid (e.g., air, etc.). For the sake of clarity, it will be assumed that the OPF is air in the embodiments discussed herein. It is appreciated, however, that one or more other fluids may be substituted in one or more portions of the system 101 with proper modifications.

In accordance with embodiments of the present invention, the MAC 30 of the controller 2 may generate and output a control signal (CNTRL) to control the FDU 8 to output the OPF (e.g., compressed air) at one or more of the outputs $F_{outm}$ of the FDU 8. In some embodiments, the OPF may be output at a corresponding output $F_{outm}$ at a desired pressure (PRESS) and/or flow rate (FR) under the control of the controller 2. This pressure and/or flow rate of the OPF may be sensed by one or more sensors of the system such as by the sensors 20 and the controller 2 may adjust one or more portions of the system accordingly to achieve a desired pressure and/or flow rate.

In accordance with some embodiments, the FDU 8 may include a drive side 8A and a distribution side 8B. The drive side 8A may include at least one motor 14 configured to drive at least one pump 16 to compress (or otherwise cause the flow of) a fluid such as air (e.g., ambient air, etc.) and provide this compressed fluid to at least one distributor 18 (on a distribution side 8B) that may be configured to optionally distribute and/or provide this compressed fluid to one or more corresponding outputs $F_{outm}$ of the FDU 8 as the OPF, as discussed above. One or more of the at least one motor 14, the at least one pump 16, and the at least one distributor 18 may be operative under the control of the controller 2. It is envisioned that the at least one distributor 18 may be releasably coupled to the at least one pump 16. The distributor '8 may be further coupled to the AE 34 via a coupler 44.

The at least one pump 16 may include any suitable pump or pumps such as positive displacement pumps (e.g., reciprocating, rotary, etc. and/or dynamic displacement pumps such as centrifugal and/or special effect pumps (e.g., jets, etc.). It is envisioned that the at least one motor 14 may include any suitable type of pump or pumps such as linear, rotary, and/or reciprocating (e.g., vibrating, etc.) motors and/or the like. It is further envisioned that the at least one motor 14 may include an electric motor, a hydraulic motor, a pneumatic motor, etc. For example, it would be appreciated that the at least one motor 14 may include one or more motors of the same or different types. For example, with regard to electrical motors, the at least one motor 14 may include any suitable motor or motors such as an alternating current (AC) motor, a direct current (DC) motor, a stepper motor, and/or any other suitable type of motor or motors.

It is envisioned that the controller 2 may be operative to determine an output displacement of the OPF (volume displaced by the OPF) of the at least one pump 16 and may control the at least one pump 16 based at least upon this determined output displacement. For example, the system may determine a number of pumping cycles of a positive displacement (piston type) pump to determine its output volume of the OPF. This output volume of the OPF may then be optionally processed to determine a volume displaced by the AE 34. It is further envisioned that the determined volume displaced by the AE 34 may further be determined or otherwise adjusted in accordance with at least some of the sensor information obtained from one or more sensors 20 of the system such as temperature, barometric pressure, humidity, and/or other sensor information. In yet other embodiments the shape, size, and/or volume of the AE 34 or portions thereof may be determined in accordance with at least sensor information obtained from one or more sensors 20 of the system 101 such as the optical, image capture, proximity, transducer, and/or other sensors. The AE 34 may include an expandable mannequin or portions thereof such as an inflatable mannequin or inflatable partial mannequin (e.g., torso with or without arms, arms, legs, feet, etc.). The AE 34 include one or more types (e.g., corresponding with a types of an AOC through which it is expand) which may be selected by the system and/or user. For example, the system may determine a type of an apparel which is to be measured and may select a corresponding AE 34 type as may be described elsewhere in this application. For the sake of clarity, the AE may be referred to as a mannequin or partial mannequin of the like. In some embodiments, the AE 34 may include one or more expansion chambers 36.

The MAC 30 may be configured to drive the at least one motor 14 which may be coupled to, and drive, the at least one pump 16 such that the output of the at least one pump 16 (e.g., the OPF) may be selectively controlled. This output of the at least one pump 16 may then be selectively or directly flow coupled to an $m^{th}$ output $F_{outm}$ of the one or more of the outputs $F_{outm}$ of the pressurizer 8 via the distributor 18 which may directly or selectively control output of the OPF. Accordingly, output of the OPF may be selectively controlled by the system 101. In accordance with some embodiments, the distributor 18 may include one or more valves which may selectively control flow and/or pressure of the OPF at one or more of the outputs $F_{outm}$ of the FDU 8. It is also envisioned that that the MAC may be operative to control the distributor 18 to release pressure of the OPF at one or more of the outputs $F_{outm}$ of the pressurizer 8 when desired such as after expansion of the AE 34 is determined to be complete, at the request of the system (when an error is detected), at the request of a user (e.g., an operator in the present embodiments), and/or under other defined condition(s).

The communications portion 32 may be configured to communicate with the network 22 using and suitable communication method or methods such as wired and/or wireless communication methods and/or the like. It should be appreciated that other communication methods such as optical, acoustical, etc. may also be employed. For the sake of clarity, reference to wired and/or wireless communication methods may be understood to include optical and/or other suitable communication methods.

The communications portion 32 (COMM) may include one or more wired, optical, and/or wireless transmitters such as antennas (ANT) configured to communicate with the network 22 using any suitable communication method or methods such as wired, optical, and/or wireless communication methods. For example, the communications portion 32 may include a short range or long-range wireless communications portion which may communicate using any suitable communication protocol(s), method(s), and/or standard(s) such as Bluetooth™, NFC™, Zigbee™, Wi-Fi™, and/or the like or other suitable communication methods. It is further envisioned that the communication portion 32 may communicate via a cellular network such as a broadband cellular communication network (e.g. a mobile communication network such as a 3G, 4G, or 5G network, etc.), an ad-hoc network, a local-area network (LAN), a wide-area network (WAN), a controller area network (CAN), a multiplex communication system, etc.

The rendering device (RD) 6 may include any suitable rendering device or devices such as one or more of a display 6D, a speaker 6S, a haptic device 6V, etc., and/or a user input device 61 one or more of which may be local and/or distributed from each other. The RD 6 may provide a user interface (UI) such as a graphical user interface (GUI) with may be rendered on any suitable rendering device of the system 101 such as the display 6D to provide for user interaction. It is envisioned that the display 6D may include the user input device 61, such as a touch-screen display, with which a user may enter information for use by the system such as selections, text, etc. One or more RDs 6 may be located locally or remotely from each other and/or the other portions of the system.

The display 6D may include any suitable display such as a liquid-crystal display (LCD), an organic light-emitting-diode (OLED) display, an electrophoretic display (e.g., E-Ink™, etc.), and/or the like. The user input device 61 may include any suitable device with which a user may interact with the system such as a keyboard (e.g., hard and/or soft), a mouse, a stylus, a trackball, a trackpad, a touch-input device (e.g., a touchpad, a touchscreen, etc.), an image capture device such as a camera or the like (e.g., which may generate image information which may be further processed to track a user and/or determine one or more gestures (e.g., such as multi-touch gestures, etc.) of the user, a biometric reader (e.g., a fingerprint reader, an iris reader, etc.), a microphone, etc. Accordingly, a user may enter information (e.g., passively or actively) via the user input device 61. It is envisioned that the display 6D may render a UI such a GUI.

The system 101 may analyze information received from the input device 61 and/or one or more other sensors of the system such as image information received from an image capture device, audio information received from the microphone, etc., and may determine one or more gestures and/or audio commands, and/or may operate in accordance with the determined one or more gestures and/or audio commands. The system 101 may be operative to generate and render a UI such as a GUI with which a user may interact to map one or more gestures and/or audio commands to one or more operations of the system. For example, gestures may be set by a user and/or the system and may be mapped to one or more operations and stored in association with VEI or SSI depending upon a user in a memory of the system for later use.

It is envisioned that a user may interact with the microphone and/or image capture device to control the system 101. For example, a user may enter commands verbally and system may translate these commands using any suitable method such as a voice-to-text (VTT) processor and/or the like. Neural processing methods may also be employed to translate the commands. Similarly, the system 101 may generate and/or render information for the convenience of a user such as content, user instructions, USI, audio information, etc. VEI, SSI, etc., using any suitable rendering device of the system such as the display 6-D and/or the speaker 6-S. It is envisioned that the system may employ a text-to-voice (TTV) translator and/or the like to convert text information and/or the like to audio information.

The AES 12 may be coupled to one or more of the FDU 8, the actuator 10, and the AE 34 and may be configured to support, stabilize, and/or provide rigidity to the AE 34 or portions thereof during use. The AES 12 may include one or more couplers which may releasably couple to the APS (e.g., see, 338 of FIG. 3) using suitable method such as hooks, magnetic coupling (e.g., electromagnets, etc.), interference fits, latches, cables, guides, etc. It is envisioned that the AES 12 may be fixedly or releasably coupled to the AE 34 (e.g., via any suitable coupler) or may be formed integrally with the AE 34. In some embodiments, the AES 12 may be controlled by the actuator 10 so as to control position and/or orientation of one or more portions of the AES 12 and/or AE 34 as may be desired.

It is envisioned that the AE 34 may include one or more types one or more of which may be selected to correspond with a type of an AOC which it is to expand (e.g., shirt, pants, jacket, blouse, skirt, coat, etc.) during a digiforming operation. For example, the AE 34 may be shaped and/or sized to fit into a cavity of an AOC such that it may be in accord with a type of AOC and/or or a general form, shape, and/or size of an AOC (or an interior cavity of the AOC) as may be determined in accordance with sensor information obtained from one or more sensors 20 of the system such as image information obtained from image capture sensors 20-5. Thus, the system may select an AE 34 for use in a current scan (e.g., an $i^{th}$ scan) in accordance with an approximate size and/or type of the AOC which is to undergo the scan to determine its DSI and DigiSize. It is envisioned that the AE 34 may be selectively coupled to, or formed integrally with, the AES 12 in accordance with embodiments of the present invention.

The AE 34 may include one or more expansion chambers (ECs) 36 each of which may be coupled (e.g., flow coupled) to one or more inputs of the AE such as inputs $AE_{in1}$ through $AE_{inJ}$, where J is an integer. In the present example, it will be assumed that the AE 34 includes J ECs 36 (three of which are shown) each of which may be coupled to corresponding $j^{th}$ input $AE_{inj}$. It will be further assumed that the number of inputs $AE_{inj}$ may correspond with the number of outputs $F_{outM}$ of, for example, the distributor 18 of the FDU 8.

Accordingly, each $j^{th}$ input $AE_{inj}$ of the AE 34 may be flow coupled to a corresponding $m^{th}$ output $F_{outm}$ of the FDU 8. One or more couplers (e.g., hoses, tubes, etc. and/or releasable couplers, etc.), combiners, valves, flow passages, manifolds, etc. may be configured to form or otherwise facilitate this coupling. In the present example, it will be assumed that the AE 34 includes J ECs 36 each of which may be coupled to corresponding $j^{th}$ input $AE_{inj}$. It will be further assumed that the number of inputs $AE_{inJ}$ may correspond with the number of outputs $F_{outM}$ of, for example, the distributor 18 of the FDU 8. Thus, each $m^{th}$ input $AE_{inm}$ of the M inputs may be flow coupled to a corresponding $m^{th}$ output $F_{outm}$ of, for example, the distributor 18 of the FDU 8 directly of via the AES 12.

It is envisioned that one or more of the ECs 36 may be coupled to the same input(s) $AE_{inj}$. For example, two or more ECs 36 may be coupled to the same $j^{th}$ input $AE_{inj}$. This may be beneficial in the event that number of ECs 36 does not equal (e.g., greater than or less than) the number of inputs (e.g., the J inputs) $AE_{inj}$ or the number of outputs $F_{outM}$ of the FDU 8.

Assuming that J is equal to M in the present example, then each $j^{th}$ input of the inputs $AE_{in1}$ through $AE_{inJ}$ may be respectively flow coupled to a respective $m^{th}$ output of the outputs $F_{out1}$ through $F_{outM}$ of the FDU 16.

Embodiments of the present system may include an apparel support (APS) which may be selectively and/or removably coupled to one more of the AES 12 and/or AE 34 as may described elsewhere in this application. The APS may include a coupler (e.g., active or passive) configured to releasably couple to the AES 12 and/or the AE 34. Although a single APS may be described herein for the sake of clarity, it should be understood that the APS may include a plurality of APSs. The APS or portions thereof may be configured to support an apparel or portions thereof for measurement such as may be performed during digiforming. The APS will be described in further detail elsewhere in this application.

The actuators 10 may be coupled to one or more of the AES 12, the AE 34, and/or one or more guides (e.g., one or more guide rails or supports) of the system 101 and may be operative to control the position and/or orientation of one or more of the AES 12 and the AE 34 during use under the control of the controller 2. It is envisioned that the controller 2 may obtain sensor information from one or more sensors 20 of the system, may determine position and/or orientation of one or more portions of the system 101 such as one or more of the actuator 10 (or portions thereof), the AES 12, the AE 34, the APS, the apparel, the guide, and the actuators 10, and may control the actuators 10 to control the position and/or orientation of one or more of the AES 12, the AE 34, the APS, the guide, etc.

It is envisioned that the actuators 10 may include one or more actuators which may provide multi-axes control of at least position and/or orientation of one or more portions of the system 101.

It is envisioned that the actuators 10 include any suitable actuator or actuator(s) such as electrical, mechanical, pneumatic, hydraulic, and/or other actuators. It is further envisioned that the actuator 10 may control a position and/or orientation of one or more of the sensors 20 and/or may control position and/or orientation and/or operation of one or more fluid control devices such as flow control valves (FCVs) of the distributor 18 in accordance with embodiments of the present invention.

The network 22 may include any suitable wired and/or wireless networks. For example, the network 22 may include a short-range wireless communications network such as Bluetooth™, Zigbee™, a cellular network such as a broadband cellular communication network (e.g. a mobile communication network such as a 3G, 4G, 5G network and/or the like, etc.), an NFC network, a home automation network, a personal area network (PAN), an ad-hoc network, an Internet area network (IAN or cloud), a local-area network (LAN), metropolitan area network (MAN), a wide-area network (WAN), a Wi-Fi™, a home network (e.g., a home area network (HAN), etc., and/or combinations thereof. Other types of networks and/or communications protocols and/or methods, however, may also be employed.

It is envisioned that a user or users may communicate via the network 22 using any suitable communication device such as a user station (US) such as USs 24-1 through 24-N (generally US-x). The US-xs may be fixed and/or mobile and may include smart phones, wired or wireless controllers (e.g., smart-home controllers), computers, laptops, tablets, Chromebooks™, etc. Thus, one or more users may communicate with the system 101 directly or via the network 22. It is further envisioned that one or more users of the system may communicate with each other using a social media applications to, for example, share information related to one or more AOC such as digiform information and the like. For example, the USs may communicate with one or more network connected servers to transmit and/or receive information in accordance with embodiments of the present invention.

In the simplest form, a 3D model may be generated from digiforming using information obtained from sensors of the system.

Figure 2A:
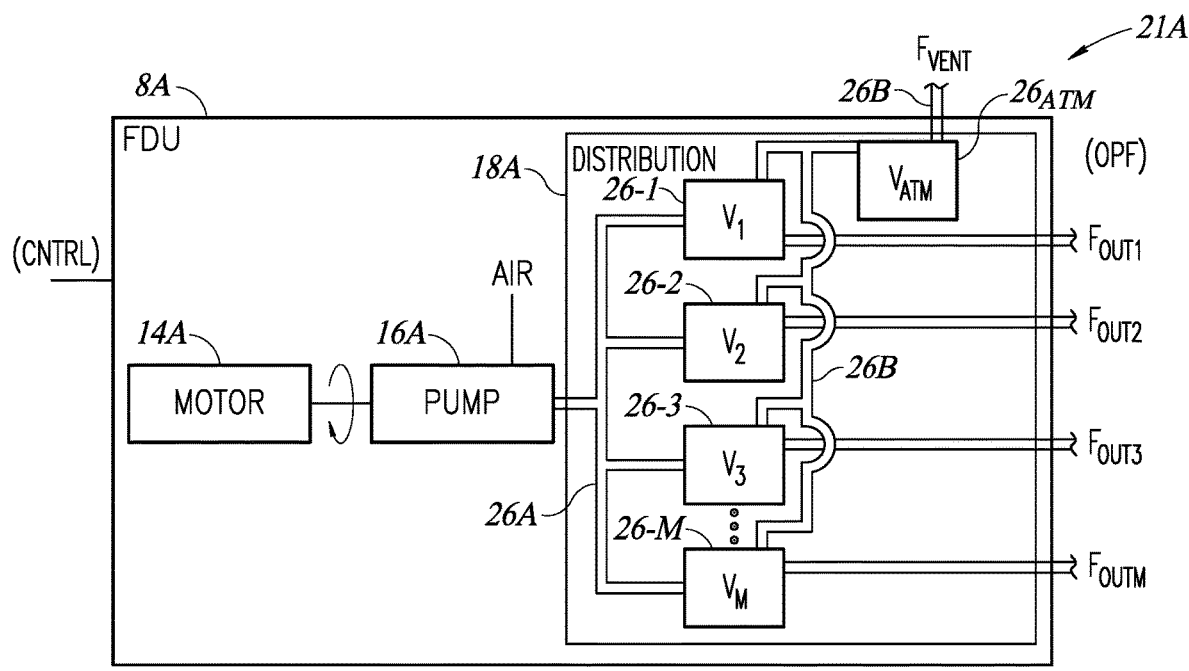
FIG. 2A shows a block diagram of a portion of an FDU in accordance with a third second embodiment of the present invention.
Figure 2B:
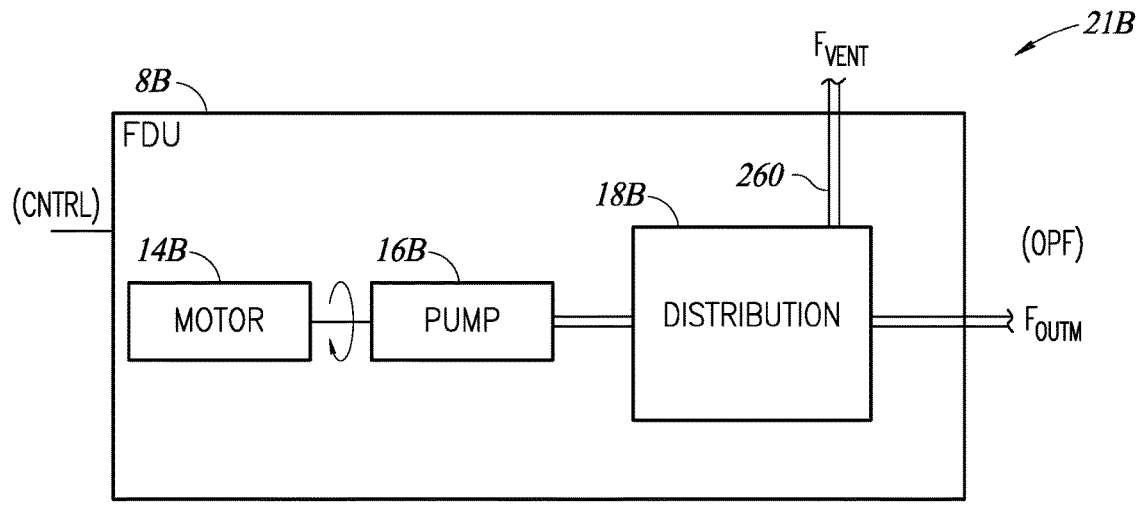
FIG. 2B a block diagram of a portion of an FDU in accordance with a third embodiment of the present invention.
Figure 2C:
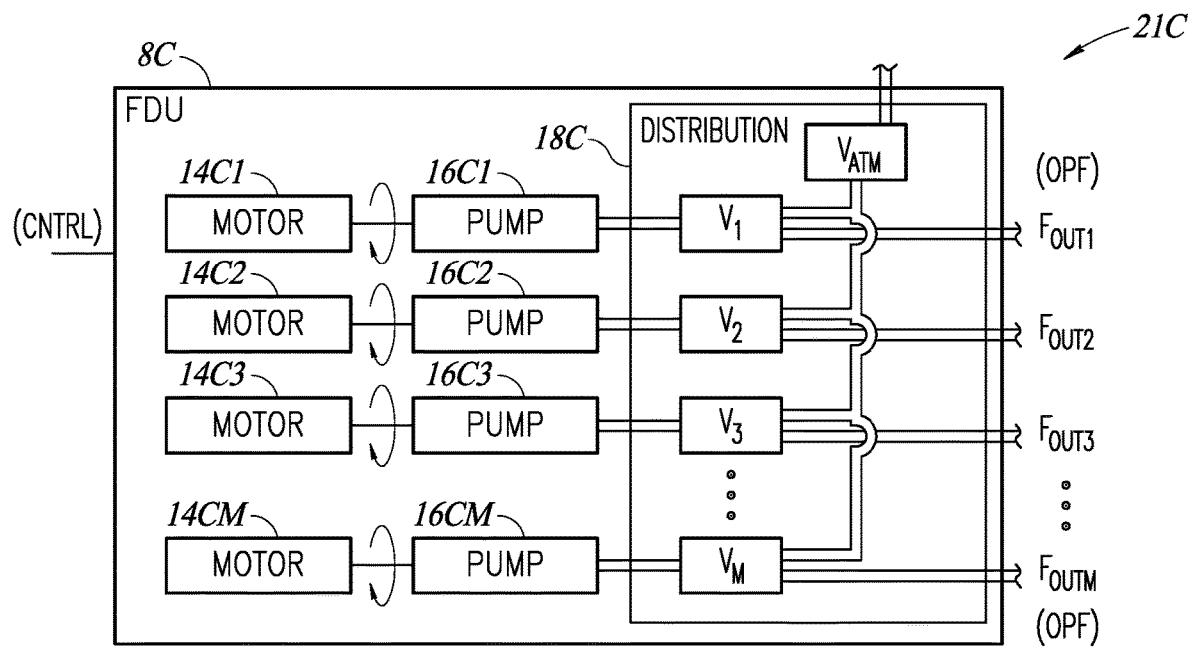
FIG. 2C is a block diagram of a portion of an FDU in accordance with a third embodiment of the present invention.
Figure 2D:
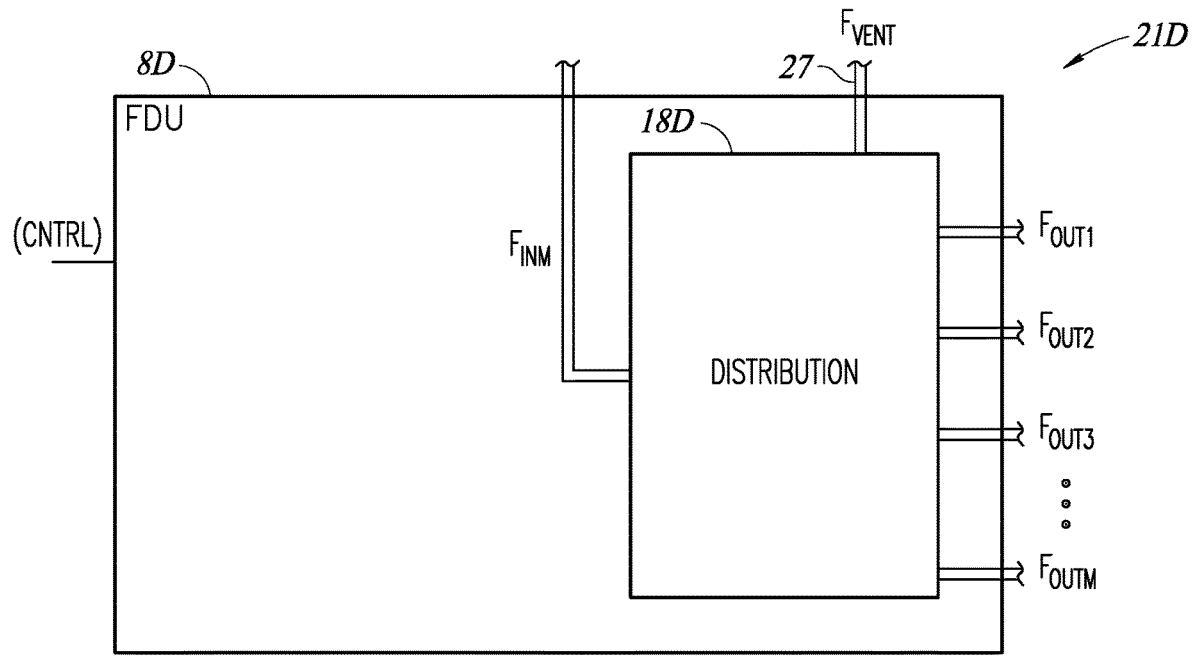
FIG. 2D a block diagram of a portion of an FDU in accordance with a fourth embodiment of the present invention.

Various alternative embodiments of FDUs will now be discussed with reference to FIG. 2A through FIG. 2D, wherein a block diagram 21A of a portion of an FDU 8A in accordance with a third second embodiment is shown in FIG. 2A; a block diagram 21B of a portion of an FDU 8B in accordance with a third embodiment is shown in FIG. 2B; a block diagram 21C of a portion of an FDU 8C in accordance with a third embodiment is shown in FIG. 2C; and a block diagram 21D of a portion of an FDU 8D in accordance with a fourth embodiment is shown in FIG. 2D. In each of these figures, the corresponding FDU 8A through 8D (generally 8x) may include one or more outputs $F_{out1}$ through $F_{outM}$ generally $F_{outm}$ through which the OPF may flow.

Referring to FIGS. 2A through 2D, it is envisioned that the system may perform one or more of a pressurization, hold, balance, vacuum, and depressurization processes. During the pressurization process, the system may be controlled such that a corresponding FDU 8x may output the OPF at one or more corresponding outputs $F_{outm}$ which may result in an increase in pressure and/or volume of the OPF. During the hold process, the system may be controlled such that the OPF at one or more corresponding outputs $F_{outm}$ may be held at a constant volume and/or pressure (e.g., by closing valves of the corresponding FDU 8x and assuming constant ambient temperature). During the balance process, the system may be controlled such that the OPF at one or more corresponding outputs $F_{outm}$ may be equalized in pressure with another one of the outputs $F_{outm}$ (e.g., by opening the valves of the corresponding FDU 8x). During the vacuum process, the system may be controlled such that a corresponding FDU 8x may vacuum the OPF at one or more corresponding outputs $F_{outm}$.

The pressurization process may be employed to expand an AE. Conversely, the vacuum process may be employed to collapse and fold an AE as may be done after performing a scan.

Pressurization

Referring to FIG. 2A, the FDU 8A may be similar to the FDU 8 and may include at least one motor 14A that may drive at least one pump 16A to compress a fluid, such as air, and provide this compressed fluid to a distributor 18A during a pressurization process. The distributor 18A may be controlled to distribute the compressed fluid to be selectively output as the OPF at one or more outputs $F_{out1}$ through $F_{outM}$ (generally $F_{outm}$) thereof (where M is an integer) of the distributor 18A during the pressurization process. It is envisioned that the distributor 18A may include a manifold 26A which may be configured to flow couple the compressed fluid from the at least one pump 16A to the one or more outputs $F_{out1}$ through $F_{outM}$ of the distributor 18A via the one or more flow control valves $V_1$ through $V_M$ (generally $V_m$), respectively which may be controlled to selectively control flow of the OPF from one or more outputs $F_{out1}$ through $F_{outM}$. More particularly, one or more of the flow control valves $V_1$ through $V_M$ (generally $V_m$) may be selectively controlled to output the OFP at one or more corresponding outputs $F_{out1}$ through $F_{outM}$ of the distributor 18A so that one or more desired chambers of an AE coupled thereto (e.g., AE 34 in FIG. 1) may be inflated as desired. During the pressurization process, it will be assumed that a controller of the system (e.g., controller 2 in FIG. 1) may control the at least one motor 14A to drive at least one pump 16A and provide an output to the distributor 18A. The controller may control the one or more of the flow control valves $V_m$ to distribute the OPF evenly or unevenly as may be desired and may be set in accordance with a system settings such as a corresponding AE type, size, etc.

Depressurization

It is envisioned that one or more of the flow controls valves $V_m$ may be controlled to selectively flow couple one or more of the outputs $F_{out1}$ through $F_{outM}$ to a vent output $F_{vent}$ (e.g., an atmospheric vent) via one or more of outlet manifolds 26B and 26C and an optional vent valve $26_{ATM}$ so as to flow the OPF from one or more of the outputs $F_{out1}$ through $F_{outM}$ to the vent output $F_{vent}$ (which may be at atmospheric pressure). For the sake of clarity, it will be assumed that the vent output $F_{vent}$ will be assumed to be at atmospheric pressure (e.g., vent to atmosphere (ATM)). This process may be referred to as a depressurization process. During the depressurization, hold, and/or balance processes, it will be assumed that the at least one motor 14A and/or at least one pump 16A may be deactivated or otherwise stopped (e.g., off) by the controller. In yet other embodiments, it is envisioned that one or more of the flow controls valves $V_1$ through $V_M$ may further selectively control inputs to the pump so as to generate a vacuum suitable for vacuuming the AE coupled thereto sufficiently to collapse the AE to its folded size.

Balancing

The pressure within one or more selected outputs $F_{outm}$ may be balanced with each other by closing the vent output $F_{vent}$ and controlling the corresponding flow control valves $V_m$ to flow couple the one or more selected outputs $F_{outm}$ with each other via the outlet manifold 26B while the optional vent valve $V_{ATM}$ 26 closed which may prevent flow of the OPF to atmosphere. Thus, during the balance process, one or more selected outputs $F_{outm}$ may be flow coupled to each other and closed to atmosphere (e.g., atmospheric pressure).

Holding

The pressure within one or more selected outputs $F_{outm}$ may be held (e.g., in a steady-state or substantially steady-state pressure) by controlling the corresponding flow control valves $V_m$ to close so as to isolate the corresponding one or more selected outputs $F_{outm}$ from each other and/or atmosphere.

It is envisioned that one or more of the flow control valves $V_m$ (e.g., an $m^{th}$ flow control valve $V_{mth}$) and/or the vent valve $26_{atm}$ may be controlled by a controller of the system to control flow, pressure, and/or vacuum within one or more corresponding outputs $F_{outm}$ (e.g., an $m^{th}$ output $F_{outm}$) of the distributor 18A so as to perform a pressurization, hold, balance, and/or depressurization of one or more of the outputs $F_{outm}$ in accordance with embodiments of the present invention. Operation of the flow control valves $V_m$ as well as the optional vent valve $26_{atm}$ may be controlled by the MAC of the controller so as to control the pressure and/or flow of the OPF via corresponding outputs $F_{outm}$ and/or $F_{vent}$.

It is envisioned that one or more of the flow control valves $V_m$ may include any suitable valve. For example, it is envisioned that one or more of the flow control valves $V_m$ may include two-way, three-way, and/or other types of valves and/or corresponding actuators such that the flow of the OPF may be controlled in accordance with embodiments of the present invention. It is further envisioned that one or more of the flow control valves $V_m$ and/or the vent valve $26_{atm}$ may be situated locally and/or remotely from each other.

Referring to FIG. 2B, the FDU 8B may be similar to the FDU 8 and may include at least one motor 14B that may drive at least one pump 16B to compress a fluid such as air and provide this compressed fluid to a distributor 18B which may distribute the compressed fluid to be selectively output as the OPF at one of M outputs $F_{outm}$ (where M is an integer) of the FDU 8B. The distributor 18B may be similar to the distributor 8A and may be configured to selectively flow couple one or more of the outputs $F_{outm}$ to a vent output $F_{vent}$ to perform a depressurization process. Accordingly, a gas such as the OPF within one or more of the outputs $F_{outm}$ may be selectively vented to atmosphere via the vent output $F_{vent}$ so as to reduce pressure within the corresponding $m^{th}$ output(s) $F_{outm}$.

It is further envisioned that the FDU 8B may be controlled by a controller of the system to perform one or more of pressurization, depressurization, balance, and hold processes in accordance with embodiments of the present invention. In some embodiments, the pump 16B may provide for pressure and vacuum.

Referring to FIG. 2C, the FDU 8C may be similar to the FDU 8A with the at least one motor including a plurality of motors 14C1 through 14CM each driving a corresponding pump 16C1 through 16CM each correspondingly flow coupled to one or more outputs $F_{out1}$ through $F_{outM}$ of the distributor 18C via the one or more flow control valves V1 through VM (generally Vm) respectively, where M is an integer. The distributor 18C may be similar to the distributor 8A as discussed above and may include one or more of the flow control valves Vm and/or the vent valve $26_{ATM}$ which may be controlled by a controller of the system to perform one or more of pressurization, depressurization, balance, and hold processes in accordance with embodiments of the present invention.

Referring to FIG. 2D, the FDU 8D may be similar to the FDU 8A and may be configured to receive a fluid from an external source (e.g., an external fluid compressor, an accumulator, etc.) and may supply this fluid to a distributor 18D. The distributor 18D may be operatively similar to the distributor 18A and may be controlled similarly to perform one or more of pressurization, depressurization, balance, and hold processes in accordance with embodiments of the present invention. For example, during a pressurization process, the distributor 18D may be controlled to distribute the compressed fluid to be selectively output as the OPF at one or more outputs $F_{out1}$ through $F_{outM}$ (generally $F_{outM}$) thereof (where M is an integer) of the distributor 18D. The distributor 18D may include an output $F_{vent}$ through which the OPF may be vented to atmosphere as discussed above.

A process of scanning one or more AOCs to form corresponding digiform information (DSCI) will now be discussed. During this process, it is envisioned that one or more AOCs may be hung on, or otherwise coupled to, an assembly line which may guide them one-by-one into a sensor chamber (e.g., a measurement chamber) where a suitable AE such as an appropriate inflatable mannequin (IM), or portion thereof such as a partial inflatable mannequin (e.g., an inflatable mannequin emulating a bust or portion of a body such as an arm, a leg, etc., as opposed to a whole body), may be inserted and inflated within the AOC so as to expand the AOC to determine a form, shape, and/or size of its inner volume. The AE may be shaped and sized similarly to the AOC such that it may have dimensions and girth which may be larger than that of the corresponding apparel. Hence beyond certain inflation, the form, shape, and/or size of the AE may be constrained and defined by an inner cavity of the AOC. The material of the AE (e.g., the inflatable mannequin portion) and sensors should be selected such that sensors can detect (e.g., sense) the mannequin through the material of the apparel and a form, shape, and/or size of one or more portions of the mannequin may be determined (e.g., through reconstruction, etc.) based upon the sensed information by the system for analysis. For example, when employing X-ray type sensors to detect the mannequin, then the mannequin may be formed from a material or materials that may be easily and readily detected (e.g., sensed) by X-ray type sensors such as lead, gold, and/or any other suitable material for detection by and X-ray type sensors or the like, and/or like materials but can pass through material of AOC. Similarly, when employing micro-wave or millimeter wave type sensors to detect the mannequin, then the mannequin may be formed from a material or materials that may be easily and readily detected (e.g., sensed) by these sensors (e.g., the micro-wave or millimeter wave type sensors) such as a metallic material (e.g., foil, metal thread, mylar, BoPET, etc.). Similarly, when employing ultrasound-type sensors to detect the mannequin, then the mannequin should be formed from a material or materials that may be easily and readily detected (e.g., sensed) by these (e.g., the micro-wave or millimeter wave type sensors) sensors. Mannequins may include rigid and/or flexible portions and may be formed from any suitable material such a linen, leather, fabric, and/or the like.

Thus, in accordance with embodiments, an AOC may be scanned, and the system may form corresponding digiform information, characterizing that specific AOC Methods of performing a clothing measurement process, such as an automated digiforming operation, in accordance with embodiments of the present invention will now be discussed with reference to FIG. 3 which shows a detailed block diagram of a portion of a digiforming system 301 (generally system 301) including a feeder line-type apparel positioning system in accordance with embodiments of the present invention. The system 301 may load, advance, and/or measure (e.g., to form digiform information) clothing such as AOCs 351-1 through 351-3 (generally AOCs 351-x). Although only three AOCs 351-x are shown, however, it should be understood that any number of AOCs 351-x may be processed by the system to obtain digiform information for each corresponding AOC. Each AOC 351-$x$ may be coupled to a corresponding apparel support (APS) 338 using any suitable method such as apparel couplers 362 one or more of which may be arranged and configured to hold the corresponding AOC in a desired position relative to the APS 338 at one or more continuous or discrete points. It is envisioned that the apparel couplers 362 may have some play during use so as to prevent undue stress on the apparel being scanned when the AE is inflated. Apparel couplers in accordance with embodiments of the present invention will be described in more detail elsewhere in this application. The rear view may be of the system may be similar.

The system 301 may include one or more mannequin inflation board (MIB) assemblies (MBAs) such as a first MIBA 364-1 and second MIBA 364-2 (generally 364-$x$). Each of the first and second MIBAs 364-$x$ may be similar to each other and include one or more of a distributor 318, an AE 334 (e.g., including an inflatable mannequin (IM) or portion thereof), and an AES 312 and one or more fluid distribution channels 340. The AES 312 may be configured to support the AE 334 and/or the distributor 318, the latter of which may be coupled to each other via the one or more fluid distribution channels 340. Although the first and second MIBAs 364-$x$ may be similar to each other and are of the same type (e.g., of a lower-body type to fit pants), the first MIBA 364-1 is shown with its AE 314 deflated and folded (e.g., in a pre-measurement or post-measurement configuration) and the second MIBA 364-2 is shown with its AE 314 inflated and expanded in a measurement configuration (e.g., suitable for scanning the apparel 351-2 in which it is inserted).

The MIBAs 364-$x$, or portions thereof such as the AE 334, may be selected in accordance with a type of apparel in which the AE 334 is to be inserted for a digiforming operation. The apparel type may correspond with any suitable apparel which may include, without limitation clothing types such as men's pants, shirts, coats, skirts, jackets, vests, hats, undergarments, etc.; women's pants, shirts/blouses, coats, skirts, jackets, vests, hats, undergarments, etc., and children's pants, shirts, coats, skirts, jackets, vests, hats, undergarments, etc. This selection may be performed manually (e.g., by a user) or automatically by the system so that an MIBA 364-$x$ with an AE corresponding to the type of apparel to be digiformed may be selected and positioned relative to the corresponding AOC 351-$x$. With regard to automatic identification of apparel type, it is envisioned that a controller 306 may obtain any suitable sensor information that may be processed to determine apparel type. For example, it is envisioned that the controller 306 may obtain sensor information such as image information from an image capture sensor 320-5 (e.g., a camera) which information may include an image of the apparel to be scanned (e.g., the AOC 351-1). Then, the controller 306 may employ image recognition techniques to identify the type of the apparel (e.g., men's pants) and may the select a corresponding AE 334 or MIBA 364-$x$ which may include the corresponding AE 334 for the identified apparel type which may correspond with the AOC 351-$x$ to be scanned. In some embodiments, the controller 306 may generate and render a user interface (UI) on a rendering device of the system such as a display including a plurality of selection items each corresponding to a corresponding apparel type of a plurality of apparel types for selection by the user. The user may then select one of these selection items and the controller 306 may then set the apparel type in accordance with the user's selection. In yet other embodiments, the system may scan an identity (ID) tag associated with an AOC 351-$x$ to obtain corresponding apparel type information from a memory of the system such as from the ID tag and may match an AE and/or MIBA 3640-$x$ in accordance with the apparel type information. One or more actuators of the system such as robotic actuators, linear actuators, etc., may then be controlled by the controller 306 to position the apparel 351-$x$ and/or the selected MIBA 364-$x$ relative to each other. For example, in some embodiments, the MIBA 364-$x$ may be associated with a scanning chamber 342 and the AOC 351-$x$ may be manipulated into position relative to the corresponding MIBA 364-$x$. In yet other embodiments, however, the system may obtain the selected MIBA 364-$x$, or portions thereof, from a storage area, a standby area, etc., and position the MIBA 364-0$x$ as well as the AOC 351-$x$ relative to each other in the sensor chamber 342 in a position suitable for a scanning operation in accordance with embodiments of the present invention.

The AES 312 may be formed from any suitable material and may be configured to couple to one or more of the distributor 318 and the AE 334. In some embodiments, the AES 312 may be formed from a sheet-like material such as a board or the like. The distributor 318 may be coupled to the AE 334 via the fluid distribution channels (FDCs) 340 which may be configured to provide for passage of an OPF such as air to, or from, one or more expansion chambers such as ECs 336 of the AE 334. Accordingly, the OPF within one or more of the ECs 336 of the AE 334 may be released to atmosphere, evacuated, or otherwise vacuumed to reduce the volume of the corresponding EC 336 of the AE 334 under the control of the controller 306. Conversely, one or more of the ECs 336 of the AE 334 may be filled with the OPF to increase its volume and thus the size of the corresponding EC 336 of the AE 334 as may be performed during a digiforming operation.

It is envisioned that the controller 306 may control one or more pumps and/or valves of the system to selectively supply pressure to, or to vacuum, the AE 334 as may be desired in accordance with pressure information (PI) for a scanning operation. The PI may include instructions that may configure the controller 306 so that it may control one or more pumps and/or valves to pressurize the AE 334 during use as may be desired. It is also envisioned that the PI may include apparel type and time information. The PI may be obtained from the memory and may be associated with apparel type, AE type and/or additions such as ECs, etc. For example, a blouse may have different PI than a pair of pants. For example, when expanding some types of AOC (e.g., pants, etc.) the AE 334 may be inflated at a faster rate and/or to a higher pressure than it may with other types of AOC (e.g., shirts, etc.). Similarly, when determining stretch of an apparel, it may be desirable to inflate the AE 334 at a slower rate and/or at a lower pressure during scanning. Further, the PI may be set to a lower pressure and/or inflation rate for delicate apparel. For example, Table 2 below illustrates PI including information related to pressure with respect to time for different sections of shirts of different material types (e.g., cotton, and silk). In general, the various pressures can be expressed as $P_1(t)$, $P_2(t)+\phi_1$, $P_3(t)+\phi_2$, etc. where $\phi$ represents an offset.

TABLE 2

Pressure Information Versus Time

| AOC Type | Material | Section | Pressure(psi)/time (sec) |
|---|---|---|---|
| Shirt | Cotton | Belly |  |
| Shirt | Cotton | Torso |  |
| Shirt | Cotton | Sleeves |  |

TABLE 2-continued

Pressure Information Versus Time

| AOC Type | Material | Section | Pressure(psi)/time (sec) |
|---|---|---|---|
| Shirt | Silk | Belly |  |
| Shirt | Silk | Torso |  |
| Shirt | Silk | Sleeve |  |

It is envisioned that each of the AOCs 351-*x* may be coupled to, or otherwise hung from, a feeder line 360 via one of the corresponding apparel supports (APSs) 338. Each feeder line 360 may include one or more guides or rails (e.g., tracks, etc.) chains, cables, and/or the like which may be configured to guide a plurality of AOCs 351-*x* may be coupled thereto via the corresponding APS 338 along a desired path. Accordingly, in some embodiments it is envisioned that a plurality of AOCs 351-*x* may be hung from the feeder line 360.

The feeder line 360 may pass through one or more areas such as from an initialization or pre-scanning area (Area I), a scanning area (e.g., Area II), and a post scanning area (e.g., Area III). For example, during operation, the feeder line 360 may guide the AOC 351-1 (e.g., as illustrated by arrow 353) from the initialization area (Area I), to the sensor chamber 342 located in the scanning area (e.g., Area II) for digiforming at the sensor chamber 342 as illustrated by AOC 351-2. After digiforming, or when otherwise desired, the feeder line 360 may guide the AOC 351-2 from sensor chamber 342 in the scanning area (e.g., Area II) to the post scanning area (e.g., Area III) as illustrated by arrow 355 (e.g., see, apparel 351-3). One or more actuators may be coupled to one or more of the feeder line 360 and/or the corresponding APSs 338 to provide a motive force to move the corresponding APSs 338 under the control of the controller 306. The actuators may include, for example, linear motors, multi-axis controllers and/or the like. In some embodiments, a chain, cable, or belt may be coupled to one or more of the APSs 338 and may be configured to transfer a motive force from an actuator to the corresponding APSs 338 so as to move the corresponding APSs 338 along the feeder line 360 from one area to the next under the control of the controller 306. Accordingly, the feeder line 360 may be configured to guide one or more of the plurality of AOCs (e.g., AOC 351-*x*) to or from the sensor chamber 342. It is envisioned that the feeder line 360 may be configured to guide and/or steer selected apparel (e.g., AOC 351-*x*) to the sensor chamber 342. Although a single feeder line 360 is shown, it is envisioned that a plurality of feeder lines 360 may be provided. Similarly, a plurality of sensors chambers 342 may also be provided.

A pre-scan may be performed to identify the apparel being scanned, such as the AOC 351-1 in the present embodiments, for ID information prior to scanning. For example, scanner such an interrogator 311-1 (e.g., an NFC/RFID interrogator of the like) which may query an NFC tag of the AOC 351-1 to be scanned to obtain ID information of the AOC 351-1. For example, the AOC 351-1 may include identification (ID) information such as an ID tag 311-2 (e.g., stock number, item number, id number, bar code, electronic ID such as an NFC or an RFID tag, etc.), which may be identified or otherwise read by the interrogator 311-1 during the pre-scan operation to identify the AOC, its vendor, and/or shopper. Thereafter, DSI information generated by the system 301 may be associated with the apparel and stored in the corresponding DSCI.

For the sake of clarity, it would be assumed that the term ID tag may include any suitable ID tag such as AIDC-type tag and/or other suitable tag which may be read by the system to identify the apparel.

For example, during the pre-scan, an AOC 351-1 may be identified using any suitable method such as by identification number (e.g., a stock number, item number, ID number, a manufacturer ID, a description, etc.) and/or other suitable identification which may obtained manually or automatically. For example, the system may query the AOC to obtain its ID using any suitable communication method such as NFC and/or RFID methods. Accordingly, the system 301 may include one or more sensors such an NFC and/or RFI interrogator 311-1 which may communicate with a corresponding ID tag 311-2, respectively, of the AOC 351-*x*, and obtain an identification of the AOC 351-*x*. In yet other embodiments, an optical scanner or image of the AOC 351-*x* may be analyzed to obtain a bar code, SKU, and/or identifier (e.g., item number, stock number, bar code, SKU, QR code, etc.) which may identify apparel (or type of apparel) that is scanned such as the AOC 351-*x*. For example, the system may employ an optical scanner to read a code (e.g., bar code, SKU, QR code, etc.) or an identification number or the like on the AOC 351-*x* to identify it, or the system may employ a camera to capture an image of the AOC 351-1 and identify using image analysis techniques to identify the apparel 351-1 or a portion thereof. In yet other embodiments, an identification of the AOC 351-*x* may be obtained manually e.g., by manually entering an identification of the AOC 351-*x*. The system may obtain various identifiers for the AOC 351-1 such as stock number, item number, ID number, manufacturer identification, style number, type (e.g., men's pants, shirt, etc.), size, etc. In some embodiments, it is envisioned that the system may further capture an image of the AOC 351-1 and perform image analysis to identify its apparel type (e.g., men's pants, etc.). In some embodiments, a user ID and/or a vendor ID may be associated with an AOC 351-*x*1. For example, a user may provide an apparel with the user's ID for scanning and digiforming. Similarly, a vendor may provide an apparel with the vendor's ID for scanning and digiforming. Thus, an apparel may include one or more IDs and digiform information may be associated with one or more of these. Once an AOC 351-*x* is identified, the system may determine its apparel type information (e.g., pants, shirt, blouse, jacket, gloves, hat, etc.). The apparel type information may then be used by the system to select an AE for performing a digiforming operation upon the corresponding AOC.

It is envisioned that all or select information (as may be set by the system and/or user) related to the AOC 351-*x* obtained during the process 301 may be associated with the apparel and stored for later use. For example, a user may provide an ID with an apparel for digiforming. Information generated or obtained by the system may then be associated with this ID.

The sensor chamber 242 may include a plurality of sensors 320 which may be suitable for detecting the AE 334 which may be inflated within an AOC 351-*x* during a digiform operation. These sensors may then form corresponding sensor information which may be suitable for determining at least form, shape, and/or size of the AE 334 within the AOC 351-*x*. Accordingly, a controller of the system such as the controller 306 may process this sensor information and determine a size, shape, and/or volume of the AE 334 when inflated and may form corresponding DSI and DSCI. It is envisioned that other information related to the AOC such as one or more of ID, type, color, material, stretch, elasticity, etc., may also be sensed within the sensor chamber 242 or elsewhere along the feeder line 360 such as in the pre-scan area I during a pre-scanning operation as described above and the DSCI for the corresponding apparel may be updated accordingly. One or more of the sensors 320 may be of the same or of different types from the other and may include sensors such as one or more of ultrasound, microwave, millimeter wave, X-ray, image sensors, and/or the like. For example, one or more of the sensors 320 may include a plurality of transducers which may transmit (e.g., 320-Tx) and/or receive (e.g., 320-Rx) signals in any desired electromagnetic spectrum or spectrums such as microwave, millimeter wave, ultrasound, X-ray, infrared, visible spectrums and/or the like. Sensor information from two or more sensors of the same or different types may be used to check for redundancy and scan results may be updated accordingly to assure accurate and precise digiform when desired.

The sensors 320 may include shape sensing sensors (SSSs) and may be configured to detect the form, shape, and/or size of the AE 334 during a scan of the AOC 351-$x$ being scanned. Any suitable SSSs may be employed by the system provided that it may detect the AE within the AOC 351-$x$ being scanned. SSSs may be selected by the controller 306 such that they may adequately perform the scan of the corresponding AOC 351-$x$. For example, in some embodiments, the process may determine a type of material of the AOC 351-$x$ being scanned and may select sensors and/or sensing types accordingly such that the selected sensors may accurately detect the AE 334 with the corresponding AOC 351-$x$ during a scan. In accordance with some embodiments, these sensors may be selected in accordance with system and/or user settings. Depending upon system settings, SSSs may be selected by the controller 306 such that they may perform the scan without interference from the corresponding AOC 351-$x$.

During the scan one or more of the sensors may further capture measurements at various pressure levels (e.g., within the AE or portions thereof) an inflation levels and capture elasticity information related to the AOC 351-$x$ being scanned. The elasticity of the AOC 351-$x$ may be based upon, for example, its determined elastic modulus $\lambda$=stress/strain at one or more locations, where stress may be proportional to pressure within the AE and strain may be determined as a deformation of the AE. Thus, for example, if the AE is determined not to continue to expand at sampled locations as pressure within it increases, the system may determine that the AOC 351-$x$ has a low elasticity at these locations. Conversely, if it is determined that AE continues to expand as pressure within it increases, then the AOC 351-0$x$ may have greater elasticity at these locations. It is further envisioned that values of elasticity may be determined in accordance with an elasticity table or tables of pressure and expansion. Thus, the system may monitor pressure and expansion of the AE to determine elasticity information for the AOC 3512-$x$ during a scan.

Scans for form, shape, and/or size (e.g., may be referred to as a shape scan) and/or elasticity while scans to identify an ID of an AOC may be referred to as an ID scan.

It is envisioned that the sensors 320 may be rotated relative to AOC about the AOC 351-2 being scanned so as to obtain full 3D information about the corresponding AOC 351-2 and/or the AE 334 therein. Accordingly, the system 301 may be configured to rotate the sensors 320 about one or more axes associated with the sensor chamber 342 such as a vertical axes Va which may be substantially parallel with an Az axis of the system as shown. In accordance with embodiments of the present system, the sensors may rotate about one or more axes of the system, such as an Ax, Ay, and/or Az axis and/or combinations thereof, under the control of the controller 306 so as to obtain sensor information that may include full 3D information about the AE 334 within AOC 351-2 during a scan. Thereafter, this sensor information may be processed by the controller 306 to reconstruct a 3D or 4D model (e.g., a mesh comprising nodes and lines or a solid service as may be set in accordance with system and/or user settings) of the AOC 351-2 that was scanned in accordance with the sensed AE 334 and to generate corresponding DSI and DSCI for the AOC 351-2.

In yet other embodiments, it is envisioned that one or more of the AOC 351-1 and the sensor 320 may be rotated or may remain stationary during a scan under the control of the controller 306.

It is envisioned that the sensor information from one or more sensors of the sensors 320 may be stitched to produce a 2D, 3D, or 4D image and corresponding DSI (e.g., digiform information). Accordingly, the controller 306 may be configured to stitch one or more images obtained from the sensor information together as the sensors 320 are rotated during a scan. In yet other embodiments, it is envisioned that the scans may be performed at different times and/or places and results may be stitched together.

It is envisioned that the sensors 320 and/or the AE 334 may be selected to correspond each other in accordance sensor selection information (SESI) which information may be stored as in a memory of the system and which may be obtained by the system to select sensors 320 in accordance with the AE 334. The SESI may include information which may match sensors 320 in accordance with material of the AE. Accordingly, the controller 306 may obtain information related to one of the sensors 320 and/or the AE 334 and match them for use in accordance with the SESI. This may assure that the sensors may properly detect the AE 334 during a scan. The match information may be stored in a memory of the system in association with ID information for one or more of the sensors 320 and/or the AE 334. Thereafter the SESI and ID information may be obtained from the memory and analyzed by the controller 306 to determine a proper match between sensors 320 and AE 334. For example, the controller 306 may obtain an ID of the AE 334 (e.g., wirelessly, etc.) and may thereafter select one or more sensors 320 in accordance with the ID information and the SESI to perform a scan.

Thus, in accordance with embodiments of the present invention, it is envisioned that the controller 306 may select sensors and/or sensor types (for performing a scanning operation during a digiforming operation) in accordance with a detected type of AE 334 and/or AOC 351-$x$ as may be set forth by the match information. For example, it is envisioned that the controller 306 may select sensors which may be in accord with one or more of the AE 334, the sensors 320 (e.g., in the sensor chamber 342), and/or an identification of the AOC 352-$x$ to be scanned as may be set forth by relationship information such as the match information as may be stored in the memory of the system. The match information may include information related to sensor ID, sensor type, AE information such as AE type, and/or AOC ID and associations between this information such that cross-references may be obtained using any of the sensor ID, sensor type, AE information such as AE type, and/or AOC ID (e.g., apparel ID). Accordingly, the controller 306 may properly match one or more of the AEs, AOC, and sensors for a digiforming operation.

Accordingly, ID information related to one or more of the AE 334, the sensors 320, and/or an ID identification of the AOC 352-x to be scanned, may be obtained from a memory of the system and/or may be entered by a user. For example, the controller 306 may communicate with the AOC to be scanned to determine its type and/or ID using any suitable wired or wireless communication method. It is envisioned that the controller 306 may optically (e.g., using image analysis) or wirelessly communicate with an NFC or RFID tag of the AOC 351-x to determine its ID.

It is envisioned that the sensor chamber 342 may be configured to receive one or more MIBAs 364-x or an appropriate MIBA 364-x may be guided inside the sensor chamber 342 based on the AOC's type (e.g., men's pants, women's blouse, etc.) that is to be scanned in the corresponding sensor chamber 342 as may be determined using any suitable method. For example, the controller 306 may determine a type of the AOC 351-x (e.g., apparel type) to be scanned manually (e.g., through a user input, etc.), optically (e.g., using image analysis of the apparel, scanning an ID tag on the apparel 351-x), and/or wirelessly (e.g., by reading an ID tag associated with the apparel). It is envisioned that that controller 306 may be operative to control one or more actuators of the system to retrieve and/or place a selected MIBa 364-x within the sensor chamber 342 when desired.

The distributor 318 of the MIBA 364-2 may be coupled to a supply 302 which may be configured to provide the OPF to the distributor 318 via a coupler 344 such as a flow coupler. In some embodiments, the supply 302 may include one or more pumps that may supply the OPF while in other embodiments, the OPF may be obtained from an OPF source (e.g., a compressed gas source). The distributor 318 may include one or more of a pump 316 driven by a motor 314. The motor, pump, and/or distributor 318 of the MIBA 364-x may be controlled to generate pressure and/or vacuum as may be desired by the controller 306 during a digiforming operation.

The controller 306 may control the overall operation of the system and as such may communicate (e.g., using wired and/or wireless communication and/or control methods) with, and/or control operation of, one or more of the sensors 320, the feeder line 360, the supply 302 (e.g., such as an air pump, valves, etc.), the MIBA 364-x, the distributor 340, solenoids, actuators, pumps (e.g., pressure and/or vacuum pumps), etc. In accordance with embodiments of the present invention, the controller 306 may communicate with, and/or control, one or more actuators of the system 301 using wired and/wireless communication methods.

It is also envisioned that the controller 306 may control selection of an appropriate MIBA 364-x for use during a scan in accordance with embodiments of the present invention. It is further envisioned that the controller 306 may control the MIBA 364-x and/or distributor using wired and/or wireless communication methods.

In accordance with some embodiments, it is envisioned that once an appropriate MIBA 364-x is selected for an AOC 351-x, the controller 306 may control a multi-axis actuator assembly (e.g., a robotic manipulator) to automatically obtain (e.g., from an MIBA supply area, etc.) the selected MIBA 364-x and couple it to the supply 302 and/or sensor chamber 342 for scanning the AOC 351-x. When desired (such as in response to an MIBA 364-x not being used for a current scan), the multi-axis actuator assembly may further be controlled by the controller to uncouple an MIBA 364-x from the supply 302 and/or the sensor chamber 342 and return it to the MIBA supply area. The robotic manipulator may be mobile and have access to one or more portions of the system 301.

With regard to the AE 334, in some embodiments it is envisioned that the AE 334 may include a conductive, magnetic, and/or dielectric ink or coating which may form (e.g., as a print) one or more specific patterns (e.g., a grid on the surface of AE, etc.) in order to assist in detection of the corresponding portion of the AE 334 by, for example, one or more of the sensors of the system 301 during a scan. These sensors may be referred to as shape-sensing sensors (SSS).

In accordance with embodiments of the present invention, one or more of the sensors, such as the sensors 320 within the sensor chamber 342, may be movable around the AOC 351-x being scanned so that sensor information suitable for generating information which may be employed to generate a three-dimensional (3D) reconstruction of the AE 334 and/or the AOC 351-x being scanned. Accordingly, the system may sense and/or determine a 3D form, shape, and/or size of the AOC being scanned based at least in part upon reconstructed sensor information of the scanned AE 334. It is envisioned that the one or more of the sensors 320 may include one or more of a transmitter (TX) and receiver (RX) (e.g., see, 320-TX and 320-RX, respectively) or both. With regard to sensor types, it is envisioned that there may be more than one type of sensors or scanners. Some of them may be penetrating-type sensors (e.g. X-Ray, millimeter wave sensors, ultrasound, etc.) that can sense the form, shape, and/or size of the AE 334 through the AOC 351-x being scanned. It is further envisioned that one or more of the sensors 320 may include optical sensors which may sense, for example, the exterior surface of AOC 351-x. Such sensors may include image capture devices, optical cameras, and/or any other suitable optical and/or range imaging systems.

For example, the system may employ a time-of-flight (ToF) camera which may employ one or more time-of-flight (ToF) techniques or methods to determine a distance between the sensor (e.g., a camera) and the surface of one or more of the AOC 351-x being scanned and/or the AE 334 within. Suitable ToF methods employ signals generated by laser or led sources. It is further envisioned that the ToF methods may employ scanning LIDAR methods. Other types of ToF scanners may also be envisioned.

With regard to the sensor chamber 342, this chamber may be a physical chamber which may include one or more dividers or walls or may include one or more designated logical area(s) for sensing during a scanning operation as may occur during a digiforming operation.

During operation, one or more objects such as AOCs selected to be scanned during a digiforming operation, may be coupled to or otherwise loaded on the feeder line 360 using any suitable coupler such as the APS 338. Once selected AOCs 351-x are coupled to the APS 338, they may be guided (e.g., in a serial or parallel manner) to the sensor chamber 342 (e.g., as illustrated by arrow 353). The controller 306 may monitor position of each APS 338 and/or AOCs 351-x attached thereto as they may be guided along the feeder line 360 and/or portions thereof, such as that portion of the feeder line 360 that is within the sensor chamber 342. Then, when it is determined that the APS 338 is at a predetermined position (e.g., along the feeder line 360), the feeder line 360 may be paused (e.g., stopped) and the APS 338 may be secured to a stationary object within the sensor chamber 342 such as the AES 312 via one or more couplers such as MIBA couplers 354. It is assumed that the system has selected an appropriate MIBA (i.e. the most suitable MIB for the corresponding AOC (e.g., 351-2 as shown)), such as the MIBA 364-2, and positioned it within the scanning chamber 342 such that the AE 334 coupled thereto may enter one or more inner cavities of the AOC 351-x to expand the AOC 351-x when desired for scanning under the control of the controller 306. The distributor 316 of the MIBA 364-2 may be coupled to the supply 302 via the flow channel 344 so as to receive the OPF therefrom when provided by the supply 302 under the control of the controller 306.

In some embodiments, it is envisioned that a plurality of sensor chambers 342 may be arranged in a serial manner along the feeder line(s). Each of these sensor chambers 342 may include a MIBA 364-x with AEs of different types. Then, an AOC 351-x to be scanned during a digiforming operation may be matched to one or more of these AEs, and the APS 338 with the corresponding AOC 351-x coupled thereto may be positioned such that the matched AEs may enter a cavity of the AOC 351-x and inflate to expand the AOC 351-x for scanning in accordance with embodiments of the present invention. In yet other embodiments, it is envisioned that each sensor chamber 342 may include a plurality of AEs of the same or of different types each of which may be configured to receive a matched AOC. For example, AOCs of a type such as shirts may be matched to an AE of a first type and AOCs of a type such as pants may be matched to an AE of a second type. It is also envisioned that a plurality of AOCs of the same type may be processed in a single sensor chamber 342 including a plurality of matched AEs (e.g., for the apparel) at the same time (e.g., in a parallel manner). Thus, the layout of the sensor chamber may vary. In some embodiments the sensor chamber may be mobile.

Once the AOC 351-x is positioned within the sensor chamber 342 for scanning, the controller 306 may then control the supply 302 to supply a pressurized flow of OPF (e.g., by activating the motor 314 to drive the pump 316 and control any valves accordingly) to inflate the AE 334 within the AOC 351-2. As the AE 334 is inflated, the sensors 320 may monitor the form, shape, and/or size of the AOC 351-2 from the outside (e.g., using sensors of a first type such as optical sensors) while the form, shape, and/or size of the AE 334 may be monitored by sensors of a second type such as penetrating sensors (PSs). The controller 306 may the obtain sensor information from one or more sensors of the system 320 and if the AE 334 is determined to begin to fit snugly as may be determined from force or pressure sensors (e.g., FPSs such as capacitive force sensors of the like) on the AE 334 and/or by monitoring an amount of expansion of the AE and the shape of the inflated AE and AOC over time within the apparel 351-2 in an approximate anatomical form, shape, and/or size of a human body which may correspond with the AOC (e.g., as determined by image analysis of optical information acquired by one or more of the sensors 320 and comparing this information with known AOC type (e.g., shirt, pants, etc.)), then, the controller 306 may record the form, shape, and/or size of AOOC 351-2, the form, shape, and/or size (e.g., in 2- or 3D) of AE 334, the volume and/or the pressure of the OPF inside the AE 334 and store this information for later use.

It is envisioned that the controller 306 may control the system 301 such that measurements may be captured at various pressure levels and/or inflation level (for each compartment of AE 334) during a scan of the AOC 351-2 to capture the elasticity information of the apparel. This elasticity information may be determined in accordance with sensor information from the FPSs and/or by analyzing the change in the form, shape, and/or size of the AE 334 in relation to pressure over time. For example, the change in the 3D form of the AE 334 may be limited and proportional to the elasticity of the AOC 351-x which it is expanding during a scan. A 3D model including elasticity information may be reconstructed from this data using signal processing and image processing algorithms or other suitable imaging methods and/or techniques.

After (shape) scanning is complete, the system 301 may be operative to deflate the inflated AE 334 (e.g., by venting the OPF to atmosphere and/or by applying a vacuum to the AE 334 until it is substantially or fully collapsed and/or a desired vacuum is sensed by the controller 306. This may minimize the AE 334 for insertion into another AOC during a next scan.

This process may be repeated more than once for the same AOC when, for example, more than one MIBA and AE may be employed for scanning for form, shape, and/or size as may be desirable when complex AOC may require multiple AEs for scanning. For example, the arms of a dress may be scanned and thereafter the torso of the dress may be scanned. In accordance with some embodiments, one or more AEs may be inserted into an apparel from below rather than from above the apparel as shown.

In some embodiments, an ID of an AOC may be scanned and associated with SSI or VEI of a shopper or vendor, respectively. The system may then determine whether DSI for the apparel exists. If it is determined that DSI for the apparel exists, it may obtain this DSI from a memory of the system and may associate it with the ID of the AOC and the corresponding SSI or VEI. If the DSI does not exist, however, the system may render information indicating such and may render a request that that this AOC be provided for digiforming to obtain DSI. Once this AOC is digiformed and DSI is obtained, the DSI it may be stored in a memory of the system in association with the ID of the AOC as DSCI. This DSCI may be associated with the corresponding SSI or VEI. It is also envisioned that an option may be provided for a shopper to have the particular AOC digiformed and corresponding DSCI may then be associated with the SSI of the shopper and stored in a memory of the system for later use.

In this regard, the system may generate and render a user interface with which a user, such as a shopper, may generate one or more labels (e.g., shipping and/or handling labels) and/or ID tags for the AOC to be digiformed. The one more AOC may then be shipped to a digiforming center and thereafter received for digiforming at the digiforming center. After digiforming, DSCI (e.g., digiform information) for corresponding AOCs of the one or more AOCs may be associated with the SSI of the shopper and stored in a memory of the system for later use. The system may then generate and render a user interface with which the shopper may interact to access this digiform information and/or interact with a user interface of the system to perform virtual alterations and form DSCI in accordance with these alterations and which may be referred to as desired DSCI and may be stored in a memory of the system. Thereafter, the desired DSCI may be compared with DSCI of a vendor to determine a match score and/or to recommend one or more AOCs (apparel) of a vendor to the shopper for trying on and/or purchase.

It is envisioned that the system may generate shipping labels and/or packages for transmitting one or more AOCs to a user such as a shopper or vendor and/or receiving one or more AOCs from the corresponding user.

Figure 3:
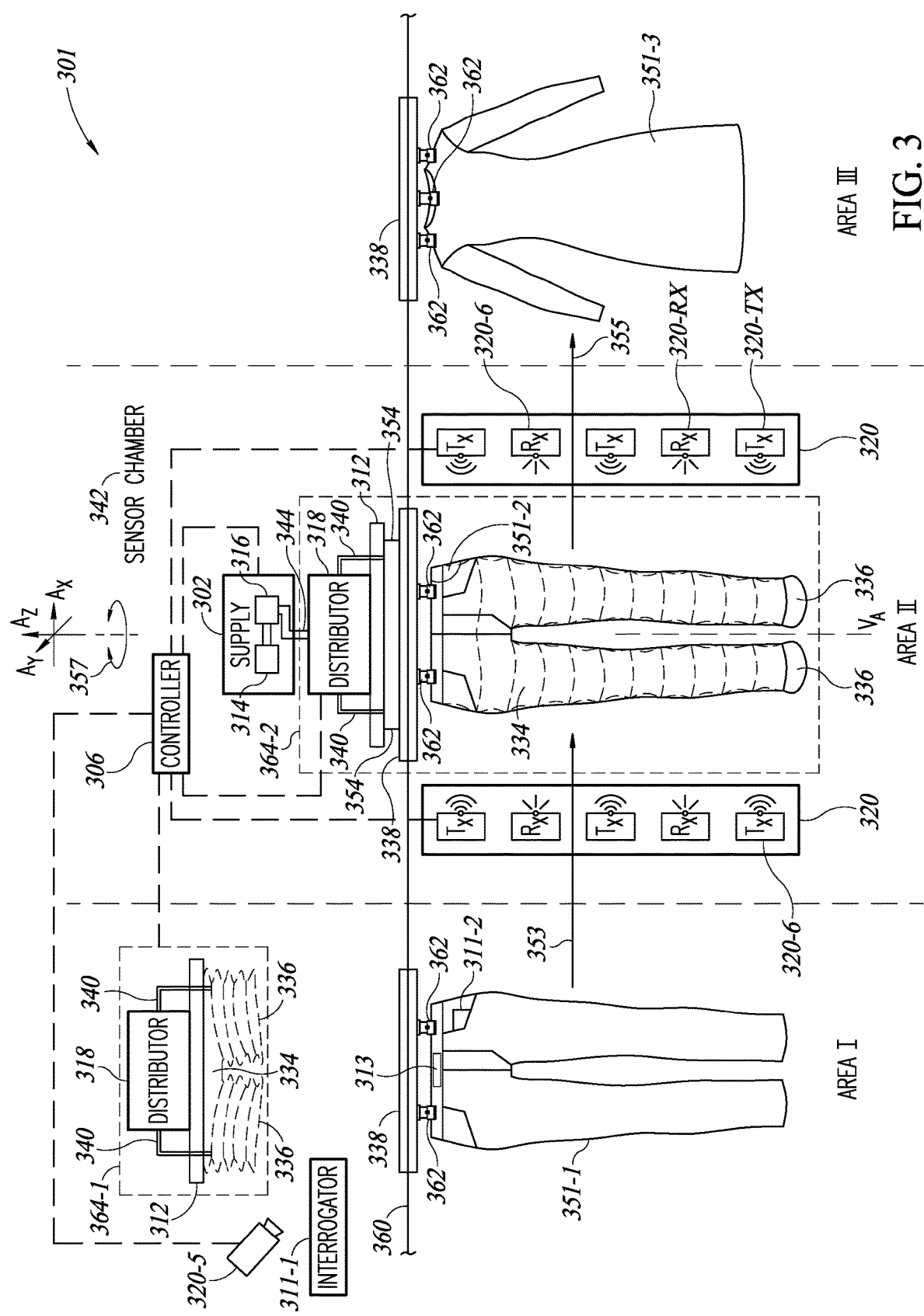
FIG. 3 shows a detailed block diagram of a portion of a digiforming system including a feeder line-type apparel positioning system in accordance with embodiments of the present invention.
Figure 4:
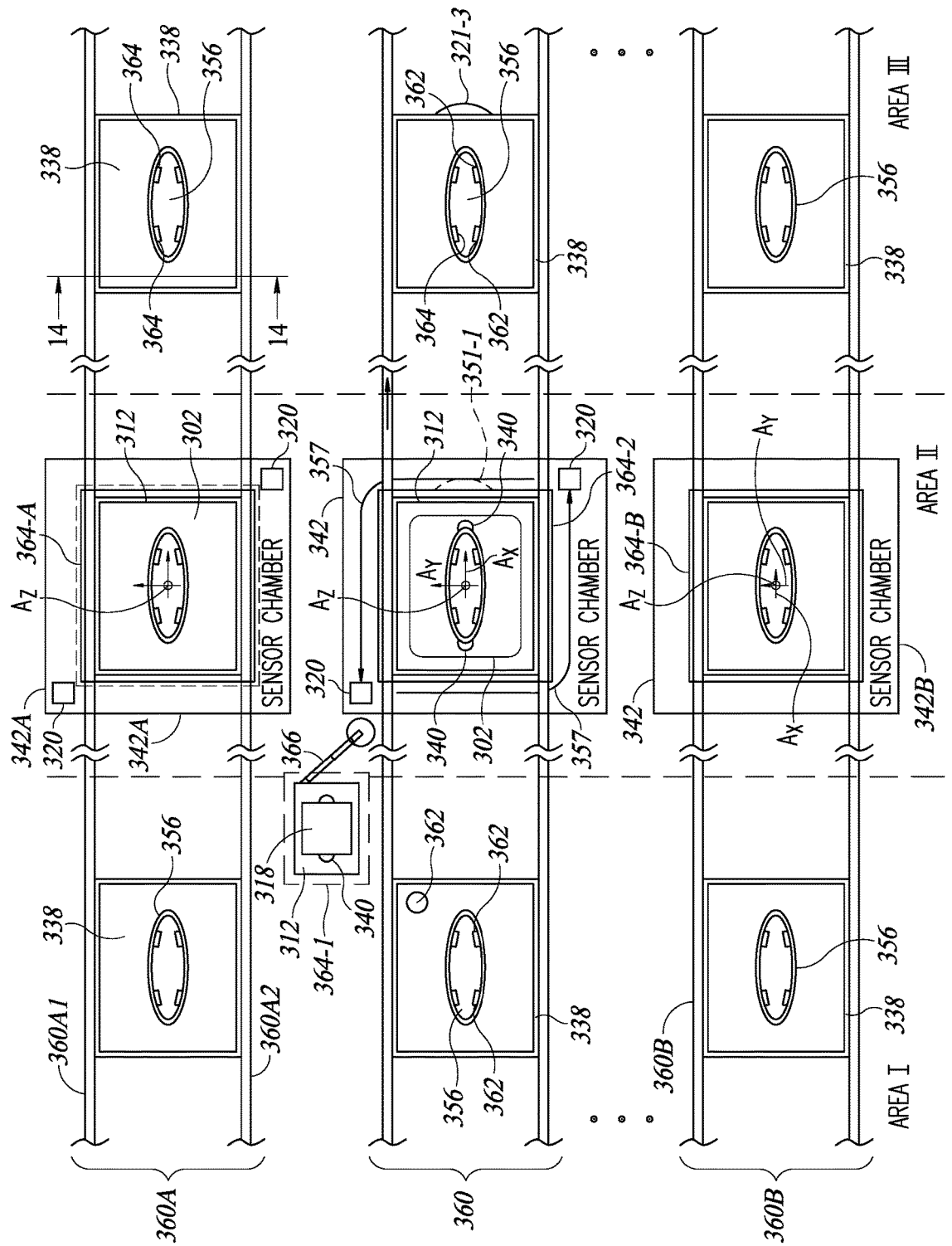
FIG. 4 shows a detailed top view of a portion of a feeder line digiforming system including a plurality of feeder lines in accordance with embodiments of the present invention.

A detailed top view of a portion of a feeder line digiforming system 401 (generally system 401) including a plurality of feeder lines in accordance with embodiments of the present invention is shown in FIG. 4. The system 401 may include a plurality of feeder lines 360, 360A, and 360B (generally feeder line 360x) which may be similar to each other and to the feeder line 360 of FIG. 3 and may be arranged in a parallel configuration. Each feeder line 360x may include one or more rails. For example, feeder lines 360 and 360B include a mono-rail configuration while feeder line 360A may include a dual rail configuration including first and second rails 360A1 and 360A2, respectively, that may be parallel or substantially parallel to each other.

Each feeder line 360, 360A, and 360B may have an associated sensor chamber 344, 342A, and 342B, respectively, and may include a corresponding MIBA 364-2, 364-A, and 364-B, respectively, and may be configured to guide one or more APS 338 coupled thereto through one or more areas such as areas I through III as discussed elsewhere in this application.

It will be assumed that each of the MIBAs 364-x may be different from each other such that different types of clothing (e.g., pants, shirts, skirts, etc.) may be guided into a corresponding feeder line 360 for scanning by a matching MIBA 364-x for the apparel 351-x being scanned by the system for digiforming. In yet other embodiments, it is envisioned that one or more of the MIBAs 364-x, such as MIBA 364-1, may positioned by the system using one or more actuators such as a robotic arm 366 which may provide multi-axes control of at least position and/or orientation of one or more of the MIBAs 364-x, such as the MIBA 364-1, so that the corresponding MIBA 364-x, such as the MIBA 364-1, may be loaded into a corresponding sensor chamber, such as the sensor chamber 342, when desired, under the control of a controller of the system.

One or more AOCs 351-x may be coupled to corresponding APSs 338 by apparel couplers 362 and may be scanned in a corresponding sensor chamber 342, 342A and 342B, by sensors 320 of the corresponding sensor chamber 342, 342A and 342B which may be stationary or may be guided in one or more desired directions by the controller 306 such as about the vertical axis Va of the corresponding sensing chamber 342, 342A and 342B.

For example, the system 301 may be operative to rotate the sensors 320 about one or more axes associated with the sensor chamber 342 such as a vertical axes Az during a scanning operation as illustrated by arrow 357. In yet other embodiments, however, it is envisioned that the system 301 may be operative to rotate the sensors 320 about one or more of the other axes associated with the sensor chamber 342 such as axes Ax and/or Ay during a scanning operation. Thus, one or more of the sensors 320 may have one or more degrees-of-freedom which may be controlled by, for example, a multi axes actuator under the control of the controller 306. Various scanning patterns for scanning an apparel during a digiforming operation may be provided and stored in a memory of the system for later use such as when scanning an apparel of a corresponding type and/or ID.

In some embodiments, it is envisioned that the AOC and/or the sensors may move in a linear manner relative to each other rather than rotational manner. For example, the sensors may form a ring through which the AOC may travel in a liner manner, or vice versa, under the control of a controller of the system.

It is assumed that each of each of the APSs 338 coupled to the feeder lines 360 and 360B may be configured (e.g., slightly offset from the corresponding feeder line) so that an opening 356 of a corresponding APSs 338 may be accessed by the corresponding AE which is to be inserted at least partially through the opening for inflation and scanning of an apparel 351-x coupled to the corresponding APS 338. With regard to the APSs 338 coupled to the feeder line 360A, these APSs 338 may be coupled to both of the feeder lines 360A1 and 360A2 such that access to its opening 356 is not covered or otherwise restricted. MIBAs 364-x be supported such that an AE associated therewith may be inserted into an opening 356 of a corresponding APS 338 for scanning.

In accordance with embodiments of the present invention, the system may detect clothing (e.g., AOC or an AOCs) that may have prematurely separated from their associated APS 338 and may control one or more actuators such as the robotic arm 366 to retrieve the prematurely separated AOC and place this AOC in a desired location such as in a retrieval bin. In yet other embodiments, it is envisioned that the controller of the system may be operative to control the robotic arm 366 to couple an apparel to a respective APS 338 for scanning. The APS 338 may be situated on a corresponding feeder line 360-x or may then be placed on a selected feeder line 360-x of the system for scanning. In some embodiments a feeder line switchover system may be provided to switch an APS from one feeder line to another.

Figure 5:
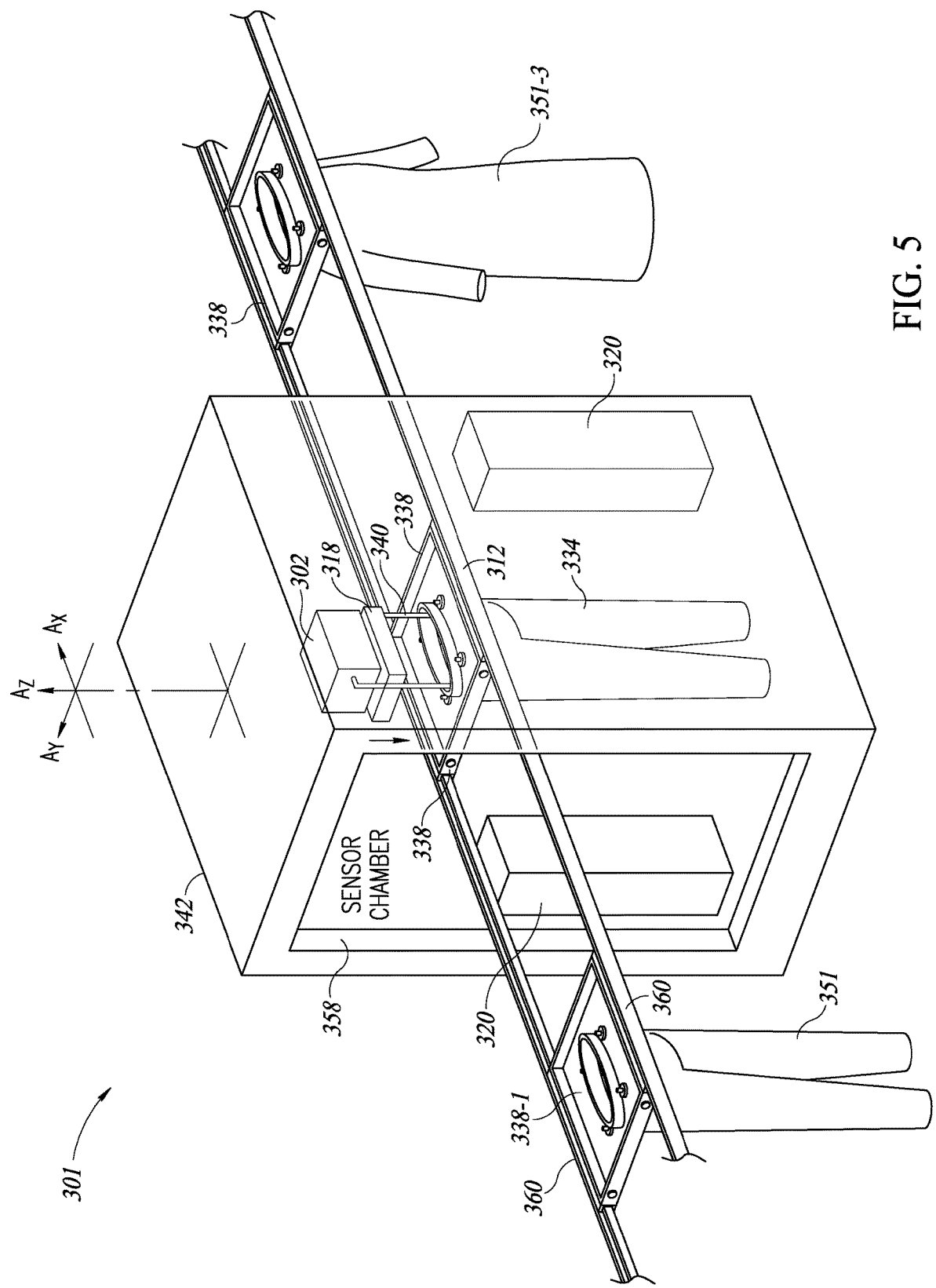
FIG. 5 is a detailed front top perspective view of a portion of the system of FIG. 3 in accordance with embodiments of the present invention.

A detailed front top perspective view of a portion of the system 301 of FIG. 3 in accordance with embodiments of the present invention is shown in FIG. 5. The sensor chamber 342 may be transparent and may include one or more openings 358 and one or more doors, and may be made from any suitable material to provide any desirable shielding of noise and/or emitted radiation such as electro-magnetic radiation (EMF), etc. For example, if X-ray sensors are employed for scanning, then the sensor chamber 342 may employ a suitable X-ray shielding (e.g., lead, gold, etc.). Similarly, if laser scanners may be employed, then the sensor chamber 342 may employ a suitable laser light filter (e.g., laser filtering glass, etc.). This may reduce or entirely eliminate undesirable radiation from being emitted by the sensor chamber 342 during use. The one or more doors may be hinged or sliding and may be automatically controlled by a controller of the system to open or close when an AOC is to enter and/or exit the sensor chamber 342.

In some embodiments, it is envisioned that the feeder line may be continuous or discontinuous. For example, in some embodiments, the feeder line may be discontinuous outside of the sensor chamber and may be continuous within the sensor chamber, as may be desired. A discontinuous feeder line may aid in manual coupling or decoupling of an APS to the feeder line at a location where the feeder line is discontinuous.

It would be appreciated that embodiments of the present invention provide for a system, which may hang AOCs on a feeder line forming at least part of a moving assembly line such that these apparel may be guided one-by-one into a sensor chamber where an appropriate AE such as an inflatable partial mannequin matched to a type of the apparel to be scanned may be inserted and inflated within the apparel. By matching the AE, its mannequin may have a similar style and form, shape, and/or size as the AOC to be scanned but may be larger in size (when inflated) than the AOC. Hence beyond a certain inflation, the form, shape, and/or size of the mannequin may be constrained and may be defined by the inner cavity of the AOC. The material of the mannequin and sensors may be selected such that the sensors may be sufficient to sense the form, shape, and/or size of the mannequin through the material of the AOC. For example, X-ray-type sensors may be employed where the AOC may be formed from a bone-like material. Accordingly, a suitable mannequin may be selected (e.g., a mannequin including an X-ray blocking material or layer such as lead, gold, or the like) so that it may be scanned in association with the AOC.

Various APS will now be discussed in further detail. In accordance with embodiments of the present invention, the APSs may be configured to be securely coupled to the feeder line so as to prevent undesirable motion and/or decoupling from the feeder line. Apparel couplers may be provided to couple an AOC to the APS at one or more discrete or continuous points. In some embodiments the apparel couplers may be include a biasing member (e.g., a clip like biasing member) to securely couple the apparel. Tabs may be provided for a user to grasp to release the AOC from the apparel coupler. In some embodiments, the apparel coupler may include a biasing member that may be controlled by the controller, such as an electromagnetic coupler, a solenoid driven coupler, etc., which may be configured to secure the AOC to the apparel coupler. The apparel couplers should be numerous enough and/or provide sufficient force to prevent an AOC coupled thereto from being unexpectedly dislodged from the apparel couplers and/or APS during inflation of the AE.

The APS may include one or more openings or notches through which an AE may be inserted. These one or more openings should not be blocked by the feeder line during insertion and/or removal of the AEs during use.

It is envisioned that the APS may include indicia which may provide indication of where apparel couplers may be placed by apparel type. The indicia may be textual, graphical, and/or embossed (e.g., dimples, groves, etc.).

It is envisioned that during the inflation of AE, the APS should be sufficiently rigid and/or stable and firmly to hold the apparel and counter any downward pressure (e.g., which may due to inflation of the AE). Accordingly, the apparel may be inflated or otherwise expanded as the AE situated within is inflated.

It is envisioned that during inflation, the apparel couplers should be coupled to a corresponding AOC such that the AOC and/or the apparel couplers may be able to have one or more degrees of travel to some extent along one or more desired planes such as on a horizontal plane (e.g., along Ax and/or Ay axes) in the present embodiments as may be desired. For example, this may assure that the AOC may have limited free travel in the horizontal plane but may be restricted with respect to travel in the vertical axis (e.g., Az axis) when coupled to the apparel coupler. This freedom of travel may provide for proper expansion of the AE within the AOC while preventing undue stress on the AOC during inflation. It would be further appreciated that during inflation, the controller may monitor stress on the AOC and may act to reduce the stress if detected such as by controlling the supply to lower pressure within the AE (e.g., deflating the AE), to lower and raise pressure within the AE, and/or to control a rate of pressure increase within the AE, etc. before or during a scan. The controller may further render an alert to inform a user of detected stress events outside of a threshold and may update history information for the AOC to indicate the detected stress event and/or system parameters (e.g., pressure, system configuration, system settings, etc.) associated therewith. Stress may be detected by monitoring using any suitable method or methods such as by monitoring for unusual contours (e.g., unexpected or shapes beyond a set threshold, seam splits, etc.) of the AOC and/or AE during inflation which may be detected by one or more sensors of the system.

Figure 6:
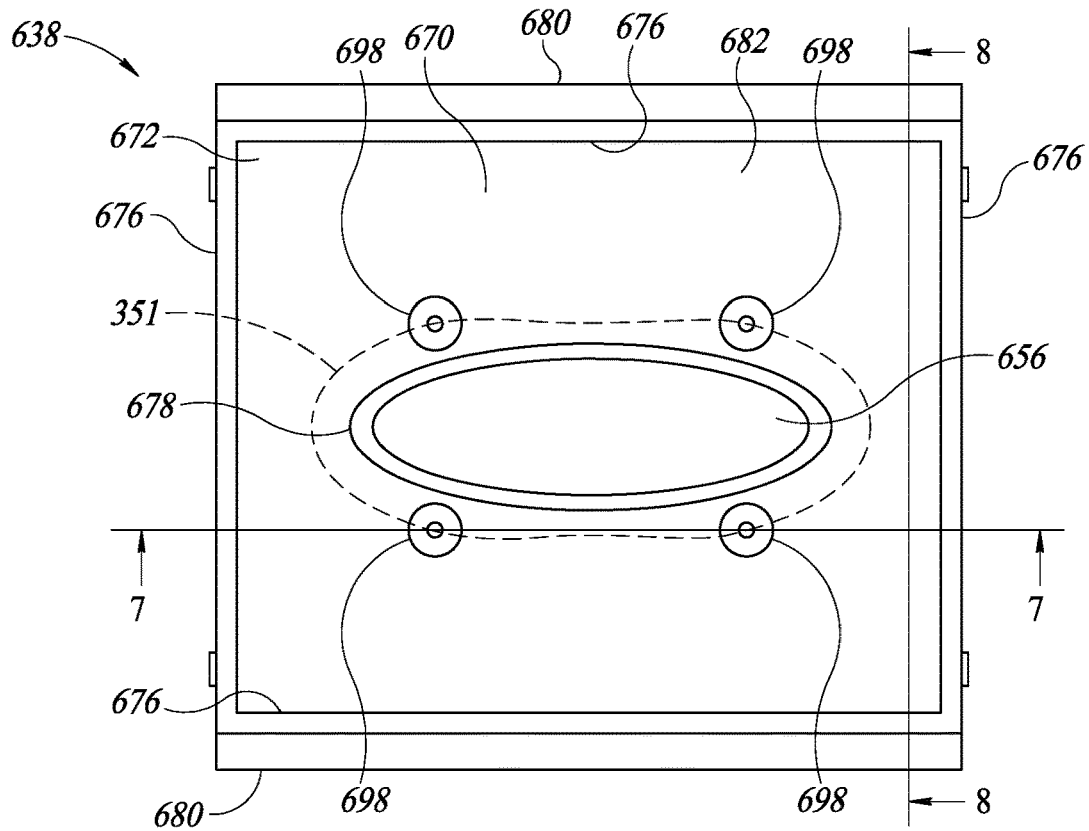
FIG. 6 is a top view of a portion of an APS in accordance with embodiments of the present invention.
Figure 7:
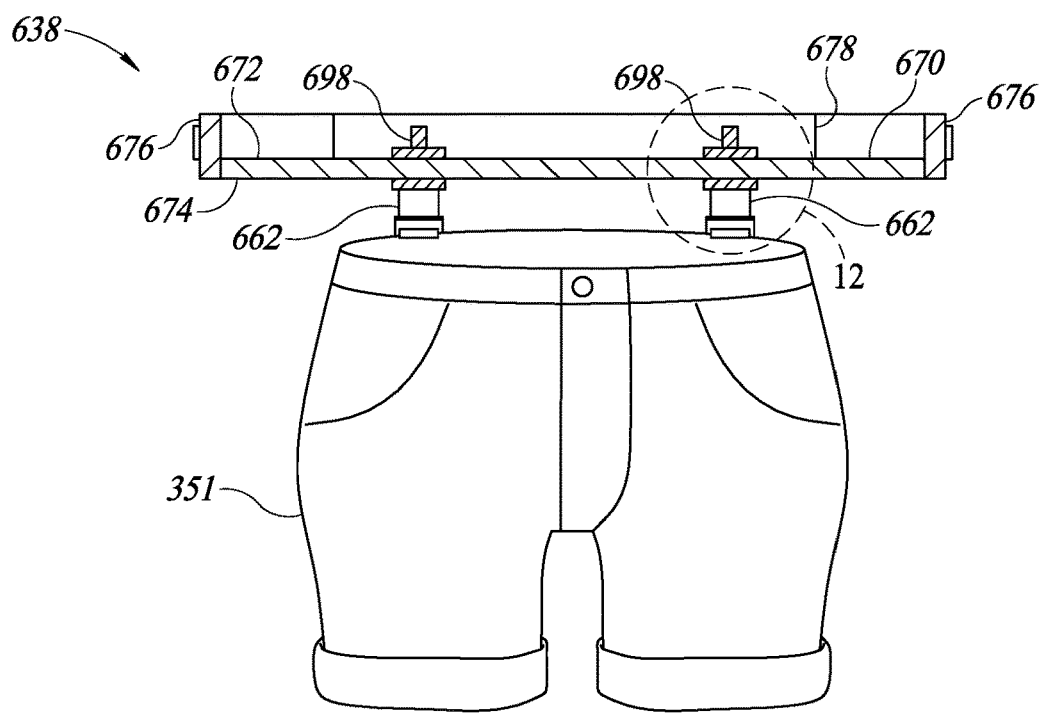
FIG. 7 is a cross sectional view of a portion of the APS in accordance with embodiments of the present invention taken along lines 7-7 of FIG. 6.
Figure 8:
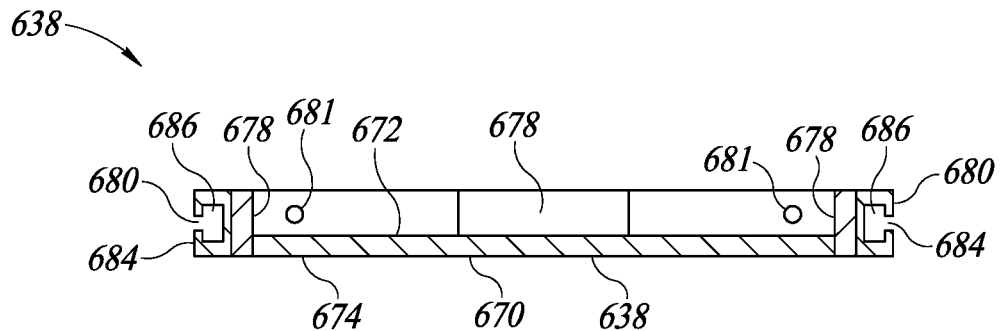
FIG. 8 is a cross sectional view of a portion of the APS in accordance with embodiments of the present invention taken along lines 8-8 of FIG. 6.
Figure 9:
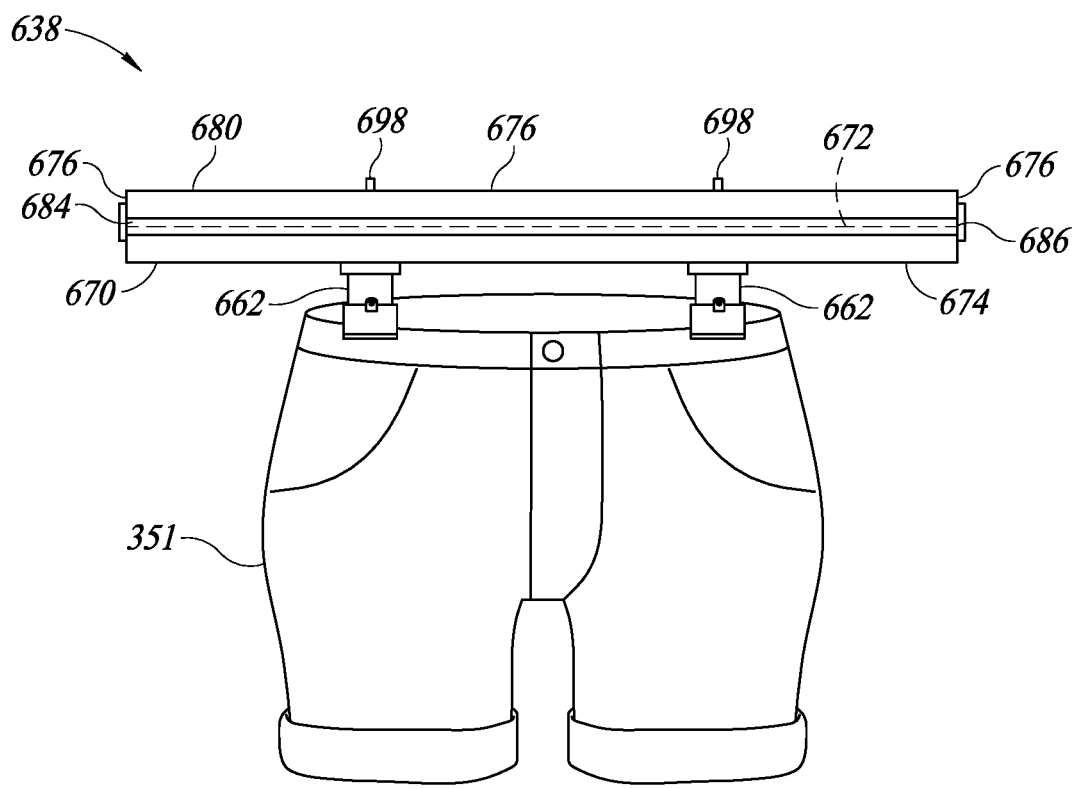
FIG. 9 is a side view of a portion of the APS of FIG. 6 in accordance with embodiments of the present invention.
Figure 10:
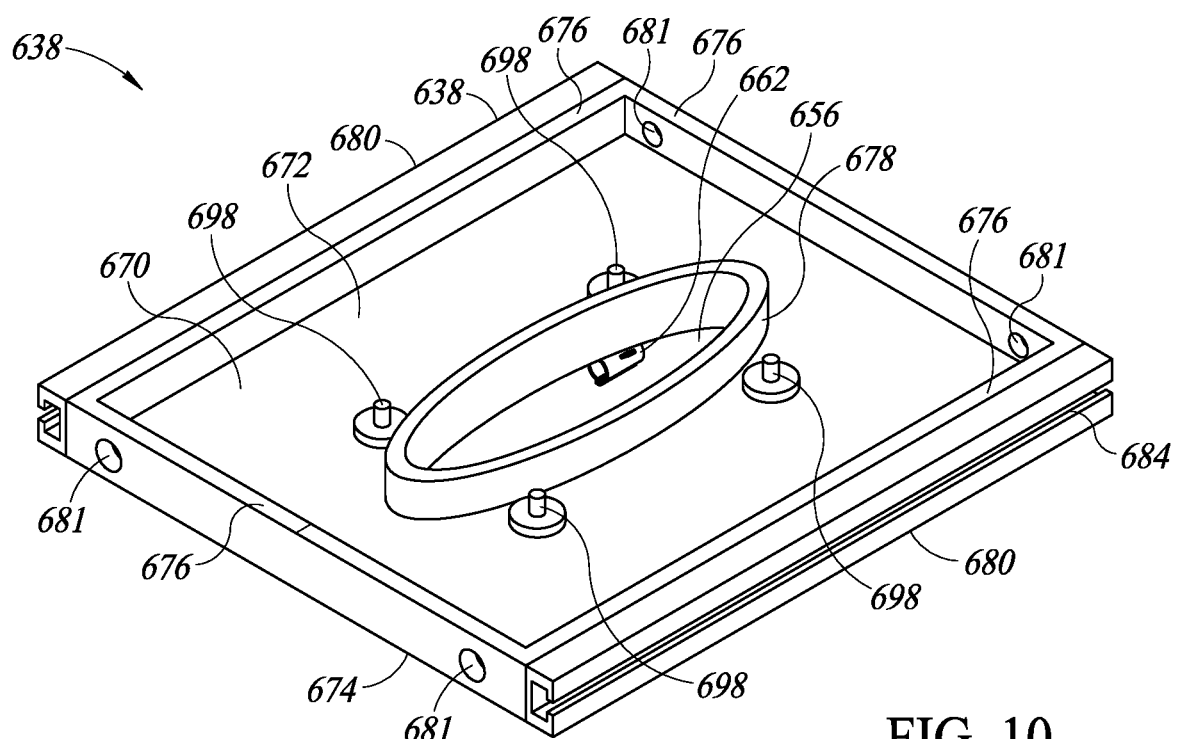
FIG. 10 is a top perspective view of a portion of the APS of FIG. 6 in accordance with embodiments of the present invention.
Figure 11:
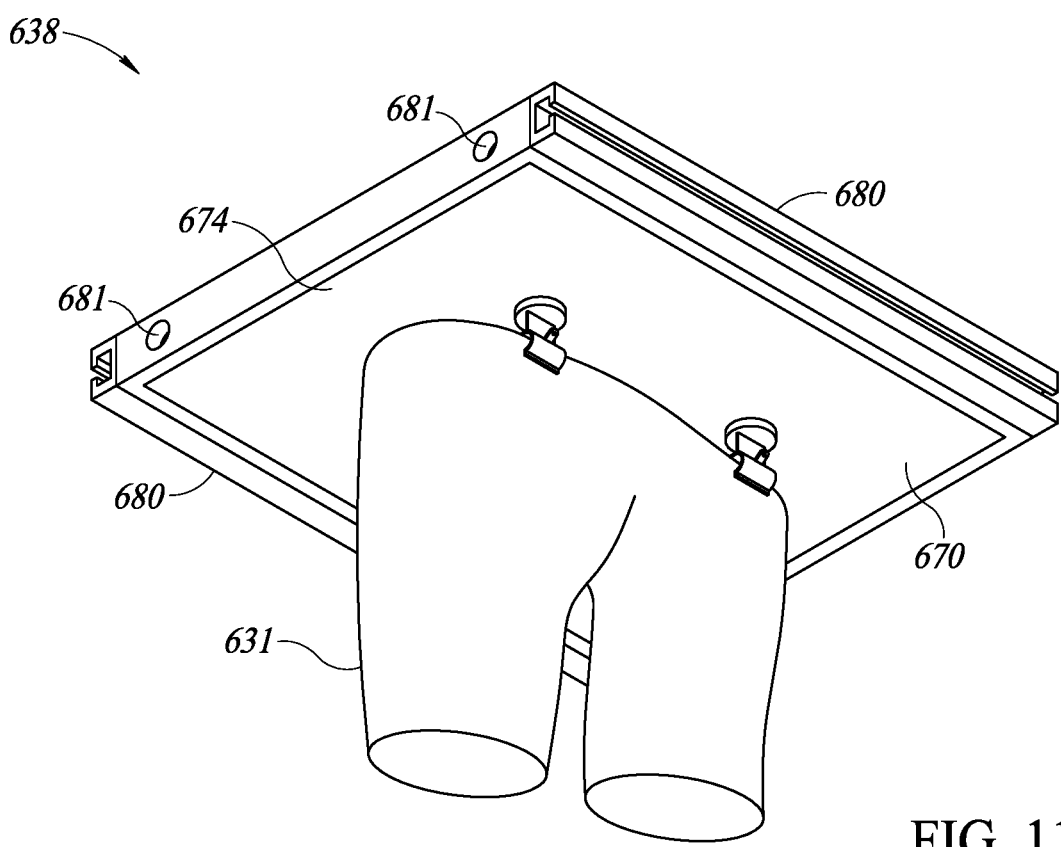
FIG. 11 is a bottom perspective view of a portion of the APS of FIG. 6 in accordance with embodiments of the present invention.

APSs in accordance with embodiments of the present invention will now be described with reference to FIG. 6 through FIG. 11, wherein: a top view of a portion of an APS 638 in accordance with embodiments of the present invention is shown in FIG. 6; a cross sectional view of a portion of the APS 638 in accordance with embodiments of the present invention taken along lines 7-7 of FIG. 6 is shown in FIG. 7; a cross sectional view of a portion of the APS 638 in accordance with embodiments of the present invention taken along lines 8-8 of FIG. 6 is shown in FIG. 8; a side view of a portion of the APS 638 of FIG. 6 in accordance with embodiments of the present invention is shown in FIG. 9; a top perspective view of a portion of the APS 638 of FIG. 6 in accordance with embodiments of the present invention is shown in FIG. 10; and a bottom perspective view of a portion of the APS 638 of FIG. 6 in accordance with embodiments of the present invention is shown in FIG. 11.

A detailed front perspective view of a portion of the apparel coupler 662 of FIG. 9 in accordance with embodiments of the present invention is shown in FIG. 12. A detailed side view of a portion of the apparel coupler 662 of FIG. 12 in accordance with embodiments of the present invention is shown in FIG. 13.

Figure 15:
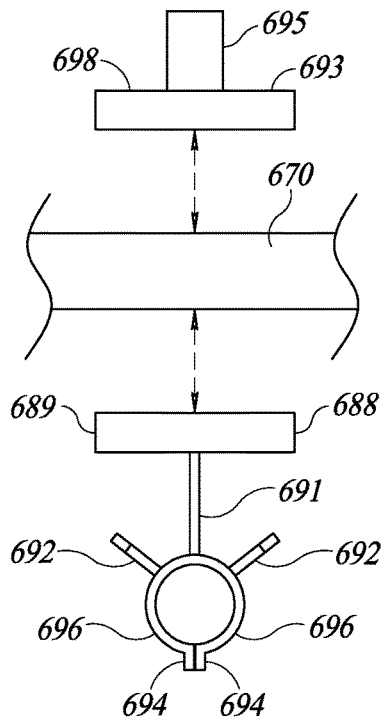
FIG. 15 is a detailed exploded side view of a portion of the apparel coupler of FIG. 13 in accordance with embodiments of the present invention.

A cross sectional view of a portion of the APS 338 (638 is similar), coupled to feeder lines 360 taken along lines 14-14 of FIG. 4 in accordance with embodiments of the present invention is shown in FIG. 14. A detailed exploded side view of a portion of the apparel coupler 362 of FIG. 13 in accordance with embodiments of the present invention is shown in FIG. 15. With reference to FIGS. 6 through 14, the APS 638 may be similar to the APS 338 (and may be referred to as an inflation hanger (IH)) and may include one or more of a body 670 having first and second surfaces 672 and 674, respectively, which may be opposed to each other. The body 670 may be of any shape or shapes such as round, oval, square, rectangular, polygonal, etc., when viewed from the top as may be desired an may include at least one opening 656 through which an AE may be inserted through the body 670 and which may be inflated during scanning of an apparel 351 such as may occur during a digiforming operation. The body 670 may include one or more raised portions such as flanges 676 and 678 (e.g., raised edges) which may define the lateral movement area for and to contain one or more couplers such as apparel couplers 662 during handling and/or operation (e.g., should an apparel coupler 662, or portions thereof, become dislodged during inflation of the AE, etc.). The body 670 may include a rigid planar surface defined by the first and second surfaces 672 and 674, respectively.

One or more couplers 680 may be coupled to the body 670 and may be configured to couple to a corresponding feeder line 360 so as to couple the APS 638 to one or more of the feeder lines 360. More particularly, the one or more couplers 680 may include a slot 684 (e.g., a horizontal slot) and a cavity 686 which may be configured to receive a corresponding portion of the feeder line 360 such as a guide, rail, and/or track of the corresponding feeder line 360 as illustrated with reference to FIG. 14. One or more of the body 670, the couplers 680, and/or the feeder line(s) 360 may include a low-friction surface, and/or a lubricant to reduce friction as may be desired, so as to provide desired freedom of movement. In yet other embodiments, the couplers may incorporate plain (e.g., Teflon™, ceramic, etc.), roller or ball bearings to reduce friction.

One or more openings may be provided to move the APS 638 during use. For example, openings 681 may be situated in one or more of the flanges 676 and may be configured to receive a coupler such as a rod or cable (e.g., see, MIBA couplers 354, FIG. 3) which may pass therethrough and which may be configured to move the APS 638 to another portion of the system 301 such as to an AES (e.g., see AES 12, FIG. 3) as may be desired.

With regard to the apparel couplers 662, these couplers may be configured to couple an AOC 351 to the body 670 of the APS 638 using any suitable method such as magnetic coupling. For example, the apparel couplers 663 may include a lower coupler 688 and an upper coupler 698 which may be coupled to each other via any suitable coupling such a magnetic coupling (e.g., using a permanent magnet or electromagnetic coupling which may be controlled by a controller of the system), etc. For example, it is envisioned that the lower coupler 688 may be magnetically coupled to the opposed upper coupler 698 situated on the opposed side of the body 670 of the APS 638. The body 670 may have a friction reducing coating such as a low-friction Teflon™ coating or the like on a surface thereof which may allow for some movement of the opposed upper and lower couplers 688 and 698, respectively, in a horizontal plane (e.g., Ax-Ay plane as shown). The apparel couplers 662 may form an anchor point for anchoring the AOC to the APS 638. An APS 638 may include an arbitrary number of anchor points one or more of which may be used for coupling an AOC depending upon apparel type.

Figure 16A:
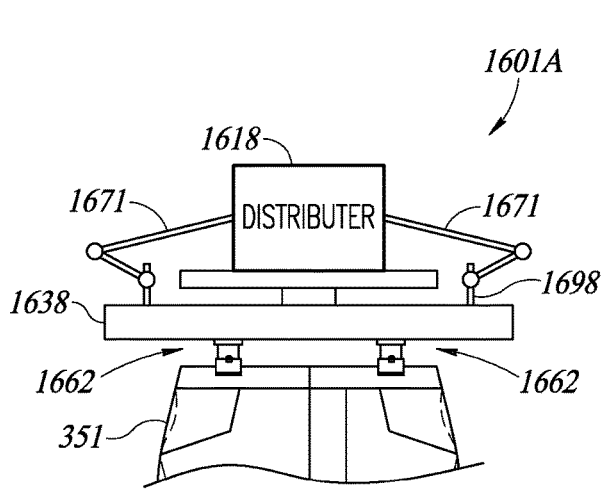
FIG. 16A is a perspective view of a portion of a system including multi-axis control of apparel anchor points in accordance with embodiments of the present invention.

It is envisioned that upper coupler 698 may include one or more of a magnetic base 693 and a handle (or tab) 695 suitable for grasping by a user or robotic arms as shown in FIG. 16A and may be configured to magnetically couple to the lower coupler 688.

The lower coupler 688 may include one or more of a magnetic base 689, and a spring clip 696 coupled to each other via a flexible coupler such as a strap 690, a spring, a cable, etc. The spring clip 696 may include a circular body which may act as a biasing member and may be coupled to opposed flanges 694 so that a biasing force may be exerted upon the opposed flanges 694. One or more tabs 692 suitable for grasping by a user may be coupled to the spring clip 696 to urge its biasing member in a direction opposite its biasing force so as to urge the opening of the opposed flanges 694 as may be desired. When opened, a portion of the AOC may be placed between the opposed flanges 694 of the spring clip 696 and may be firmly held in place when the opposed flanges 694 are biased against each other by the spring clip 696 with a portion of the AOC therebetween.

In some embodiments, however, it is envisioned that the apparel coupler may employ an electromagnetic apparel coupler which may be controlled by the controller to couple or decouple an AOC from the APS 638. Accordingly, coupling and/or decoupling of an AOC may be automatically controlled by the controller. For example, a robotic manipulator may place an AOC into the apparel coupler and thereafter the apparel coupler may be activated to secure the AOC in place. After scanning, the apparel coupler may be deactivated to provide for the removal of the AOC from the apparel coupler.

Thus, embodiments of the present invention may employ a pair of magnetic couplers (e.g., the upper and lower magnetic couplers 698 and 688, respectively) at opposed sides of the body 670 such that they may move freely over and under the body 670 in a horizontal plane (e.g., the Ax/Ay plane) and have little to no movement (e.g., restricted movement) in a vertical plane (e.g., the Az plane). It is further envisioned that horizontal movement of anchor points securing the apparel may be restricted by the raised flanges 676 and 678. The at least one opening 656 may be defined by the flange 678. It is also envisioned that the raised flanges 676 and 678 may control movement of the anchor points so as to assure that the AOC 351 has at least a minimum opening to its internal cavity suitable for receiving the AE.

During the inflation of AE, the one or more couplers 680 may be configured to couple the APS 638 to one or desired objects such as the one or more feeder lines 360 so as to hold the APS 638 stationary or substantially stationary. As the APS 638 may be held stationary, this may assure that there is little to no vertical movement of the apparel couplers 662 (e.g., acting as anchor points for the coupled AOC) in a vertical direction but the apparel couplers 662 (e.g., acting as the anchor points for the AOC) may be free to move in a horizontal plane (e.g., relative to the body 670 of the APS 638) within the confines of the flanges 676 and 678 to reduce stress on the coupled apparel as the AE is inflated within the apparel. With regard to FIGS. 12 through 15 the opposite views may be substantially similar and are not shown for the sake of clarity.

The controller of the system may selectively control position and/or inflation of the AE during use such that the AE may be inserted through a small opening in the AOC (e.g., a collar opening, a sleeve opening, hem opening, etc.) and may be properly inflated after insertion. Different types of AEs may be selected by the controller or user for insertion into cavities of an AOC.

A perspective view of a portion of a system 1601A including multi-axis control of apparel anchor points in accordance with embodiments of the present invention is shown in FIG. 16A. The system 1601A may include a plurality of actuators 1671 each coupled to a corresponding upper coupler 1698 of an apparel coupler 1662 pair having coupled upper and lower couplers pairs 1698 and 1688, respectively, and which may be situated on opposite sides of an AES 1638 and may be configured to be magnetically coupled to each other. It is envisioned that the plurality of actuators 1671 may include multi-axis robotic functionality under the control of a controller. The apparel coupler 1662 may be coupled to an AOC 351 and may be maneuvered by the plurality of actuators 1671 under the control of a controller of the system. More particularly, one or more of the plurality of actuators 1671 may move the upper coupler 1698 to which it is coupled, and the upper controller 1698 may move the lower coupler 1688 that is magnetically coupled to it accordingly. Accordingly, the upper coupler 1698 may include coupler to couple to the corresponding actuator 1671. The location of each of the apparel coupler pairs 1662 may define an AOC anchor point. The plurality of actuators 1671 may further be coupled to a distributor 1618 or any other rigid portion. This may provide for the controller to control positions of one or more of the plurality of actuators 1671 so as to control positions of one or more of the apparel couplers 1662 coupled to corresponding one of the plurality of actuators 1671 at any given time during inflation of an AE in the AOC 351. Thus, the controller may control the position of one or more of the apparel anchor points. The distributor 1618 may be flow coupled to the AE and may provide an OPF to the AE under the control of the controller.

Figure 16B:
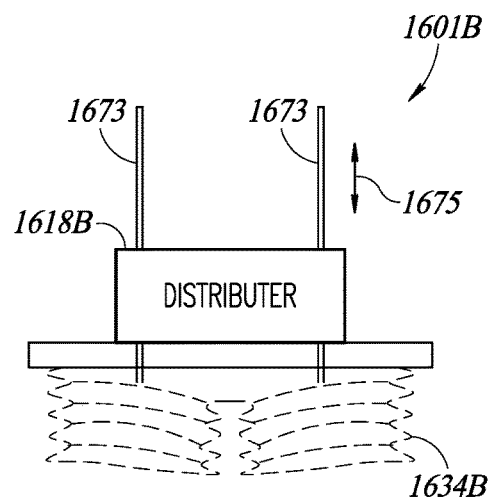
FIG. 16B is a front view of a portion of a system having rigid telescopic actuators for controlling a position of an AE in accordance with embodiments of the present invention.

A front view of a portion of a system 1601B having rigid telescopic actuators 1673 for controlling a position of an AE 1634B in accordance with embodiments of the present invention is shown in FIG. 16B. Here, instead of only relying on pressure in AE to expand AOC, one or more solid rods may be employed to perform and/or assist expansion of at least a part of the AOC. The system 1601B, may include a plurality of actuator arms 1673 (e.g., solid rods) each coupled to a distributor 1618B and a corresponding portion of the AE 1634. The actuator arms 1673 may be rigid (e.g., rigid guides) and may telescope (e.g., as indicated by arrow 1675) relative to the distributor 1618 under the control of a controller of the system 1601B. Accordingly, position of one or more of the actuator arms 1673 may be controlled to exert a force to move portions of the AE 1634B attached thereto so as to aid in the insertion of the AE 1634B into an AOC during use. The plurality of actuator arms 1673 may be coupled to the distributor 1618B of an MIBA and may include actuators which may control their position under the control of a controller. It is envisioned that the actuator arms 1673 may be rotated along or about one or more axes as may be desired. Further it is envisioned that a distance between the actuator arms 1673 may be varied so that they may move relative to each other such that they may be closer or further away from each other. Although the actuator arms 1673 are shown substantially parallel to each other they may have other orientations relative to each other as may be controlled by a user and/or a controller of the system.

Figure 16C:
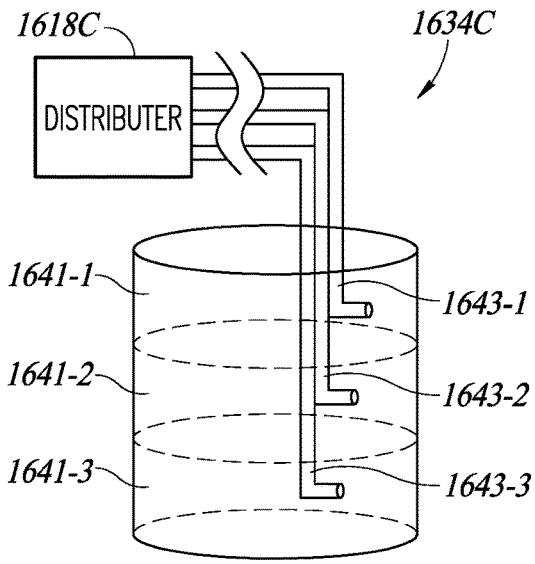
FIG. 16C a perspective view of a portion of an AE with a plurality of compartments in accordance with embodiments of the present invention.

A perspective view of a portion of an AE 1634C with a plurality of compartments 1641-1 through 1641-3 in accordance with embodiments of the present invention is shown in FIG. 16C. The AE 1634C may be divided into the plurality of compartments 1641-1 through 1641-3 each coupled a distributor 1618 via flow channels 1643-1 through 1643-3, respectively. These flow channels 1618-*x* may be independent of each other may selectively flow the OPF to/from the corresponding compartment 1643-*x* under the control of the distributor 1618C. Accordingly, the distributor 1618C may independently control the pressure within each of the compartments 1641-*x* under control of a controller of the system. This may be particularity useful for measuring the elasticity of different segments of an apparel. Moreover, it may provide control over the sequence of the compartments (which may form segments) of the AE to be inflated and deflated during operation.

Figure 16D:
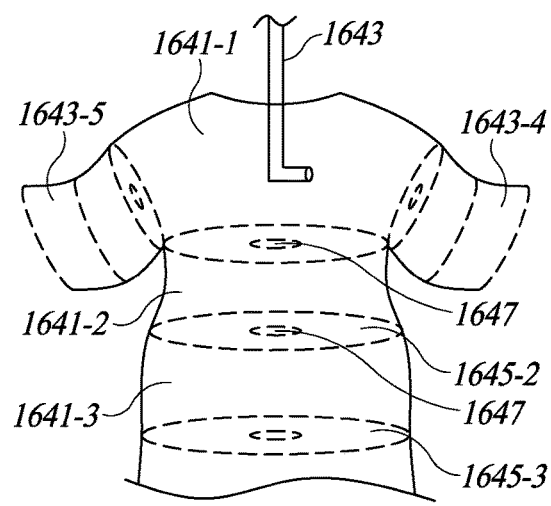
FIG. 16D a perspective view of a portion of an AE with a plurality of compartments each having (internal) vents of different sizes in accordance with embodiments of the present invention.

A perspective view of a portion of an AE 1634D with a plurality of compartments 1641-1 through 1641-3 each having (internal) vents 1647 of different sizes in accordance with embodiments of the present invention is shown in FIG. 16D. More particularly, the AE 1634D may be shaped as a torso with the torso and arms each having a plurality of adjacent compartments 1641-*x* one of which receives OPF from a distal end of a flow channel 1643. These, adjacent compartments 1641-*x* may be separated by a corresponding barrier 1645 of a plurality of barriers 1645 each having a vent 1647 of a different size from a vent 1647 (e.g., an opening) of an adjacent barrier 1645 such that the size of the vents 1647. It is envisioned that the size of these vents may be the same size as each other or may decrease as the further they are from the compartment which receives the OPF from the flow channel 1643. In yet other embodiments, the size of the vents in sleeves of the AE may be different from (e.g., smaller than, etc.), the size of the vents in a torso portion of the AE. Different vent sizes between the compartments 1641-*x* may provide for some degree of control over which compartment 1641-*x* may be inflated first. For instance, when trying to insert an AE for an upper body in an AOC, such as a dress, through the opening for a neck, it may be desirable to inflate and expand a torso portion of the first and then inflate the sleeves fully. This can be achieved even with a single air inlet/outlet 1643 providing the air (e.g., the OPF) to each of the compartments 1641-*x* when compartments 1641-*x* of the torso are connected via larger air vents 1647 and compartments 1641-*x* in the sleeve may be connected via smaller air vents 1647. In some embodiments, it is envisioned that the controller may inflate the AE to at least partially position the AE relative to the AOC and may then deflate the AE at least partially before inflating it a second time to position the AE relative to the AOC. This inflation pattern may be repeated several times before final inflation for a scan is performed.

Figure 16E:
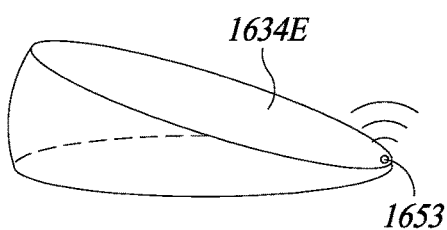
FIG. 16E a perspective view of a portion of an AE with a pinched compartment in accordance with embodiments of the present invention.

A perspective view of a portion of an AE 1634E with a pinched compartment in accordance with embodiments of the present invention is shown in FIG. 16E. It is envisioned that any two points on a surface of AE 1634E (or walls of compartments within) may be held together by a pinch 1653 using any suitable method to generate a suitable force with which to generate the pinch 1653 such as an electromagnetic/magnetic and/or by mechanical means. Such a pinch may be released by a controller of the system using wired and/or wireless communication methods when desired. In some embodiments it is envisioned that the pinch 1653 may be released only when an inflation pressure acting against it may exceed a threshold value (e.g., 3 psi, etc.). This may provide for the controlled position during inflation of the AE 1634E.

Figure 16F:
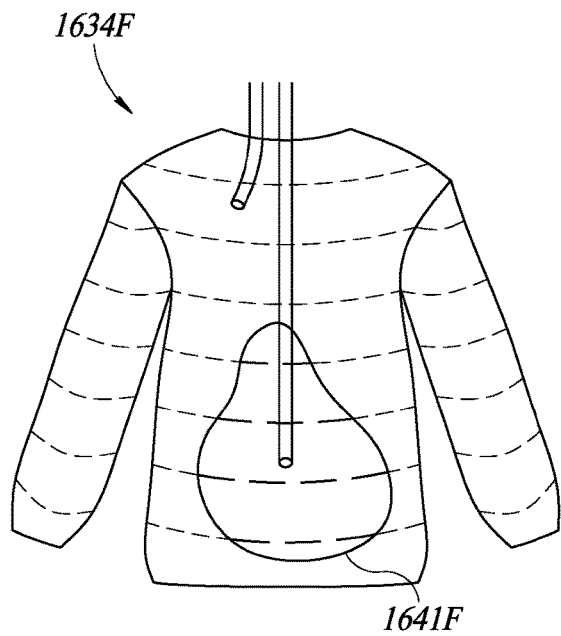
FIG. 16F is a perspective view of a portion of an AE with a specific obesity-type pattern in accordance with embodiments of the present invention.

With regard to clothing for special-sized clothing such as clothing for full-sized individuals, big and tall, obese, pregnant, etc., the system may include specific AEs for this clothing. For example, a perspective view of a portion of an AE 1634F with a specific obesity-type pattern in accordance with embodiments of the present invention is shown in FIG. 16F. The AE 1634F may include one or more special compartments 1641F which may be configured to physically copy the form, shape, and/or size of one or more desired patterns such as obesity patterns, pregnancy patterns, and the like (e.g., pot belly, pregnancy pattern, etc.), and such compartments may be inflated with, or separately from, other portions of the AE and in the latter case may include an independent inflation control compared to other parts of AE 1634F. For instance, compartment 1641F may be shaped and sized to such that it may be in accord with a form and growth of stomach fat of a pot-bellied individual such as may be common in middle-aged men.

It is also envisioned that AEs of various types may include pleated or folding patterns. For example, an AE may be configured in a way such that it may include an origami-like folding pattern which allow it to expand and/or contract in a predetermined fashion, instead of ballooning up in a spherical shape. The AEs may be contoured for upper-body (e.g., upper anatomy) scans (e.g., shirts, jackets, etc.) and lower-body (e.g., lower-anatomy) scans (e.g., pants, skirts, etc.). The AEs may also be fitted for expected type of apparel. For example, with regard to lower-body apparel scans, the AEs may be fitted uniquely for smaller and larger sized apparel as well as unique sized apparel such as larger thighs, etc. Accordingly, one or more compartments or areas of these uniquely-fitted AEs may include a form, shape, and/or size which may fit a corresponding AOC for scanning.

Figure 17A:
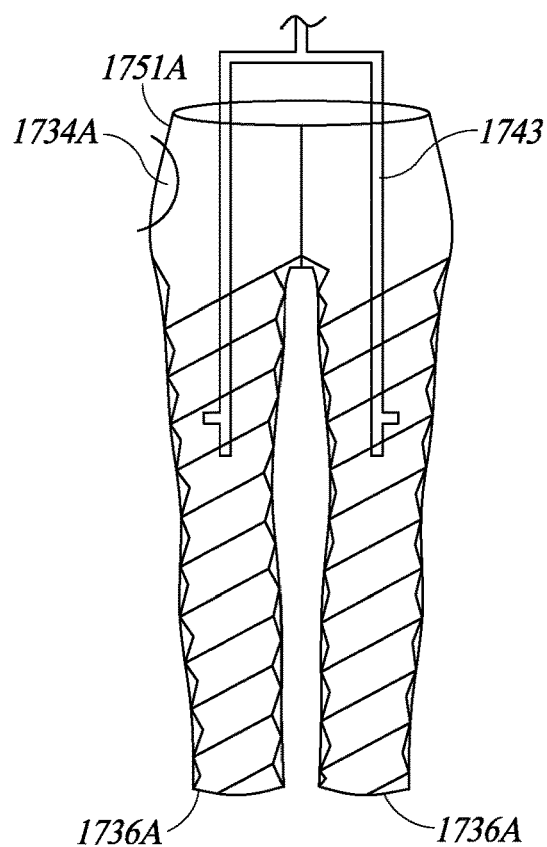
FIG. 17A is a partially cutaway perspective front view of a portion of an AE with at least a folded leg pattern in accordance with embodiments of the present invention.
Figure 17B:
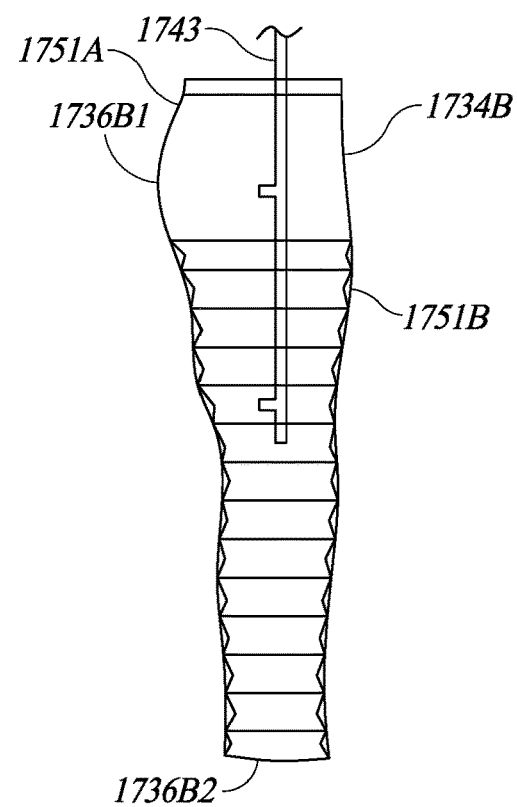
FIG. 17B is a partially cutaway perspective side view of a portion of an AE with at least a folded leg pattern in accordance with embodiments of the present invention.
Figure 17C:
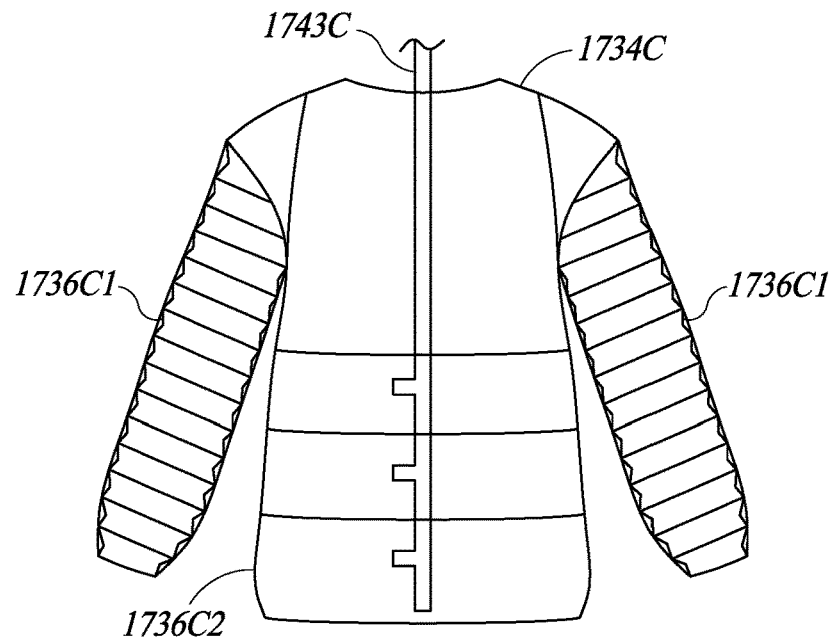
FIG. 17C is a partially cutaway a perspective view of a portion of an AE with at least a folded arm pattern in accordance with embodiments of the present invention.
Figure 17D:
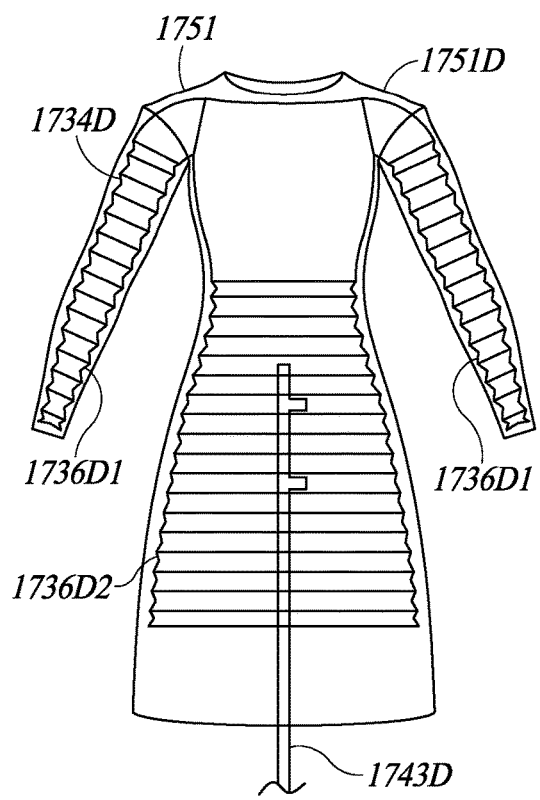
FIG. 17D is a partially cutaway perspective view of a portion of an AE having a dress pattern inflating a dress in accordance with embodiments of the present invention.
Figure 17E:
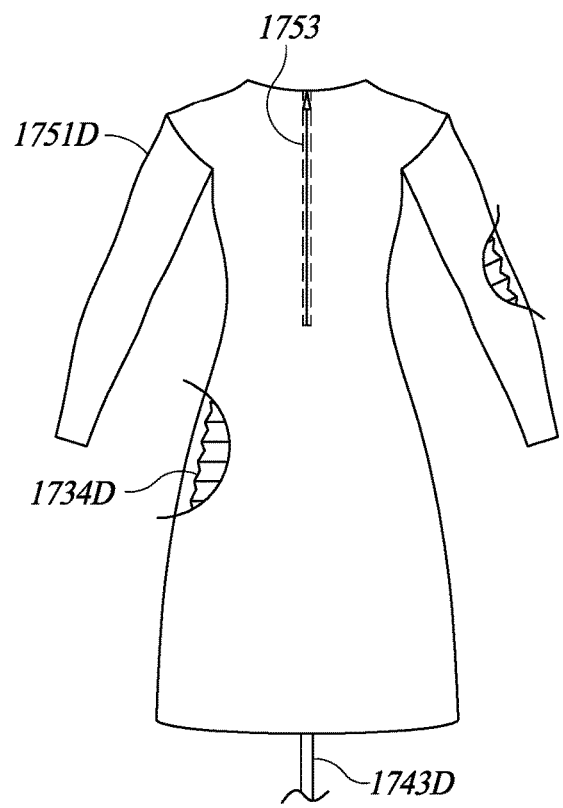
FIG. 17E is a partially cutaway perspective view of the dress inflated by a portion of the AE of FIG. 17D in accordance with embodiments of the present invention.
Figure 17F:
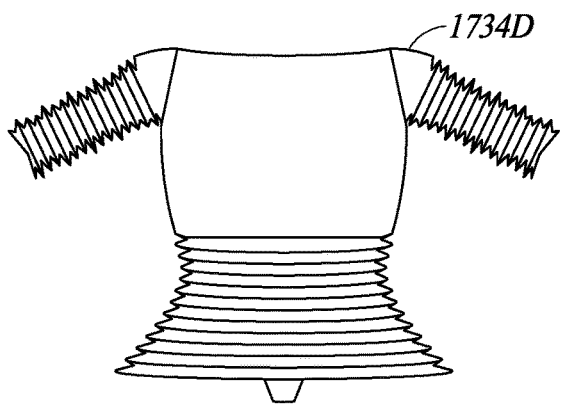
FIG. 17F is a front view of a portion of the AE of FIG. 17D in a substantially folded position in accordance with embodiments of the present invention.
Figure 17G:
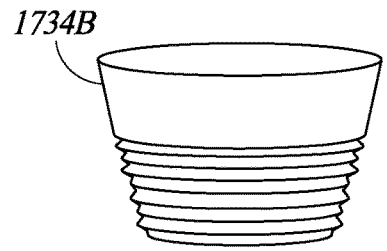
FIG. 17G is a side view of a portion of the AE of FIG. 17B with at least a folded leg pattern in a substantially folded position in accordance with embodiments of the present invention is shown.

Various AEs of upper body apparel such as shirts and jackets, and lower body apparel such as pants, and dresses, and/or uniquely shaped apparel, will be discussed with reference to FIG. 17A through FIG. 17G; wherein a partially cutaway perspective front view of a portion of an AE 1734A with at least a folded leg pattern in accordance with embodiments of the present invention is shown in FIG. 17A; a partially cutaway perspective side view of a portion of an AE 1734B with at least a folded leg pattern in accordance with embodiments of the present invention is shown in FIG. 17B; a partially cutaway a perspective view of a portion of an AE 1734C with at least a folded arm pattern in accordance with embodiments of the present invention is shown in FIG. 17C; a partially cutaway perspective view of a portion of an AE 1734D having a dress pattern inflating a dress in accordance with embodiments of the present invention is shown in FIG. 17D; a partially cutaway perspective view of the dress inflated by a portion of the AE 1734D of FIG. 17D in accordance with embodiments of the present invention is shown in FIG. 17E; a front view of a portion of the AE 1734D of FIG. 17D in a substantially folded position in accordance with embodiments of the present invention is shown in FIG. 17F; and a side view of a portion of the AE 1734B of FIG. 17B with at least a folded leg pattern in a substantially folded position in accordance with embodiments of the present invention is shown in FIG. 17G.

With regard to FIG. 17A, the AE 1734A may be coupled to a distributor via flow channels 1743A which may provide an OPF to, or from, one or more expansion chambers such as ECs 1736A situated within the AE 1734A and a corresponding leg of an AOC 1751A to expand the corresponding area of the AOC 1751A in which it may be at least partially situated during a scan. It is envisioned that one or more ECs of different shape, volume, and/or type may be coupled to an AE and may be flow coupled by a flow channel to a distributor so as to receive an OPF from the distributor.

With regard to FIG. 17B, the AE 1734B may be similar to a side view of the AE 1734A and may be coupled to a distributor via flow channels 1743B which may provide an OPF to, or from, one or more expansion chambers such as ECs 1736B1 and 1736B2 situated within the AE 1734B to expand an AOC 1731B such as long pants in which the AE 1734B may be at least partially situated. Here the EC 1736B1 may be configured to fit a larger thigh volume.

With regard to FIG. 17C, the AE 1734C may be coupled to a distributor via flow channels 1743C which may provide an OPF to, or from, one or more expansion chambers such as ECs 1736C1 and 1736C2 situated within the AE 1734C to expand an AOC 1751C such as a long-sleeved shirt in which it may be is at least partially situated during a scan. Here the EC 1736B2s may be unique to fit a long-sleeve shirt style of the apparel 1751C.

With regard to FIG. 17D, the AE 1734D may be coupled to a distributor via flow channels 1743D which may pass through or otherwise enter a bottom portion or hem opening of an AOC 1751D and may provide an OPF to, or from, one or more expansion chambers such as ECs 1736D1 and 1736D2 situated within the AE 1734D to expand an AOC 1751D such as a long-sleeved dress in which it may be is at least partially situated during a scan. Here the EC 1736B2s may be unique to fit the AOC 1751 which is a long-sleeve dress style. With regard to FIG. 17E, all or select buttons, zippers, snaps, etc. of the apparel 1751D may be closed during a scan. For example, zipper 1753 may be zipped up for the scan. Further, as this apparel may have a larger opening on the bottom at the hem side (e.g., opposite the neck opening), the AE 1734 may be inserted from this opening as opposed to the neck opening. Further, it would be appreciated that an AOC may be coupled to the APS in any suitable orientation. For example, with regard to jackets with a larger opening on the bottom as opposed to the top (e.g., the neck opening), the jacket may be closed and coupled to the APS in an orientation such that its hem (e.g., bottom) may be coupled to the APS as may be desired.

Figure 18A:
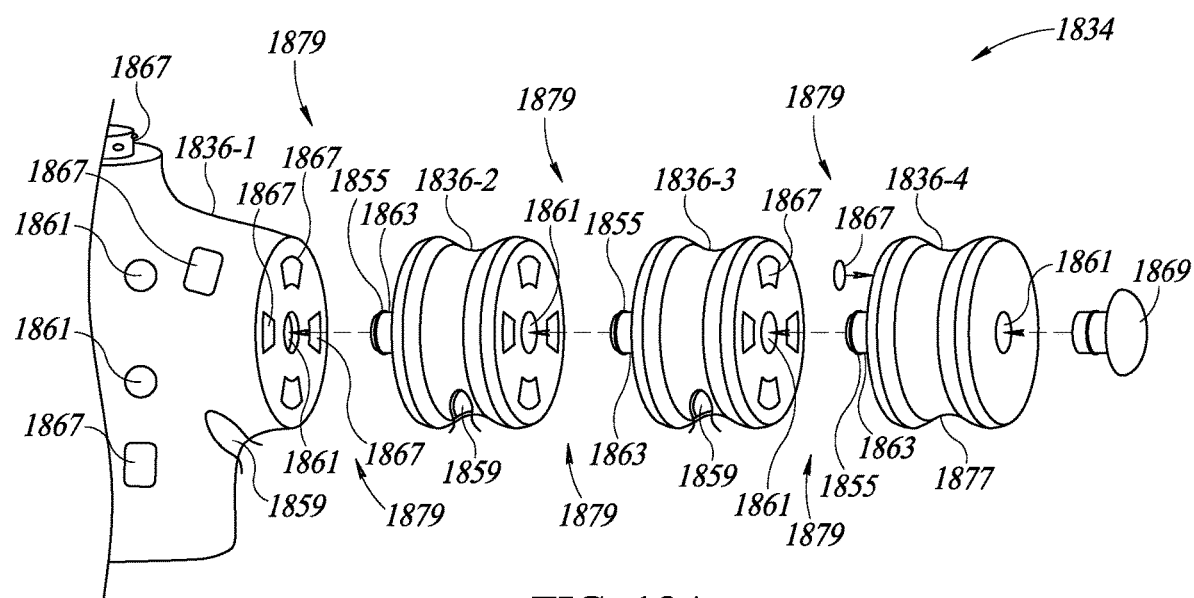
FIG. 18A is an exploded partially-cutaway perspective view of a portion of an AE formed from a plurality of ECs such as illustrated by ECs coupled together in accordance with embodiments of the present invention.

It is also envisioned that AEs may be built from one or more EC's coupled to together. For example, an exploded partially-cutaway perspective view of a portion of an AE 1834 formed from a plurality of ECs such as illustrated by ECs 1836-1 through 1836-4 (generally 1836-x) coupled together in accordance with embodiments of the present invention is shown in FIG. 18A. The ECs 1836-x may be inflatable, and may each include a body 1877 defining at least one chamber 1859 coupled to a coupler 1879 including at least one flow passage for receiving and/or passing the OPF, when desired, to/from an adjacent EC 1836-x coupled thereto. The coupler 1879 may include any suitable coupler and may include a flow passage configured to passage of the OPF to/from the at least one chamber 1859 to an adjacent EC 1836-x. For example, the coupler 1879 may include male-female-type coupler which may include an opening such as a cylindrical opening 1861 configured to receive a piston 1863 using any suitable fit such as an interference fit, a bayonet mount, a tab and notch, etc. Each of the cylindrical openings 1861 and/or the pistons 1863 may be coupled to at least one chamber 1859 of a corresponding one of the ECs 1836-x via at least one flow channel. For example, a flow channel may pass through the piston 1863 to the at least one chamber 1859 of a corresponding EC 1836-x. One or more seals such as a ring seal 1855 may be provided to seal against pressure and/or vacuum loss at the corresponding coupler. An optional cap 1869 may seal a portion of one or more couplers 1879 such the cylindrical opening 1861 and the adjacent piston 1863 as shown. One or more optional fasteners 1867 such as hook-and-loop-type fasteners, magnetic fasteners, interference-type fasteners, bayonet-type fasteners, etc., may be provided to couple one or more adjacent ECs 1836-x to each other and/or to other portions of the system and may be placed as desired.

One or more of the ECs 1836-x may be shaped as desired. For example, the EC 1836-1 may be shaped as a partial torso and may receive the ECs 1836-2 through 1836-4 which, in combination, may be shaped anatomically to mimic a portion of an arm. It is further envisioned that one or more of the ECs 1836-x may include a rigidity enhancing member such as a wire or wire-type frame to provide rigidity to one or more portions of the ECs 1836-x. It is further envisioned that the coupler 1879 may be partially, or fully, rigid to provide for functionality thereof. The ECs 1836-x may further include one or more folds to aid in the folding of the corresponding EC 1836-x when vacuumed. In some embodiments, the ECs may be formed from an electro-active polymer whose shape and/or size may be controlled by a controller of the system.

One or more force sensors 1871 (e.g., capacitive force sensors) may be provided one on or more surfaces of the AE 1834 or ECs of the system and may provide force information which may be employed by a controller of the system to determine elasticity of an AOC being scanned. For example, as the AE expands, a controller of the system may determine elasticity in accordance with (a pneumatic) pressure within the AE or portions thereof and the force information to determine elasticity of the AOC being scanned.

Figure 18B:
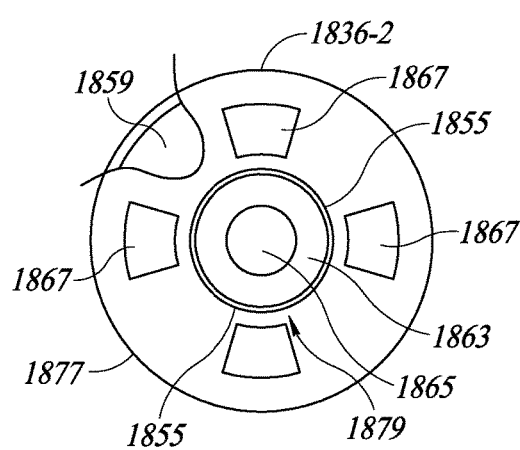
FIG. 18B is a rear view of a portion of the EC in accordance with embodiments of the present invention.
Figure 18C:
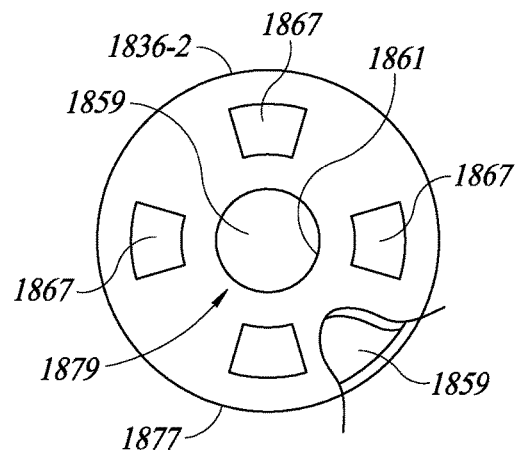
FIG. 18C is a front view of a portion of the EC in accordance with embodiments of the present invention.

A rear view of a portion of the EC 1836-2 in accordance with embodiments of the present invention is shown in FIG. 18B. The cylindrical opening 1861 may define a flow channel leading to the cavity 1859 so as to provide passage of a fluid such as the OPF to/from the cavity 1859. A front view of a portion of the EC 1836-2 in accordance with embodiments of the present invention is shown in FIG. 18C. The cavity 1859 may be coupled the piston 1863 via the flow channel 1865.

Figure 19:
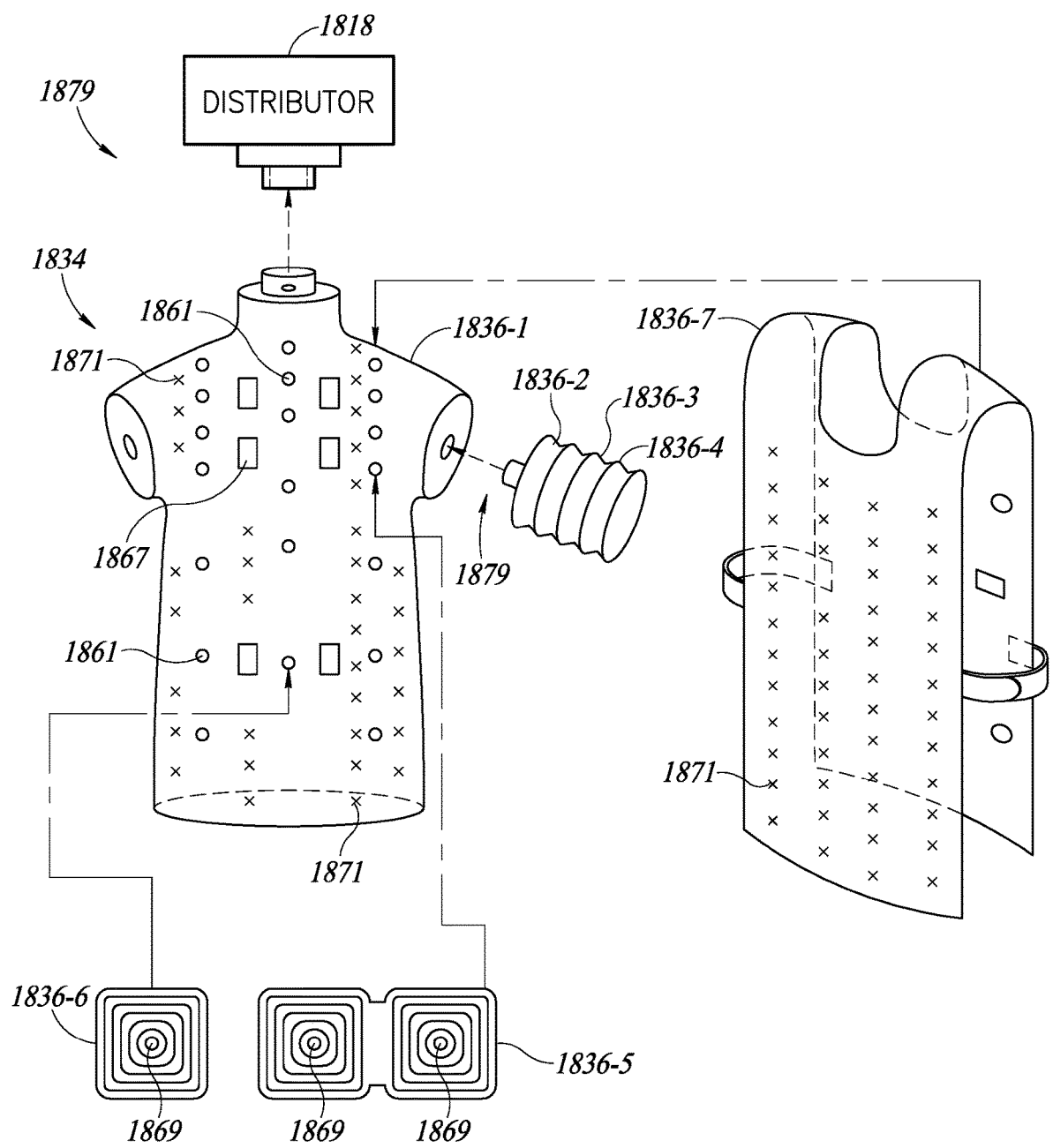
FIG. 19 is an exploded partially-cutaway perspective view of a portion of the AE coupled to optional ECs coupled together in accordance with embodiments of the present invention.

It is envisioned that ECs such as the ECs 1836-x may include various shapes to fit various types, styles, shapes, and/or sizes of clothing. For example, an exploded partially-cutaway perspective view of a portion of the AE 1834 coupled to optional ECs 1836-5 through 1836-7 coupled together in accordance with embodiments of the present invention is shown in FIG. 19. The Optional ECs 1836-5, 1836-6, and 1836-7 (each of which is shown flattened and may have one or more folds) may be coupled to one or more of the ECs 1836-x such as the EC 1836-1 and may be shaped and/or sized to fit various types and/or sizes of clothing. For example, EC 1836-5 may be shaped and sized to fit large-chest-sized clothing. EC 1836-6 may be shaped and sized to fit portly or stout sized clothing. Similarly, EC 1836-7 may be vest-shaped and may be shaped and sized to be draped over the EC 1836-1 to increase a volume.

In some embodiments, it is envisioned that the EC 1836-1 may be rigid or semi-rigid. It is envisioned that one or more of the ECs 1836-*x* may include at least a portion of a coupler 1879 for coupling to another of the ECs 1836-*x* such as the EC 1836-1. In some embodiments, the ECs 1836-*x* may include only a single coupler (e.g., one of 1863 or 1861) of a coupling pair.

It is further envisioned that the coupler 1879 may be configured to couple the AE 1834 to a distributor 1818 via the EC 1836-1 as may be desired. It is envisioned that the distributor 1879 may be configured to provide for the rotation of the AE 1834 about one or more axes as may be desired.

Figure 20A:
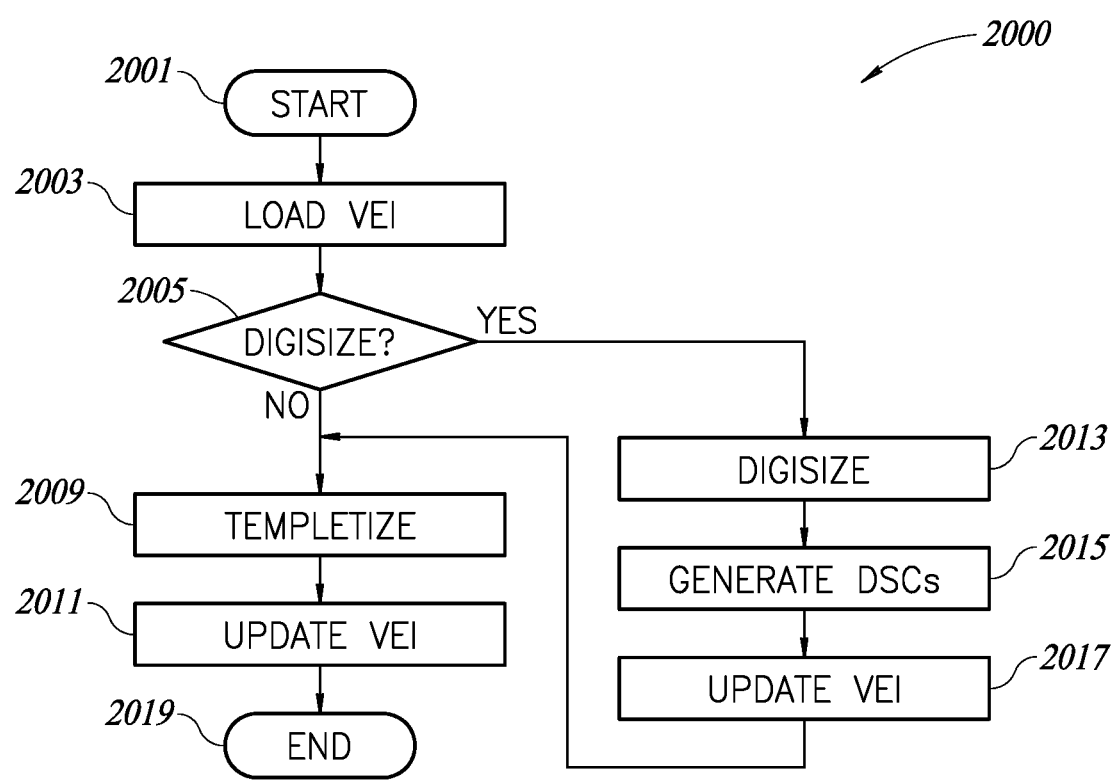
FIG. 20A is flowchart which shows a portion of an apparel measurement process to generate DSCI performed by a vendor in accordance with embodiments of the present invention.
Figure 20B:
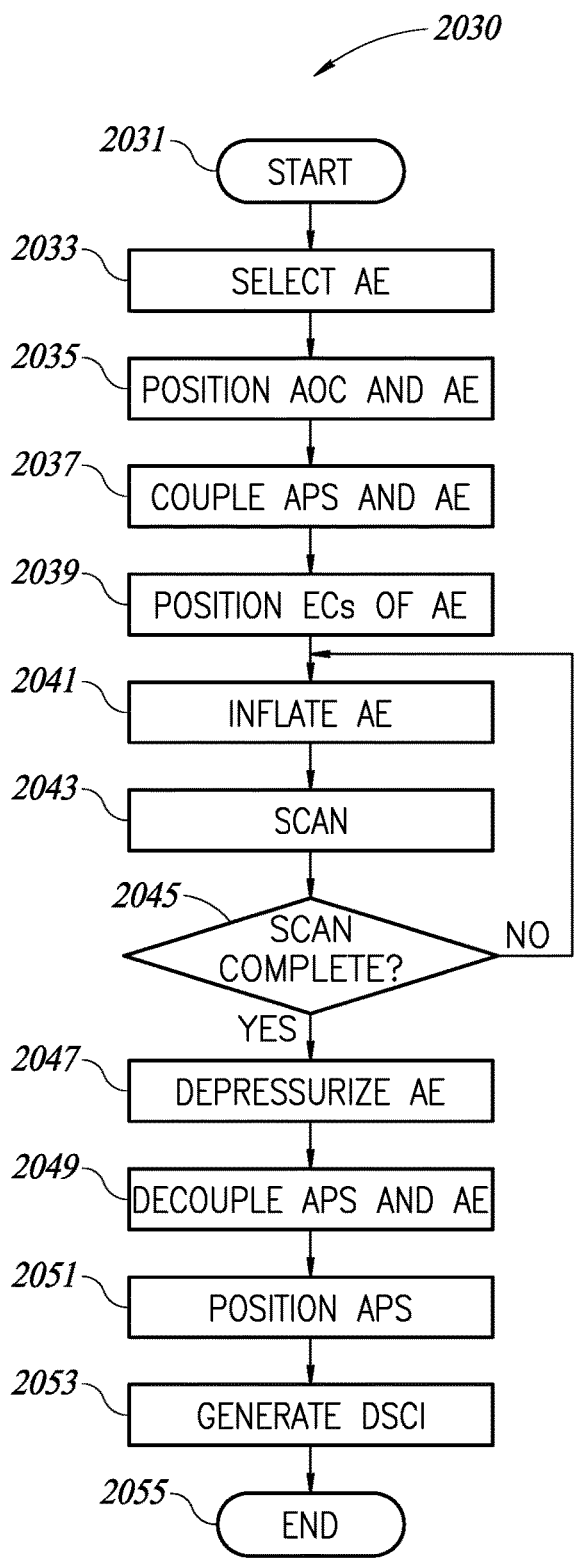
FIG. 20B is flowchart which shows a portion of an apparel measurement process to generate DSCI in accordance with embodiments of the present invention.
Figure 21:
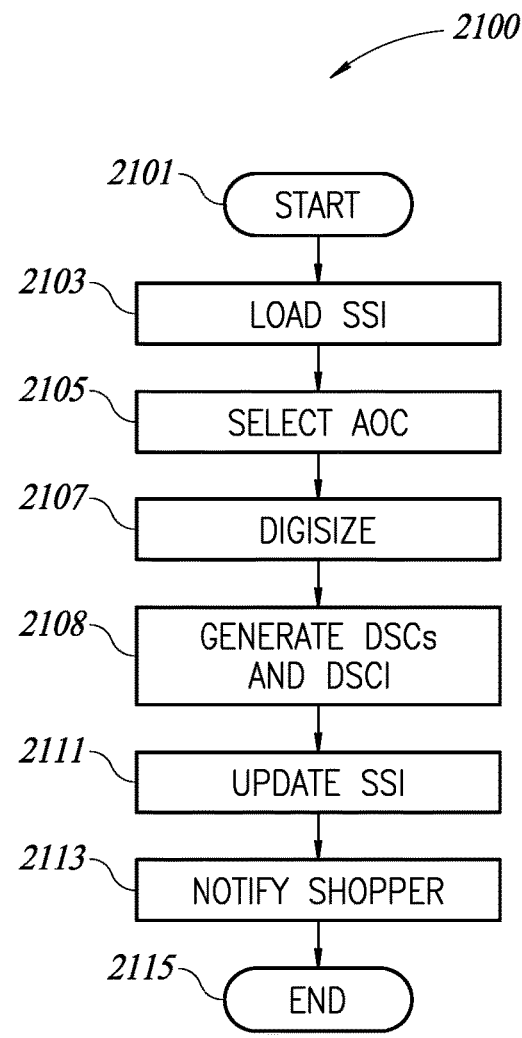
FIG. 21 is flowchart which shows a portion of an apparel fitting process performed by a system for shoppers operating in accordance with embodiments of the present invention.
Figure 24:
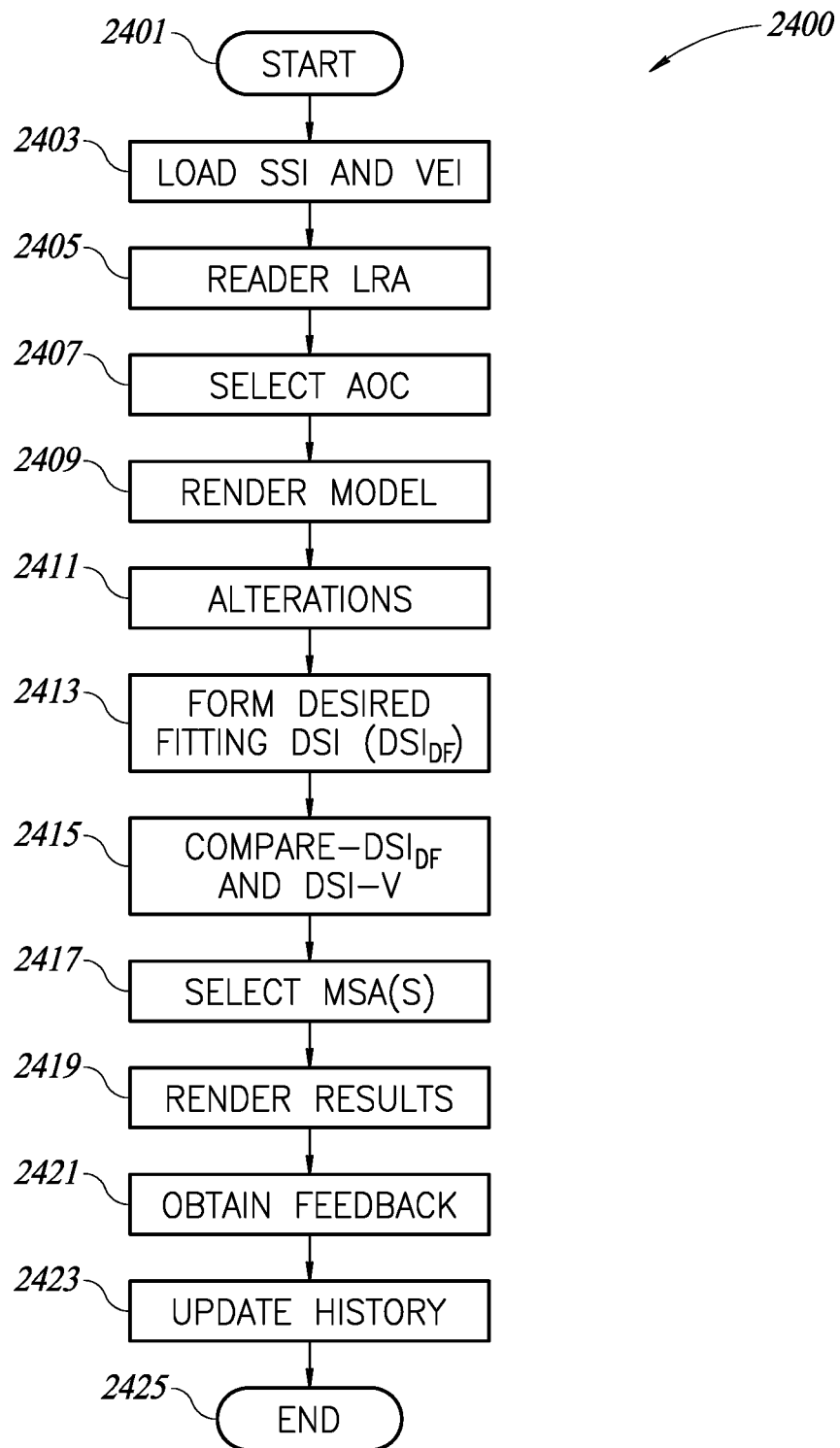
FIG. 24 is flowchart which shows a portion of an apparel fitting process performed by a system in accordance with embodiments of the present invention.

Methods of performing an apparel measurement process, such as an automated digiforming operation, in accordance with embodiments of the present invention will now be discussed with reference to at least FIGS. 20A, 20B, 21, and 24, wherein FIG. 20A is flowchart 2000 which shows a portion of an apparel measurement process to generate DSCI performed by a vendor in accordance with embodiments of the present invention; FIG. 20B is flowchart 2030 which shows a portion of an apparel measurement process to generate DSCI in accordance with embodiments of the present invention; FIG. 21 is flowchart 2100 which shows a portion of an apparel fitting process performed by the system for shoppers operating in accordance with embodiments of the present invention; and FIG. 24 is flowchart 2400 which shows a portion of an apparel fitting process performed by the system in accordance with embodiments of the present invention. Processes 2000, 2030, 2100, and 2400 may be performed using one or more logic devices (e.g., controllers, processors, micro-processors, shift registers, gates, circuits, etc.) communicating over any suitable medium (e.g., a network as the network 22 of FIG. 1) to obtain information from, and/or store information to, one or more memories which may be local and/or remote from each other. It is further envisioned that each process may be controlled by a controller of the system, such as the controller 2, and may be operative to communicate with one or more actuators, motors, networks, memories, and/or sensors of the system. For example, each process may control one or more portions of the system such as actuators, motors, solenoids, pumps, sensors, robotic manipulators, etc. to perform desired actions to complete steps or acts (hereinafter both of which may be referred to as step(s) for the sake of clarity) of the process and/or to perform a digiforming operation in accordance with embodiments of the present invention. It is envisioned that each process may further receive feedback information from the one or more sensors of the system, such as the sensors 20, or other sensors, and act in accordance with the sensor information and/or other information to perform steps in accordance with the process. It is envisioned that each process may control one or more robotic manipulation portions to perform acts of the process and/or may receive sensor information from the one or more robotic manipulation portions which may be used to determine positions of the robotic manipulation portions. Thus, each process may interact with, and may control, one or more actuators of the robotic manipulation portions. It is envisioned that each process may include one or more of the steps discussed below and may differ from the order in which they are described as may be desired with appropriate discretion. One or more of the following steps may be combined, separated into one or more sub-steps as may be desired, and/or may be skipped depending upon system and/or user settings. During the processes 2000, 2030, 2100, and/or 2400, information generated and/or obtained by the corresponding process may be encrypted and/or stored for a desired duration (e.g., for a desired period of time) or longer as may be desired in a memory of the system.

With reference to the process 2000 of FIG. 20A, the process 2000 may start during step 2001 and then proceed to step 2003.

During step 2003, the process may load VEI for the current vendor from a memory of the system. Accordingly, the system may obtain an identification of the vendor (vendor ID) (or an account registered to the vendor) and may obtain corresponding VEI (and/or account information, account profile, vendor profile, etc.) which may include DSCIs from a memory of the system. It is envisioned that the process may generate and render a GUI with which the vendor may interact to enter its Vendor ID such that the vendor's VEI may be obtained from a memory of the system. In yet other embodiments, however, the vendor ID may be obtained from system settings, etc. which may set forth, for example, a default vendor ID (e.g., Macys™, The Gap™, etc.). In some embodiments, VEI may be loaded for a plurality of vendors as may be desired. For example, a retail store may carry AOCs from a plurality of manufactures each of which may have their own VEI. Accordingly, the system may obtain VEI for each of these manufactures and may combine this VEI into VEI for the current vendor. After completing step 2003, the process may continue to step 2005.

During step 2005, the process may determine whether there is any need to digiform an AOC using sensors or any digiform stored previously can be used/adopted based on certain matching criteria. (e.g., the vendor does not have to digiform each and every AOC in the inventory). Rather, the vendor may digiform one or two for each style and size or AOCs and then reusing DigiSizes may be sufficiently accurate. Accordingly, if is determined to digiform an AOC using sensors, the process may continue to step 2013. If it is not determined, however, to digiform an AOC using sensors but reused/adapt existing DigiSize, the process may continue to step 2009. The process may determine whether to digiform an AOC in accordance with a selection of the vendor. Accordingly, the process may generate and/or render a GUI with which the vendor may interact to select an AOC to digiform(e.g., scan an AOC to generate DSI for the apparel in accordance with embodiments of the present system). For example, the GUI may include selections items which the vendor may select to perform one or more tasks in accordance with embodiments of the present invention such as to select to digiform and/or Templatize one or more AOCs. The process may act in accordance with the selection of the vendor. In yet other embodiments, the process may proceed in accordance with system settings as may be set by the system and/or vendor. In some embodiments, and dependent upon system settings as may be set by the vendor and/or system, the process may determine to digiform automatically when, for example, it is determined that there is no DSI for a corresponding AOC. Accordingly, the process may identify an AOC and may then search DSCI to determine whether DSI for the AOC exists in a memory of the system and/or a third-party.

During step 2009, the process may templatize the selected at least one AOC. After completing step 2009, the process may continue to step 2011. (Note that 2009 is optional, Templatized digiform is parameterized digiform. It is only used to generate desired fitting by the shopper that can be searched matched easily with user inventory, explained later in this document. Once the user fills in values for parameterized digiform, it becomes a regular fully specified digiform. Each AOC in vendor inventory, however, is associated with one digiform that is not templatized.

During step 2011, the process may update the VEI in accordance with information generated, changed, and/or updated by the process. This information may include any new or updated DSI, MI, and/or corresponding DSCI and may be stored in the VEI for the vendor. After completing step 2011, the process may continue to step 2019 where it may end.

During step 2013, the process may perform a digiforming operation on at least one selected AOC in accordance with embodiments of the present invention. Accordingly, the process may identify the selected AOC and perform a digiforming operation to scan this AOC to generate corresponding DSI for this AOC. In some embodiments, the process may generate an ID tag (e.g., including an identification) of the AOC as may be requested by the vendor and/or system. Independently, part or all of the vendors apparel inventory may be digiformed to generate DSI which may be combined with MI to form DSCI for each digiformed AOC. After completing step 2013, the process may continue to step 2015.

During step 2015, the process may update the VEI for the vendor in accordance with changes and/or updates to the DSCI during step 2013 above. The process may repeat acts 2013 through 2015 for each selected AOC of its apparel inventory, if desired, in accordance system and/or vendor settings. After completing step 2015, the process may repeat step 2007.

Thus, in accordance with embodiments of the present invention, a vendor may digiform all or part (e.g., selected AOC only) of its apparel inventory and form corresponding DSCI which may be stored VEI of the vendor. In accordance with embodiments of the present invention, a vendor may obtain DSCI for one or more AOCs from other vendors, such as manufactures, retailers, third-parties, etc., from VEI which may be stored in, for example, a server of the system and may be available to more than one vendor subject to access rights. It is also envisioned, however, that a vendor may digiform their own apparel inventory, or portions thereof, and generate corresponding DSCI (for corresponding AOCs) which may be stored in the VEI of the vendor. Access rights for vendors may be stored in association with the VEI for the vendor. For example, the MI included in the VEI of the vendor may include access rights which may set forth which vendors may have access to the VEI.

Thus, a vendor may independently digiform AOCs to obtain DSCI for one or more AOCs and/or may rely upon other vendors to provide DSCI for one or more AOCs thus obviating the need to digiform AOCs when DSCI for the one or more AOCs is/are available through the VEI of another vendor. This may save time and cost. In some embodiments, if information is unavailable such as certain information for MI and/or DSI, the system may interpolate and/or insert blank field(s) or other suitable information as may be set by system and/or user settings.

It is envisioned that to reduce time and/or cost of digiforming apparel (such as large inventories of apparel and the like), embodiments of the present invention may employ one or more methods to reduce time and/or cost of digiforming apparel. For example, it is envisioned that instead of digiforming each AOC individually, a vendor may sample selected AOC from the same size, style, and/or brand and form corresponding DSCI. This may reduce the number of samples required to cover the vendor's inventory. Accordingly, embodiments of the present invention may provide for a vendor to select a subgroup of apparel for digiforming from a group or subgroup of apparel of the vendor. The system may then associate DSCs for the group of apparel from the subgroup and update the VEI accordingly. It is also envisioned that the system may include information indicative of whether the DSCI of an AOC was obtained from the DSCI of another AOC and may render this information for the convenience of the vendor. This information may be stored in the MI. Accordingly, a vendor may digiform select AOC from a group of apparel as may be desired.

It is further envisioned that embodiments of the present invention may provide for the adjustment of sensitivity and/or resolution so that a vendor may obtain coarse DSI in less time and/or cost as compared to a more detailed DSI with elasticity and/or fine-grained measurements. Accordingly, the system and/or vendor may select information to include in the DSCI of an AOC. For example, a vendor, such as a manufacturer, may provide a vendor specification such as a single digit DSI (single size) (e.g., 0, 1, 2, 3, . . . 9) which may be considered as a very coarse, low-resolution, and low-cost DSCI. Accordingly, it is envisioned that embodiments of the present invention may provide an interface such as a GUI with which a user such as a vendor and/or shopper may act to adjust one or more cost variables such as coarseness, sensitivity, resolution, time (e.g., scan time, etc.), actual cost (e.g., in cents per apparel for digiforming), etc. When any of these values is adjusted, the system may employ a cost algorithm to calculate changes to the other of these values and adjust them accordingly. Thereafter, the system may render the generated cost information on the GUI for the convenience of the vendor and store such information for later use (e.g., such as for cost analysis, etc.) in a memory of the system for later use. Accordingly, a user (e.g., vendor or shopper) may determine one or more settings for sensitivity, resolution, and/or cost for digiforming one or more AOCs, and store these settings in a memory of the system for later use such as in association with VEI for the vendor or SSI for the shopper. With regard to one or more of the cost values such as coarseness, when coarse DSCI is used to define a 3D model, the system may employ interpolation algorithms on the DSCI to, for example, construct a more detailed 3D model. For example, a coarse 3D model may have fewer vertices and lines than a fine 3D model. Elasticity information may be associated with one or more of the lines and may be rendered using any suitable method such as colors (e.g., linearly or discretely). The 3D models may be represented as a mesh or as a solid surface or the like. In some embodiments, the system may form and may render the 3D model as an actual apparel (e.g., an AOC such as a shirt having collars, etc.) in accordance with a type of apparel.

In some embodiments, it is envisioned that the system may provide an option for manual and/or automatic selection of apparel to digiform from a group or subgroup of apparel of a vendor such as a retailer. For example, when a shopper (e.g., in physical store or online) is detected to show interest in a select AOC from this group of apparel (as may be detected using any suitable method or methods) such as by trying on the select AOC or viewing the AOC online, scanning an ID tag of the AOC, etc., the system may detect this and generate a digiforming request to digiform this AOC (or a like AOC that may be expected to have the same or substantially similar DSI) that the shopper is viewing. This digiforming request may be processed by the system and a corresponding AOC (or a substantially similar AOC such as an AOC of with the same or similar ID or DSI) may be automatically digiformed by the system to generate or update DSCI for this AOC. In some embodiments, it is envisioned that the system may generate a message indicating that an AOC that the shopper has tried on or has shown interest in has been digiformed and that this digiform information is available for the shopper for viewing and/or virtual fitting and/or alteration, as may be desired. This message may be forwarded to a registered contact address of the shopper such as an APP of the shopper, a social networking account or address of the shopper, an email of the shopper, etc. as may set by the shopper and may be stored in a memory of the system in association with the SSI of the shopper.

Accordingly, a vendor may defer performing digiforming operations or may perform low-cost DSI (e.g., very coarse DSI) for an AOC which may control cost. Then, in response to detected actions of a shopper, such as viewing or showing interest in an AOC, the system may generate a request for digiforming the AOC and/or may digiform the AOC to obtain a higher-cost DSI. For example, an online vendor such as an online retailer may, when a shopper initially views an AOC, only have low-cost DSI available for this AOC which DSI may include, for example, single digit size information (e.g., 0, 1, 2, . . . as discussed above). In response to detecting the shopper's interest in the AOC, the system may generate higher-cost and more detailed DSI for the AOC and may provide an option for the shopper to view this information and perform a virtual fitting and/or comparison with one or more other AOC based upon a comparison of DSCI for the corresponding AOC.

Once the digiform information, such as DSCI, is available for an AOC, a vendor and/or the system may, in response, templatize this DSCI as desired to form templatized DSCI (DSCI-T) which may be stored by the system in the DSCI. For example, the system may generate and render a user interface with which the vendor may modify and/or create DSCI-T in which different DSCI-T may capture different styles of an AOC but not the variation in dimensions. Such DSCI-T may be presented to the shopper where a shopper as may be discussed below. For example, A woman's top may be parameterized by (i.e. templatized by) two key parameters: Shoulder length and bust. DSCI-T can adjust all other dimensions once these two parameters are included. Thus, DSCI-T allows vendor to scale the whole digiform3D model for a desired key measurement from the user, instead of keeping separate DSCI for all possible combination of those parameters.

It is further envisioned that the system may associate information with a vendor-issued ID tag which may be unique to an AOC and other AOC with the same or substantially similar DSCI and store this information in a memory of the system such as in a database of the system (e.g., a vendor's database) in any suitable format such as in the VEI of the vendor. With regard to ID tags, any suitable ID tags, such as automatic indemnification and data capture (AIDC) compatible tags or the like may be employed. For the sake of clarity, it will be assumed that the ID tags referred to herein are AIDC tags unless the context indicates otherwise. In response to reading the ID tag, the system may update the DSCI and/or VEI in accordance with any changes to the DSI and/or MI of the AOC which is associated with the ID tag. The vendor's database may be accessible to the vendor and/or may include a central database accessible by a plurality of vendors and/or shoppers subject to access restrictions in accordance with system and/or vendor settings.

It is envisioned that information associated with the ID tag may be stored in a memory of the system such as in a local memory of the ID tag itself, and/or on a server of the system such as an Internet server for later use by the vendor, other, vendors and/or shoppers depending upon system settings and/or access restrictions as may be set by the system and/or vendor. Thus, it is envisioned that the ID tag may include a memory and may be queried by, for example, any suitable reading device such as an interrogator or the like.

With reference to the process 2030 of FIG. 20B, the process 2030 may start during step 2031 and then proceed to step 2033. With reference to the process 2030 of FIG. 20B, the process 2030 may start during step 2031 and then proceed to step 2033.

During step 2033, the process may optionally select an AE including one or more ECs for inflating a current AOC. The process may select an AE of the same apparel type (e.g., shirt, slacks, etc.) as the current AOC. Thus, in accordance with embodiments of the present system, the process may determine an apparel type of the AOC and thereafter, select an AE of the same type. After completing step 2033, the process may continue to step 2035.

During step 2035, the process may position an APS including the current AOC, which may be coupled thereto, in a desired position relative to the selected AE. Depending upon system configuration, the system may control one or more actuators, motors, solenoids, robotic manipulators, and/or the like, to position the selected AE in the desired position such as in a desired position that may be within a scanning chamber. In some embodiments, the process may control one or more actuators, robotic manipulators, and/or the like to position or otherwise direct the APS, which may be coupled to the current AOC, to the selected AE. For example, the process may control one or more actuators, motors, robotic manipulation portions, etc., to position the APS (which may be assumed to be on rails as illustrated in FIG. 3-5) relative to the AE for performing a scan. In yet other embodiments, it is envisioned that the process may render a request to position the selected AE in a desired location and await response from, for example, a user of the system. After completing step 2035, the process may continue to step 2037.

During step 2037, the process may couple the APS to the AE in position for performing a scan. For example, the process may control one or more actuators, motors, solenoids, and/or electromagnetic couplers and/or the like to couple the APS relative to the AE so as to reduce or entirely prevent undesirable motion of during inflation of the AE during a scan when the AE may be inflated. After completing step 2037, the process may continue to step 2039.

During step 2039, the process may position one or more ECs of the AE in a desired position relative to the AOC for inflation. For example, in some embodiments the process may control one more actuators, motors, solenoids, robotic manipulators, and/or the like, to position one or more portions of the EC to a desired position or positions relative to the AOC. These desired positions may be stored in a memory of the system. For example, the process may control one or more actuators, such as telescopic actuators, to telescopically move (as illustrated in FIG. 16B) to position one or more portions of the AE such as one or more ECs of the AE in position relative to the AOC. After completing step 2039, the process may continue to step 2041.

During step 2041, the process may be operative to inflate the AE to expand within at least one inner cavity of the AOC. Accordingly, the process may be operative to control one or more actuators, solenoids, pumps, valves, etc. to provide an OPF, such as air, to one or more ECs of the AE in accordance with system and/or user settings. For example, in some embodiments, the process may control a fluid distribution unit to inflate one or more ECs of the AE in accordance with embodiments of the present invention. Accordingly, the process may be operative to inflate one or more ECs of the AE prior to others. In yet other embodiments, this may occur passively or automatically. In accordance with some embodiments, the inflation may occur at a desired flow or pressure rates over time. In some embodiments, the process may inflate and/or deflate one or more ECs repeatedly so as to seat the ECs within the at least one inner cavity of the AOC. After completing step 2041, the process may continue to step 2043.

During step 2043, the process may scan the AOC to obtain sensor information from one or more sensors of the system which may sensor information may include information related to at least outer shape, form, and/or contour of the AE as it is expanded within the AOC and may obtain related tension information. Accordingly, the process may be operative to control one or more sensors of the system to detect pressure within the AE and/or contours (e.g., outer and/or inner) of the AE when it is within the cavity of the at least one AOC and form corresponding sensor information. The process may also be operative to obtain optical sensor information that may be used to visually detect contours of the AOC and/or AE such as a grid of the AE. For example, during the scan one or more of the sensors may further capture measurements at various pressure levels (e.g., within the AE or portions thereof) and inflation levels and capture elasticity information related to the AOC being scanned. After completing step 2043, the process may continue to step 2045.

During step 2045, the process may determine whether the scanning of step 2043 is complete. Accordingly, when it is determined that scanning is complete, the process may continue to step 2047. If it is determined, however, that scanning of step is not complete, the process may repeat step 2041. In accordance with some embodiments, the process may determine that scanning is complete when the pressure of the OPF reaches a threshold value (e.g., a pressure threshold value (PTV)). Accordingly, if it is determined that the pressure of the OPF is greater than, or equal to, this threshold value, the process may determine that scanning is complete. If it is determined that the pressure of the OPF is less than this threshold value, the process may determine that scanning is not complete. The pressure of the OPF may be detected by one or more sensors of the system. In some embodiments, the PTV may be set in accordance with an apparel type of the current AOC being scanned. For example, skirts may have a different PTV than pants, etc. The PTV may be set in accordance with system and/or user settings and may be stored in a memory of the system for later use.

In yet other embodiments, the process may determine that scanning is complete when sufficient sensor information is obtained to reconstruct a 3D image of the scanned apparel as may be determined by the system and/or user (e.g., in accordance with cost settings, etc.). In yet other embodiments, the scan may be performed within a certain range of pressures within the AE (e.g., 5-7 psi, etc.). These settings may be set by the system and/or user and may be stored in a memory of the system for later use. In some embodiments, a learning engine (e.g., using artificial intelligence, machine learning, etc.) may be employed to determine a desired pressure range of the OPF for scanning each type of apparel and/or materials (e.g., elasticity) based upon past scans of AOCs of the same or similar type. In some embodiments, the scan may be performed when a pressure of the OPF is determined to be above a first threshold value and/or below a second threshold value for the current AOC as may be determined by the system.

During step 2047, the process may be operative to depressurize the AE. Accordingly, the process may be operative to control one or more actuators, solenoids, pumps, valves, etc. to release the OPF within the AE to atmosphere and/or may vacuum the AE so as to fold and/or reduce the size of the AE in accordance with system and/or user settings. In some embodiments, the process may be operative to position one or more ECs of the AE in a desired position relative to the AOC for withdrawal of the AE from the AOC. For example, in some embodiments the process may control one more actuators, motors, solenoids, robotic manipulators, and/or the like to position one or more portions of the EC to a desired position or positions relative to other portions of the system such as the distributor, etc., such that the AOC may be separated therefrom. After completing step 2047, the system may continue to step 2049.

During step 2049, the process may decouple the APS from the AE such that the APS may be free to be moved relative to the AE and/or the scanning chamber. Actions performed during this step may be opposite of step 2037 and, for example, the process may be operative to control one or more actuators, motors, solenoids, and/or electromagnetic couplers, and/or the like, to decouple the APS from the AE so as to provide for the for the removal of the APS from the AE and/or scanning chamber. After completing step 2049, the process may continue to step 2051.

During step 2051, the process may be operative to position the APS including the current AOC which may be coupled thereto, in an after-scan area (e.g., area III) for release of the AOC from the APS. Depending upon system configuration, the process may control one or more actuators, robotic manipulators, and/or the like to guide the APS from the scanning chamber and/or to position or otherwise direct the APS, which may be coupled to the current AOC, to the after-scan area (e.g., area III). Release of the AOC from the APS may be performed automatically or manually by a user. After completing step 2051, the process may continue to step 2053.

During act 2053, the process may generate DSCI for the AOC and/or store the generated DSCI in a memory of the system for later use. The process may further update any history information and store this information in a memory of the system for later use and/or may render information on a rendering device of the system indicative of a current status (e.g., scan complete, etc.) for the convenience of a current user such as a vendor or a shopper. The process may further update VEI and/or SSI (depending upon a current user) in accordance with the updated DSCI for the current apparel(s). After completing act 2053, the process may continue to act 2055 where it may end.

With reference to the process 2100 of FIG. 21, this process may start during step 2101 and then proceed to step 2103. This process may be performed when a shopper selects an AOC to digiform as may occur in, for example, a retail store or the like.

During step 2103, the process may perform an initialization for the current shopper (e.g., the current user). For example, the process may load SSI of the shopper if available. The SSI may include information related to the shopper such as profile information. The process may also generate and/or render instructions on use of the process for the convenience of the shopper. In some embodiments, a default initialization may be performed using a default account depending upon system and/or shopper settings.

Accordingly, the process may obtain an identification (ID) of the shopper (or an account or other recognizable feature of account of the shopper such as contact information, etc.) and may obtain corresponding SSI which may include DSCI and profile information for the shopper from a memory of the system. It is envisioned that the process may generate and render a GUI with which the shopper may interact to enter an identification of the shopper. The GUI may be generated by an APP running on a US of the shopper and which may be rendered on a touchscreen of the US. For the sake of clarity, it should be understood that an ID of the shopper may refer to any suitable form of ID of the shopper such as a mobile ID, an account name or number, email address, telephone number, etc.

In yet other embodiments, however, the ID of the shopper may be obtained from system settings, etc. which may set forth, for example, a default shopper. After completing step 2103, the process may continue to step 2105.

Figure 22:
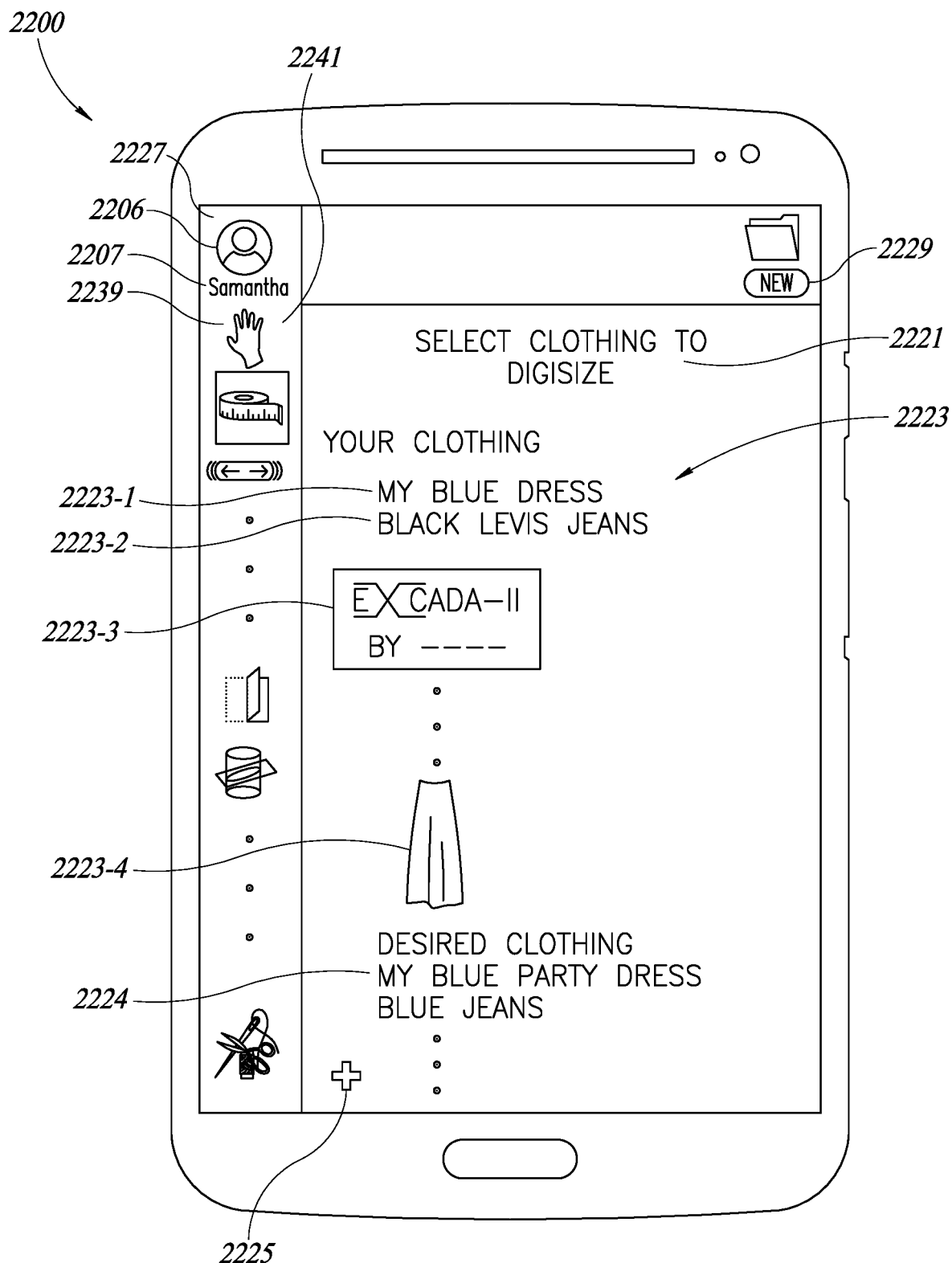
FIG. 22 shows a screenshot of a portion of a selection screen generated and rendered by the process configured to select an AOC to be digiformed in accordance with embodiments of the present invention.

During step 2105, at least one AOC may be selected by the shopper. Accordingly, the process may generate and render an interface with which the shopper may interact to select the at least one AOC to be digiformed by the system. For example, the process may obtain a list registered apparel (LRA) that may include one or more AOCs that are associated with the shopper and stored in the SSI of the shopper. Each AOC on this list of AOCs may have a corresponding a shopper-provided unique identifier (SUID) assigned thereto. For example, FIG. 22 shows a screenshot of a portion of a selection screen 2200 generated and rendered by the process (e.g., such as may be run by an APP operating in accordance with embodiments of the present invention) configured to select an AOC to be digiformed in accordance with embodiments of the present invention. The process may render information in the selection screen 2200 (e.g., as may be rendered on a display of a US of the shopper) such as an account information area 2217 which may include a user account selection item 2206 and an account identifier 2207. The user account selection item 2206 may render an image associated with a logged-in user (e.g., the logged-in shopper) such as "Samantha," that is logged in to the user's account and whose login name may be displayed as shown by the account identifier selection item 2207. In response to selection of the user account selection item 2206, the system may render information associated with the account and/or may provide a selection item to log off and/or change and/or add accounts. For the sake of clarity, it will be assumed that all accounts may be considered registered accounts.

Instructions to select an AOC to be scanned (e.g., digiformed) in accordance with embodiments of the present invention may be rendered audibly or graphically such as illustrated by instructions 2221. An LRA 2223 may include a list of clothing (e.g., a list of AOC) each represented by a corresponding selection item 2223-1 through 2223-4 (generally 2223-x) each of which may have a corresponding SUID such as "My Blue Dress;" "Black Levis Jeans;" a photo of the AOC label/description of the AOC; and a photo of the user wearing the AOC, respectively, and desired AOC 2224 which may include corresponding selection items 2223-5 through 2223-6 each of which may have a corresponding SUID and may be considered to be a virtually-altered apparel (VAAs) that the shopper desires.

A selection item 2225 (e.g., plus sign) may be selected to add another AOC and a corresponding SUID. The LRA 2223 may be populated by the shopper automatically (e.g., when scanning an ID tag of an apparel, etc.) or manually. For example, a shopper may record a video of, for example, the shopper wearing an AOC. This AOC may then be added to the LRA and this video including audio may be associated with the AOC. Then, in response to selection of a selection item (e.g., 2223-x) associated with the AOC, the video may be played. The shopper may then record information that may remind the shopper of the AOC. The system may provide for scrolling of the LRA. Further, system may list clothing on the LRA in accordance with type of apparel (pants, shorts, shirt, etc.) on the LRA. Moreover, two or more AOC of different apparel type may be linked such as a pair of slacks which may have a corresponding jacket and may form a combination or pair (e.g., a paired type). In some embodiments, AOC may be listed by type (e.g., pants, sweaters, jackets, shirts, etc.).

In response to selection of any of the selection items 2223-x corresponding to the SUIDs, the process may obtain, and/or render further information related to the corresponding SUID. For example, in response to selection (by the user) of the selection item 2223-1, the process may render further information related to My Blue Dress such as manufacture, stock number, ID tag identification no. (for a shopper to identify), DSI as a 3D image, etc. The shopper may select an AOC from their existing clothing list (e.g., clothing which the shopper owns or is in possession of). The SUID may include any information that may be helpful for a shopper to identify different clothing on the LRA and which may be submitted for digiforming and/or for virtual alterations in accordance with embodiments of the present invention. For example, the SUID may include text, graphics, content (e.g., audio, video, still images, etc.), and/or other information that the shopper may use to identify an AOC of one or more AOCs which may be associated with the profile of the shopper and may be stored in the SSI of the shopper such as such as: (a) a shopper provided label (e.g., "My Blue Dress"); (b) a description of the apparel (e.g., "Black Levis Jeans"); (3) a photo of the apparel; (4) a photo of user label/description of the AOC, as may be discussed above.

The SUID may be associated with the MI and corresponding DSCI which may be stored in the SSI in a memory of the system for later use. SUIDs may be rendered for LRA of the shopper or portions thereof. For example, SUIDs may be rendered by date (e.g., fall 2050 styles, todays apparel, etc.), apparel type (e.g., shirts, pants, etc.). When an AOC is selected, the process may determine whether DSI for an AOC is available. If DSI for an AOC is not available (e.g., indicative of the AOC not being digiformed), the process may inform the shopper of such and render a selection item for the shopper to select to digiform the corresponding AOC. If, however, DSI is available for the corresponding AOC (e.g., which is indicative of the apparel being digiformed), the process may render a 3D model of the AOC in accordance with at least the DSI for the convenience of the shopper. This 3D model may be reconstructed from the DSCI and may include a desired format such as mesh (e.g., including vertices coupled by links) or a solid surface model where voxels may include a color and an opacity as may be defined by system and/or user settings.

It is also envisioned that the process may generate, provide, and/or associate an ID tag which may include a unique identifier to identify a selected AOC at a later time. The ID tag may be coupled to the selected AOC and/or to a hanger which may be employed during a digiforming operation performed in accordance with embodiments of the present invention. In some embodiments, the shopper may print out the ID tag. In yet other embodiments, the ID tag may be provided to the shopper. In yet other embodiments, the ID tag may be a virtual tag, this may be used when, for example, the shopper may perform a digiforming operation on the selected AOC as opposed to a digiforming center performing the digiforming operation. It is further envisioned that the ID tag may include visual reference to the SUID such that the shopper may easily identify the ID tag and corresponding AOC, if desired. For example, in some embodiments, an ID tag may be scanned and thereafter placed on a selected AOC for digiforming. In yet other embodiments, an ID tag may be pre-associated with an AOC for digiforming before it may be shipped to the shopper. Accordingly, the shopper may need to identify an AOC that the ID tag is to be associated with. In this regard, the ID tag may be scanned by the shopper (e.g., using a US of the shopper) to read the associated SUID such that the shopper may attach the ID tag to the corresponding AOC. In yet other embodiments, the SUID may be physically printed on the ID tag such that the shopper may readily identify the corresponding AOC.

The selection screen 2200 may further include one or more selection items which may be selected by the shopper to select various actions such as a plurality of software tools 2239 in a tools menu 2241 as may be discussed elsewhere in this application such as with reference to FIG. 26 as will be discussed below.

It is envisioned that selected (apparel) clothing such as a shopper's existing clothing, may be digiformed by the shopper using a digiform scanner (e.g., as may be available at a vendor's shop, etc.) or provided to a digiforming center(s) to be digiformed. It is envisioned that the digiforming center may, for example, be operated by a retailer or an independent vendor. Shoppers may send AOCs selected from the shopper's current collection via any suitable shipper to a digiforming center. For the sake of clarity, it will be assumed that the shopper considers these AOCs to be a good fit and would, therefore, like to find other clothing with a similar fit. In some embodiments, the process may send or otherwise provide shoppers with a prepaid postal package which may include separate plastic bags for each AOC and corresponding ID tags. It is envisioned that each bag may include a space for a label/description and the ID tag associated with the AOC. Referring back to the flowchart 2100, after completing step 2105, the process may continue to step 2107.

During step 2107, the process may perform a digiforming operation on the selected AOC in accordance with embodiments of the present invention.

With regard to identifying the AOC being scanned for DSI, the process may obtain an ID of the AOC using any suitable method such as from its ID tag in accordance with embodiments of the present system. For example, the process may scan the ID tag of AOC which it received to obtain further information about an associated AOC such as type of apparel, shopper profile information (e.g., obtained from SSI corresponding to the ID tag of the AOC), etc. In accordance with some embodiments, the process may select an AE in accordance with information from the ID tag. For example, if the ID tag identifies the AOC as a pair of pants, the process may select an AE for pants.

It is envisioned that the process may obtain the AOC for the digiforming operation using any suitable method in accordance with embodiments of the present invention. After completing step 2107, the process may continue to step 2109.

During step 2109, the process may generate DSCs and corresponding DSCI for the AOC that was scanned during the digiforming operation of step 2107. The process may repeat acts 2103 through 2109 for each AOC of a plurality of selected AOCs, if desired, in accordance system and/or shopper settings. After completing step 2109, the process may continue to step 2111.

During step 2111, the process may update the SSI in accordance with information generated, changed, and/or updated by the process. This information may include any new DSI, MI, and/or corresponding DSCI and may be stored in the SSI for the corresponding shopper.

After completing step 2111, the process may continue to step 2113 where it may notify the shopper of the availability of the new digiform information (e.g., DSCIs, etc.). For example, the system may render a new selection item (e.g., see 2229 in FIG. 22) to indicate that new digiform information (e.g., DSCIs) are available. In response to selection of the NEW selection item 2229, the system may render a visualization screen for viewing information related to the corresponding AOC such as a 3D model as may be discussed elsewhere in this application. In some embodiments, this notification may be transmitted to one or more selected contact addresses (e.g., email, SMS, social network accounts, etc.) that may be associated with the shopper's profile as may be stored in the SSI in a memory of the system such as a database of the system for later use. Thus, after digiforming the selected AOC, the shopper may be notified of this new information in accordance with system and/or user settings. Then, the shopper can log in to his/her profile on the mobile APP where digiforms of AOCs registered to the shopper (as listed in the LRA of the shopper) may be available for selection and viewing. A digiform for an AOC may be presented on the APP in a graphical easy-to-understand format such as in a 3D model. After completing step 2113, the process may continue to step 2115 where it may end.

In accordance with embodiments of the present invention, it should be appreciated that shoppers may access information about their account or profile over any suitable network such as the Internet either using a website and a specialized application for the computing platform (a.k.a. an APP) operating in accordance with embodiments of the present system. The information may be accessed on a device with a mouse and screen interface or a touchscreen interface (e.g., a personal computer, a tablet, a smart phone, etc.). For brevity and without loss of generality, the term APP may be used herein to reference a generic method of shopper access and shopper interaction (e.g., customer-access and customer interaction) unless the context indicates otherwise. Similarly, to avoid repetition, figures and description may be rendered by an APP on a touchscreen device as a means to access and interact with the shopper. Those capabilities, however, may be easily extended to other types of devices and interfaces (e.g. a personal computer with a mouse, an augmented-reality (AR) system, etc.) and should in no way limit the applicability of the presented technique to touchscreen APPs. Similarly, descriptions herein may assume that digiforming operations are performed by the vendors such as retailers. It should be appreciated, however, that techniques described herein may be equally applicable if digiforming operations are performed by vendors such as manufacturers or a third-party services specialized in digiforming operations. In such case, once the DSCI (or portions thereof such as DSI, MI, etc.) of one or more AOCs is available, it may be provided to other vendors such as retailers, etc. subject to access rights as may be defined by the system, vendor, and/or shopper.

In accordance with some embodiments of the present invention, it is envisioned that upon receiving selected AOCs from a shopper, a digiforming center may scan these AOCs to determine DSI for the corresponding AOCs, associate the DSI and the MI to form DSCI for each corresponding AOC and associate the DSCI with information related to the profile of the corresponding shopper that sent them and may store this information as SSI of the shopper in a memory of the system such as a database memory for later use. It is also envisioned that the DSCI may include a unique identifier such as an SUID may be associated with each corresponding AOC. If performed by a digiforming center, the AOCs may be returned to the customer via any suitable method such as shipping, pickup, etc., after they are digiformed.

Figure 23:
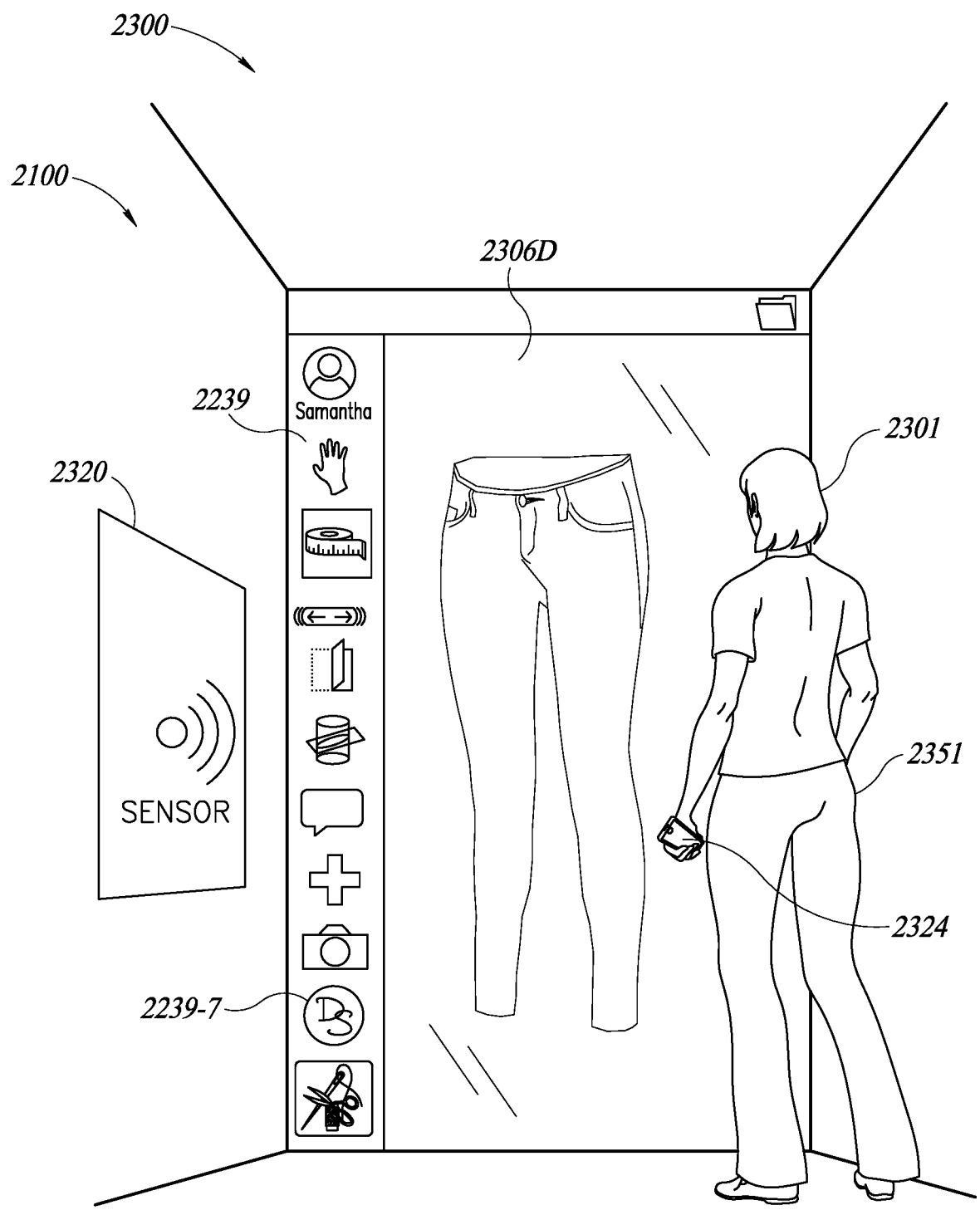
FIG. 23 shows a detailed perspective view of a fitting room system operating in accordance with embodiments of the present invention.

A detailed perspective view of a fitting room system 2300 operating in accordance with embodiments of the present invention is shown in FIG. 23. The system 2300 may include one or more of a controller which may be configured to control a sensor suite 2320 including a scanner such as an AIDC scanner, a display screen 2306D, a US 2324, a tag which is unique to an AOC 2351, and a memory. The system 2300 may include, or be interactive with, the US 2324 of a shopper 2301. For the sake of clarity, it may be assumed that renderings may be extended or duplicated on the displays 2306D and on a display of the US 2324 each of which may be a touchscreen display.

In use, the shopper 2301 may try on the AOC 2351 in any suitable location such as in a fitting room of the vendor (as shown), at home, etc. For the sake of clarity, it will be assumed that the AOC 2351 was tried on by the shopper 2301 and may be referred to as a tried AOC (TA) 2351. It will also be assumed that the system has identified the shopper 2301 and may access the SSI of the shopper to read, form, and/or modify an LRA of the shopper 2301. It may also be assumed that the process has accessed VEI for the corresponding vendor or vendors, as may be selected by the shopper (e.g., I would like to view clothing a Bloomingdales™), the vendor, and/or the system. For example, when shopping in X-Brand stores, then the system may select VEI for X-Brand stores. Similarly, when shopping in Y-Brand stores, then the system may select VEI for Y-Brand stores. When shopping from a home of the shopper, the system may select stores selected by the system and/or shopper (e.g., X-Brand and Y-Brand stores, Bloomingdales™, etc.) and obtain corresponding VEI for these stores.

It is envisioned that the AOC 2351 may include an ID tag (e.g., which is unique to the apparel as discussed elsewhere). The shopper 2301 may interact with the system 2300 to scan the ID tag using any suitable scanner of the system, such as a scanner in the sensor suite 2320 such as the AIDC scanner, which may interrogate or otherwise query the ID tag to obtain DSCI associated with the tag, and, thus, the AOC 2351 from a memory of the system. Once the DSCI is obtained, the process may obtain MI of the AOC 2351 and may render an option to add this AOC to the LRA of the shopper 2301. In response to the shopper 2301 selecting to add the AOC 2351 to the LRA, the system may add information related to the AOC 2351 such as the DSCI (in whole or part such as the MI depending upon system and/or user settings) to the LRA of the shopper and update the LRA of the shopper 2301 accordingly and store the LRA in a memory of the system.

It is further envisioned that the process may further prompt the shopper 2301 to enter a corresponding SUID (e.g., by taking a picture of the AOC, entering a description of the AOC, etc.), and/or the process may provide a default SUID (as may be determined by system settings and may include, for example, a time stamp corresponding to the scan time, information obtained from the MI, content, context information (CI), etc.). In yet other embodiments, the process may obtain a description of the AOC (e.g., Levis 505, blue jeans, . . . etc.) from DSCI of the AOC and set the SUID in accordance with this description. The SUID may include information as may be entered by the vendor and/or shopper. For example, the SUID may include other information that a user may wish to associate with the AOC such as fit, type of apparel, desired use (e.g., my desired sun dress, etc.), etc. For example, the SUID may include content and/or shopper instructions such as audio video content that may be recorded by the shopper such as "This pair of pants is tight around my thighs," "legs are too long," "my favorite fit," etc. In response to the recognizing that the shopper provided (e.g., entered using any suitable input device of the system such as an optical input, a keyboard, a gesture input, etc.) the system may associate this information (e.g., content information such as audio and/or video information) with the SUID and may store it in a memory of the system such as in the SSI in for later use. For example, the system may store the SUID in association with the DSCI for the AOC in the SSI of the shopper for later use such as for fitting an AOC for the shopper, vendor feedback, etc. The system may further update the VEI with some information such as the SUID in association with the DSCI for the AOC for the convenience of the vendor. Accordingly, a vendor may receive feedback from a shopper in real-time or substantially real time.

With regard to the plurality of software tools 2239, these tools may be selected by the shopper anytime to enter into one or more corresponding modes as may be discussed elsewhere in this application. For example, in response to selection of a digiform visualization tool selection item 2239-7 of the software tools 2239, the system may enter a digiform visualization mode (DVM) as may be discussed with reference to FIG. 26 below with the current TA 2351 as a selected AOC for viewing (SAV) as may be discussed elsewhere in this application. In some embodiments, one or more of the selection items in the software tools may be de-highlighted and inoperative when desired such as when DSI is insufficient, unavailable, etc. For example, when DSCI for any AOC is determined to be unavailable, the system may render the DVM mode inoperative and may de-highlight (e.g., grey out) a corresponding selection item until DSCI is available.

It is also envisioned that the process may perform VTT processing and/or other processing (determination of gestures, etc.) to determine a context of the shopper's interaction with the system and may interact in accordance with the determined context. For example, it is envisioned that the system may be configured to recognize motions of the shopper while trying on an AOC (or during a virtual fit) as gestures and may respond to these gestures accordingly. In this regard, and in accordance with system and/or user settings to assure privacy of the shopper, the system may monitor one or more sensors of the system such as cameras of the system to observe the shoppers interaction with the AOC (e.g., the TA) such as gestures made in association with the AOC as the shopper wears it. These gestures may be mapped by the system and/or user (e.g., vendor and/or shopper) may, for example, include, for example, a gesture such as the shopper rubbing a portion of the AOC back-and-forth in a selected location which may be recognized as a tightness. For example, if the shopper rubs the thighs of the AOC 2351 back and forth, the system may determine that the AOC 2351 is too tight at the determined location (e.g., the thighs). Thus, the system may be operative (e.g., using image and/or audio analysis methods) to analyze shopper actions (e.g., relative to the AOC) and determine a fit relative to that determined location. For example, a user may say the "thighs are too tight" and the system may analyze an audio input of a microphone sensor of the system to determine a location and an associated fit such the thighs and too tight, respectively, and update the SUID accordingly. The system may then be operative to store DSCI for the corresponding AOC with this updated SUID in the SSI of the shopper.

The flowchart of FIG. 24 will now be described with reference to FIGS. 25 through 31 each of which may be described in further detail below.

Figure 25:
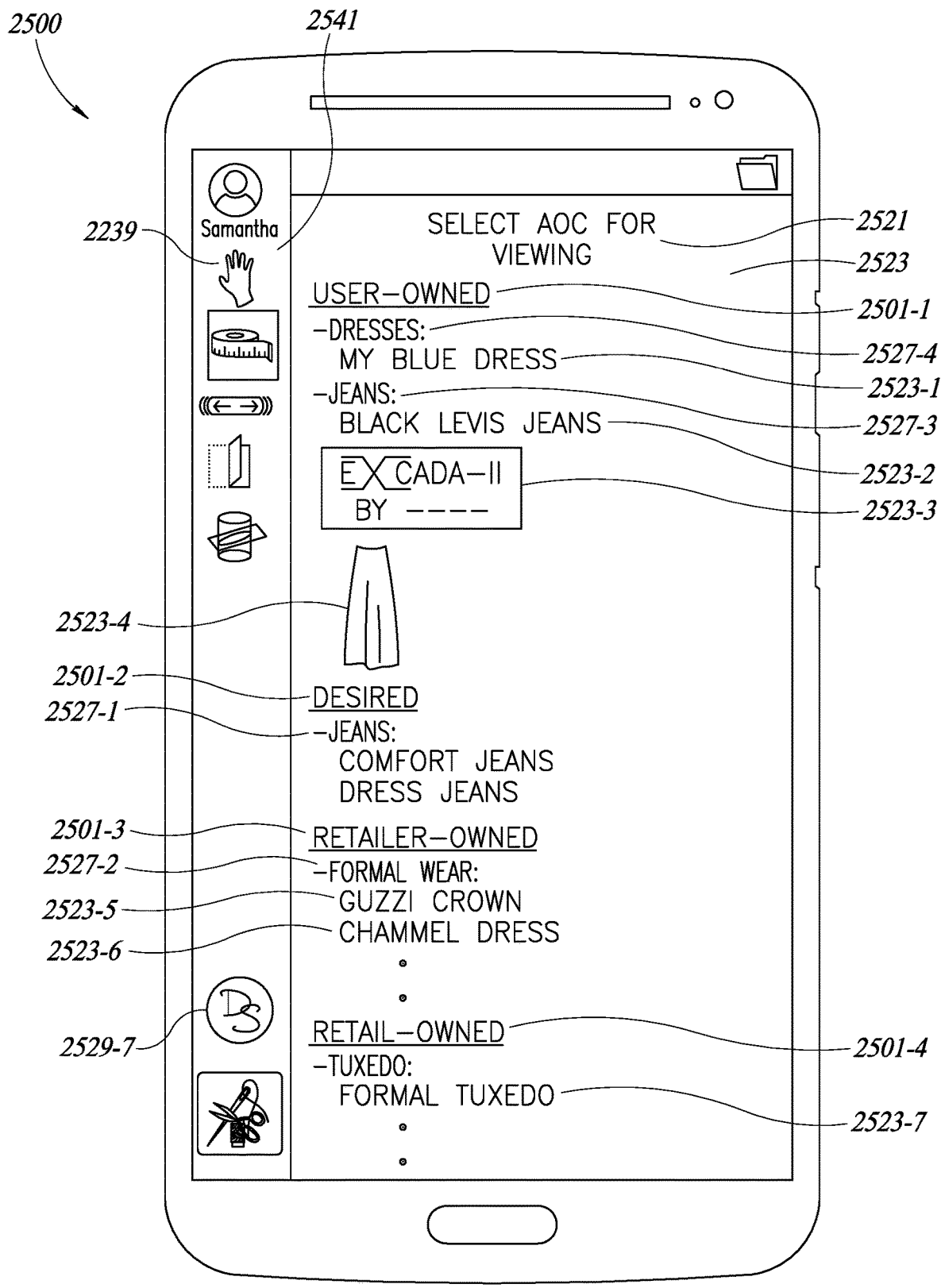
FIG. 25 is a screenshot of a portion of a selection screen generated and rendered by the process to select an apparel for a digiform fitting in accordance with embodiments of the present invention.

A screenshot of a portion of a selection screen 2500 generated and rendered by the process to select an apparel for a digiform fitting in accordance with embodiments of the present invention is shown in FIG. 25.

With reference to the process 2400 of FIG. 24, this process may start during step 2401 and then proceed to step 2403. During step 2403, the process may load the SSI for a shopper (e.g., a current shopper or a selected shopper) and VEI for one or more vendors (as may be selected by the shopper and/or system for example, the shopper may select to load VEI for a selected vendor such as MCMCM, MNIKE, 123ABC, etc., while a vendor at whose store the shopper is shopping may select itself as a selected vendor). In some embodiments, the system may obtain location information and select a vendor automatically in accordance with the location (e.g., if the shopper is at a retailer store XYZ stores, the system may obtain VEI for this vendor) depending upon system settings as may be set by system, vendor, and/or shopper. The process may then obtain DSCI (if the process has not already done so) from each of the SSI and the VEI accordingly. For the sake of clarity, and to avoid confusion, the DSCI from the SSI may be referred to as DSCI-S (unless the context indicates otherwise) and the DSCI from the VEI may be referred to as DSCI-V (unless the context indicates otherwise) during the present embodiments. Similarly, the DSI of the shopper may be referred to as DSI-S and DSI from the vendor may be referred to as DSI-V (unless the context indicates otherwise). The process may render a list of LRAs including corresponding selection items for selection by the shopper and may await selection of an AOC in the LRA by the shopper. This may be illustrated with reference to FIG. 25 which shows a screenshot of a portion of a selection screen 2500 generated and rendered by the process to select an AOC for a digiform fitting in accordance with embodiments of the present invention. In FIG. 25, an LRA 2523 (which may be similar to the LRA 2223 as shown in FIG. 22) may include clothing (e.g., a plurality of AOCs) each registered to the shopper and represented by a corresponding SUID as represented by selection items 2523-1 through 2523-7 (generally 2223-x) for selection by the shopper (e.g., Samantha in the present embodiments). A source (e.g., user-owned, retailer-owned (e.g., Macys™, etc.), manufacturer-owned, desired, etc.) may also be associated with each of the AOCs in the LRA as illustrated by sources 2501-1 representing user-owned (e.g., shopper-owned such as Samantha's), 2501-2 representing desired (e.g., the shopper's desired fitting), 2501-3 representing retailer-owned (e.g., vendor-owned), and 2501-4 representing rental-owned (e.g., vendor-owned rental). Similarly, an apparel type of each of AOC (e.g., shirt, pants, jacket, tuxedo, etc.) may also be associated with each of the AOCs in the LRA and may be indexed or otherwise displayed accordingly. The AOCs may also include a style (e.g., dresses, jeans, formal wear, Tuxedos, etc.) associated therewith as may be shown by arrows 2527-1 through 2527-4. A tools menu 2541 may include a plurality of software tools 2239 which for the sake of clarity may be similar to those shown in FIG. 22.

Instructions to select an AOC for viewing in a digiform visualization mode (DVM) screen in accordance with embodiments of the present invention may be generated and rendered audibly or graphically such as illustrated by instructions 2521.

Referring back to FIG. 24, after completing step 2405, the process may continue to act 2407 where it may select an AOC for viewing which may be referred to as a selected AOC for viewing (SAV) in the DVM using any suitable method. For example, the process may, in response to the shopper's selection of an AOC from the LRA, set the corresponding AOC as the SAV in accordance with embodiments of the present invention. In some embodiments it is envisioned that the shopper may directly enter one or more AOCs to be the SAV. In yet other embodiments any suitable method for selecting an SAV from the LRA may be employed including, for example, selecting a default AOC from the LRA to be the SAV. In yet other embodiments, the process may select a most-recently digiformed AOC (e.g., an AOC that the shopper has just tried on in a fitting room of a retailer) depending upon system and/or shopper settings.

In some embodiments, the shopper may select a SAV as may be described below with reference to FIG. 26 which shows a screenshot of a portion of a digiform visualization mode (DVM) screen 2600 in a view-and-measure mode (VMM) generated and rendered by the process in accordance with embodiments of the present invention. In the DVM the VMM may be considered a default mode of the system when entering the DVM. The DVM screen 2600 may be generated and rendered (e.g., on a US 2624 of the shopper using an APP) when the VMM is active and may include one or more a display area 2611, a tools menu 2641, an account information area 2691, and an action toolbar 2604.

The account information area 2691 may include a user account selection item 2606 and an associated account identifier 2607. The user account selection item 2606 may render an image associated with a logged-in user (e.g., the logged-in shopper) such as "Samantha," that is logged in to the user's account and whose login name may be displayed as shown by the account identifier 2607. In response to selection of the user account selection item 2606, the system may render information associated with the account and/or may provide a selection item to log off and/or change and/or add accounts. For the sake of clarity, it will be assumed that all accounts may be considered registered accounts. Thus, once the shopper is logged on to an account of the system such as an account of the shopper (as shown) or a default account, the process may display the username (i.e., the shopper) logged on to the account such as "Samantha" in the present embodiments. Default accounts may be employed in, for example, a fitting room area of a retailer where a shopper (e.g., a customer of the retailer) may wish to try on an AOC and/or find a suitable AOC having a desired fit using embodiments of the present system without logging into an account of the shopper.

Referring back to selecting AOC, the action toolbar may include a file selection item 2605 which may be selected by the shopper to browse and/or select information related to the shopper's account such as an LRA of the shopper (e.g., DigSizes of the shopper). Accordingly, in response to selection of the file selection item 2605, the process my retrieve and render a listing including one more AOCs that are registered to the shopper such as may be provided by the LRA of the shopper (e.g., LRA 2523, FIG. 25). This list may be rendered in accordance with one or more templates that the vendor may have assigned to DSCI of the vendor. If user selects templatized DSCI-T, then 3D model is clearly marked with graphical markers to show which measurements may be changed by the user. If any of those are changed, all the dimensions of the 3D model may respond to it and the 3D model may be rendered again or otherwise updated to reflect those changes.

The shopper may then select one or more AOCs from any suitable source such as the LRA (e.g., see, FIG. 25, 2523) and, in response, the process may then set at least one selected AOCs as an SAV. In some embodiments, the SAV may be selected by default in accordance with system and/or shopper settings. In some embodiments, the LRA may be provided in a default screen.

Once an AOC is selected as an SAV, the process may continue to step 2409 where the process may render a 3D model of the SAV on a rendering device of the system such as on a display of the system. Accordingly, the process may obtain DSCI for the SAV from a memory of the system and may reconstruct this information to render a 3D model 2615 of the SAV in, for example, the display area 2611 of the screen 2600 as shown in FIG. 26.

Figure 26:
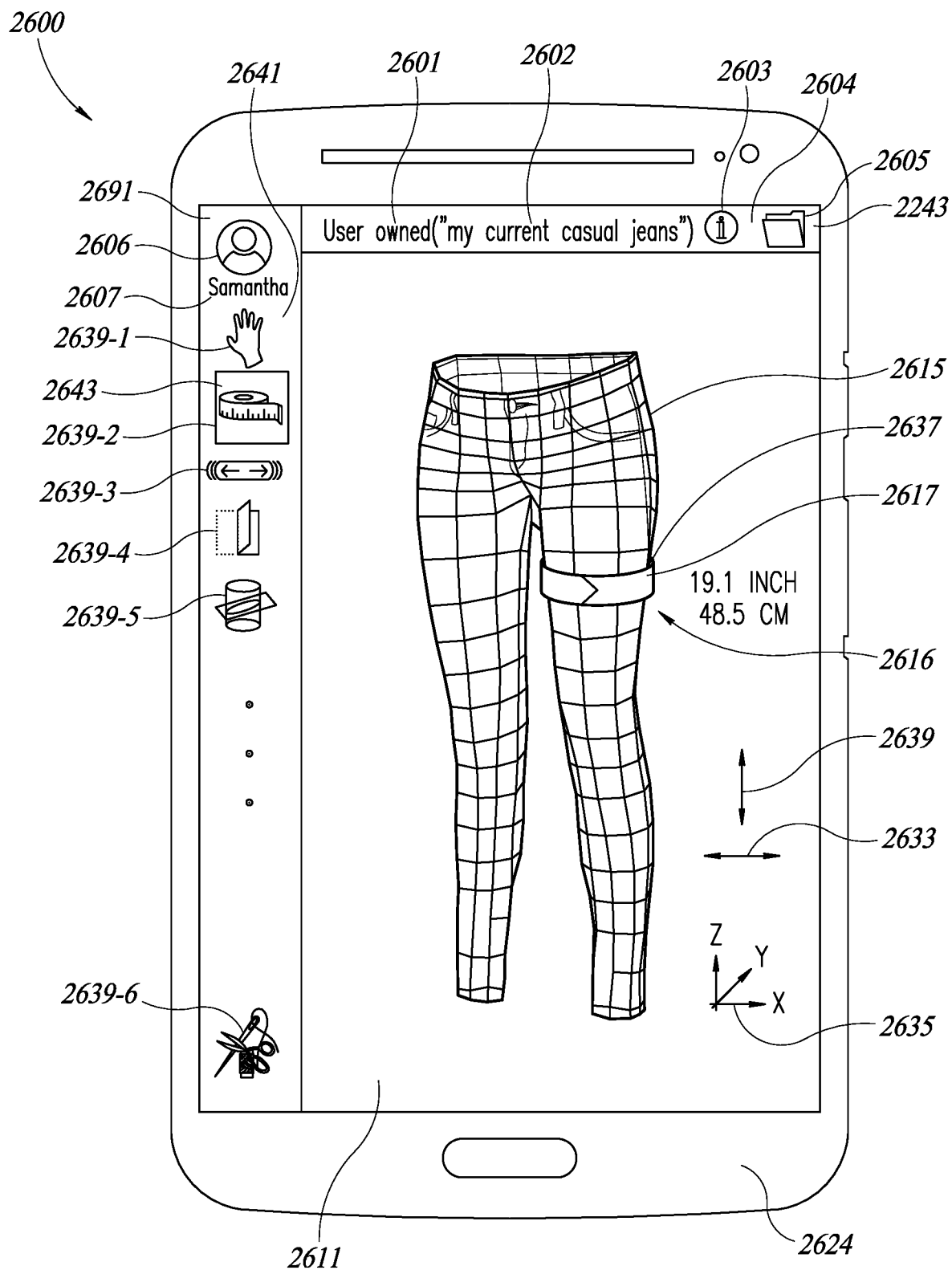
FIG. 26 shows a screenshot of a portion of a digiform visualization mode (DVM) screen in a view-and-measure mode (VMM) generated and rendered by the process in accordance with embodiments of the present invention.

Referring to the action toolbar 2604 of FIG. 26, the process may render information associated with the corresponding SAV (e.g., the current AOC) such as one or more of identification information such as an SUID 2602 or other identifying label, corresponding type and/or source information 2601 (e.g., user owned) that may identify the corresponding AOC, and/or an information selection item 2603.

It is envisioned that the type and/or source information 2601 may indicate whether the AOC is user owned (as in the current case), vendor owned (and may provide an identifier of the vendor), or a (desired apparel) or desired AOC (DA), the latter of which may be assumed to be an AOC that has been modified in accordance with input of the shopper with respect to fitting.

The information selection item 2603 may be selected by the shopper and, in response, the process may provide additional detailed information related to the corresponding AOC such as one or more of DSCI (or portions thereof), such as MI, SUID, alteration history, AM, match score (MS), and/or other associated information. Available information may vary by AOC, ownership (e.g., shopper or vendor), and/or whether it is a desired AOC (DA) and upon access rules as may be set by one or more of the system, vendor, and/or shopper. For example, it is envisioned that access rules may be associated with the DSCI such that certain users may have access and/or other users may be subject to one or more predefined restrictions. Thus, a vendor may place restrictions on AOCs of the vendor such that certain information in the DSCI may be restricted from viewing by the shopper and vice versa.

The 3D model may be adjusted in accordance with various detected elasticity of the scanned AOC using any suitable mathematical algorithm(s). For example, embodiments of the present invention may employ complex graphical rendering techniques similar to those employed in video games that use elasticity physics for modeling.

Templetized DigiSizes may be presented to the user depending upon the style of the apparel, the user may enter certain key measurements for the apparel to create desired DigiSizes. These key measurements may be populated with a default value as may be selected by the user and/or system. When these values are changed, the digiform information may be scaled accordingly.

It is envisioned that the 3D model 2615 may be rendered with a desired anatomical orientation and/or pose as may be set by the system and/or user. For example, the 3D model may be rendered in accordance with a default orientation and/or pose as may be set by the system, vendor, or shopper and stored in a memory of the system for later use. In some embodiments, the system may save orientation information which may define a default orientation. In some embodiments, the default orientation may correspond with the orientation and/or pose previously used (e.g., when the shopper was previously viewing the 3D model). Accordingly, the system may store this information (e.g., as default pose or previous pose information) in a memory of the system for later use when, for example, it updates the DSCI for the corresponding AOC or upon closing of the APP of the process.

Referring back to FIG. 24, after rendering the 3D model 2615, the process may continue to step 2410 where it may interact with the shopper to view, measure, and/or perform alterations to the 3D model using one or more software tools as may be discussed below. The shopper may select any of these modes and the system may interact with the shopper accordingly.

For example, the shopper may select virtual alteration mode (VAM) in which case, the process may provide the shopper with an interface to make desired alterations to the 3D model (as may be described with reference to FIG. 27 below) and the system may generate corresponding apparel alteration information (AM) then, during step 2413, the AAI may be applied to the DSI from which the 3D model was formed to form corresponding desired-fitting DSI (which, for the sake of clarity, may be referred to as desired-fitting DSI ($DSI_{DF}$)) which may be similar to the DSI in accordance with the AAI applied thereto. The process may further render a request for a user to enter an identifier such as an SUID to associate with the $DSI_{DF}$. In response to receiving the SUID, the process may associate this SUID with the corresponding $DSI_{DF}$ and form corresponding DSCI which may be stored in a memory of the system in association with the SSI for the shopper for later use and may be referred to as $DSCI_{DF}$ for the sake of clarity.

Accordingly, the 3D model of the desired fitting AOC may be stored as an independent digiform (e.g., DSCI) with its own SUID in a memory of the system. Thus, in some embodiments, the $DSI_{DF}$ may be stored in association with its own DSCI in a memory of the system.

In yet other embodiments, the $DSI_{DF}$ may be stored in association with the original DSI in a memory of the system in association the AM with the original DSI. While in other embodiments, the $DSI_{DF}$ may be stored in association with the DSCI of the DSI from which it was formed (e.g., via the above-referenced alterations). For example, the process may then associate the $DSI_{DF}$ with the corresponding DSCI (e.g., of the current apparel which is the SAV) and may store these in a memory of the system. It is envisioned that the SUID and/or AAI may also be associated with the $DSI_{DF}$ such that the system may keep track of the SUID and/or alterations (e.g., as represented by the AAI) in time and/or anatomical location relative to the corresponding 3D model. Thus, the system may render changes made to the 3D model by time and/or anatomical location on the 3D model. These changes may be rendered automatically and/or in response to a request of the shopper. Thus, the DSI may be modified by the AAI to obtain the $DSI_{DF}$ and vice versa.

For the sake of clarity, it will be assumed that the $DSI_{DF}$ may include changes as indicated in the latest AM and may be associated with the SUID. In yet other embodiments, however, the AM and/or the SUID may be stored in a memory of the system separately from the corresponding $DSI_{DF}$ but may be associated with the corresponding $DSI_{DF}$ and/or DSI. It is further envisioned that the process may then update the DSCI in accordance with the DSI, $DSI_{DF}$, SUID, and/or AM and may store it in a memory of the system for later use. Thus, the DSCI may include DSI and associated $DSI_{DF}$, SUID, and/or AAI. Accordingly, when DSCI is recalled at a later time, the process may rebuild the 3D model from the DSI corresponding with one or more of the SAF and SAF', and/or may show changes over time and/or anatomical location in accordance with the AAI.

Figure 27:
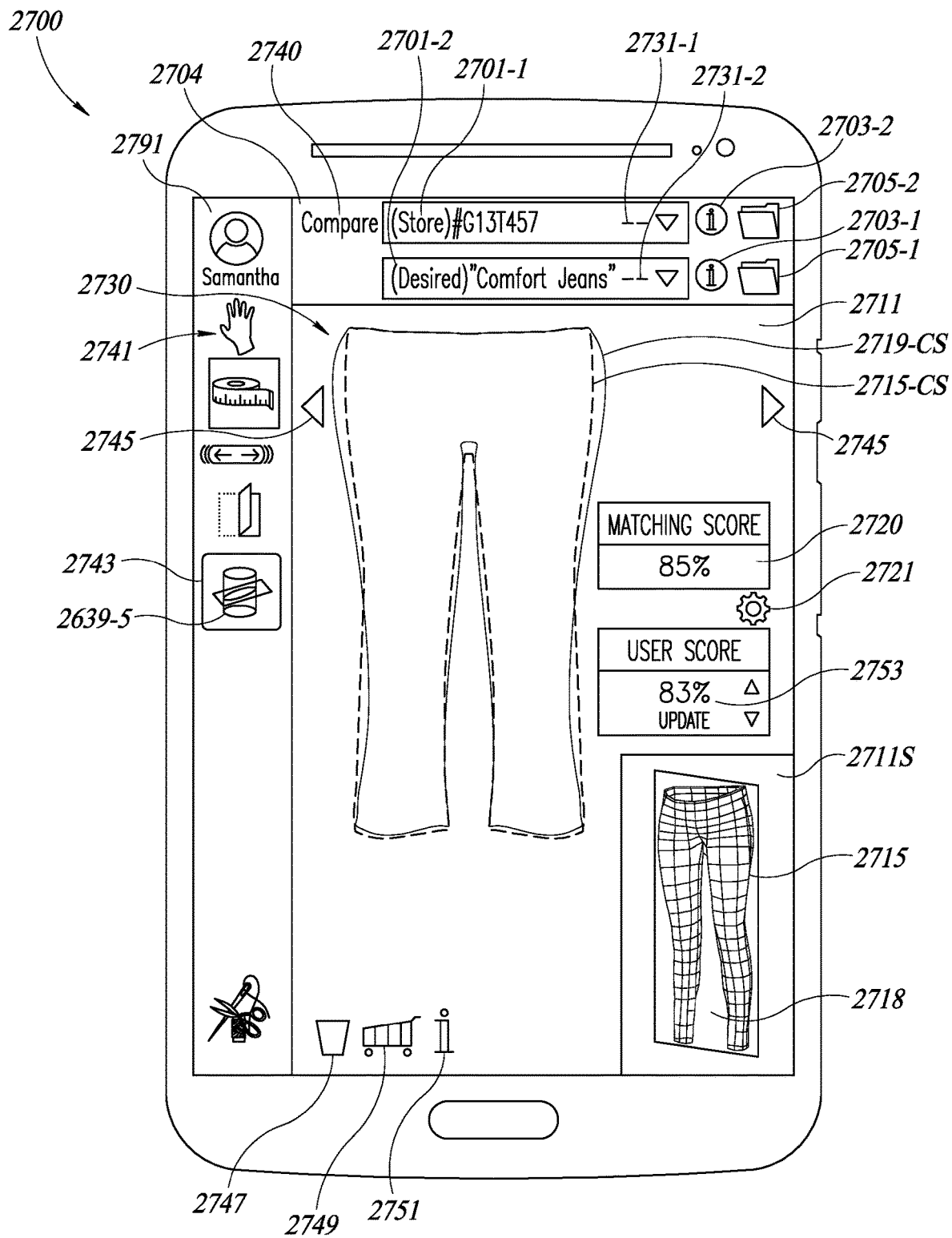
FIG. 27 shows a screenshot of a portion of a digiform comparison mode (DCM) screen in a Cross Section mode (CSM) generated and rendered by the process in accordance with embodiments of the present invention.

Referring back to step 2411, to perform these alterations (e.g., the alterations to the 3D model), the process may provide one or more tools such as the software tools 2639, as shown in FIGS. 26 and 27 and which will be discussed in further detail below, which may be operative to activate a corresponding software tool mode. For example, the process may provide the shopper with a virtual alteration mode (VAM) selection item 2639-6 which may be operative to activate the Virtual Alteration mode (VAM) in which the shopper may interact with the process to perform alterations on 3D model and save this as a desired fitting 3D model (e.g., corresponding to the $DSI_{DF}$ of a desired fitting apparel (DFA). For example, the process may provide an interface including a plurality of software tools that may, in response to the shopper's actions, generate or update corresponding AAI which may correspond with alterations performed using the rendered 3D model which may correspond with the DSI for the SAV. Then the process may apply the AM to the DSI of the SAV to form DSI for a desired AOC (e.g., the $DSI_{DF}$) which AOC may be a virtual AOC and may be referred to as the desired fitting AOC (DFA). The AAI may include all revisions to the 3D model such that if the shopper requests to revert back to a previous alteration or to the original size of a corresponding AOC such as the SAV, the process, in response, may go back to one or more previous alterations and/or the original form, shape, and/or size of this apparel (e.g., the SAV). It will be assumed that the altered version of the SAV may be referred to as the SAV'. In some cases, the SAV' may be that same as the SAV such as when no alterations are performed to the SAV and in other cases the SAV' may be different from the SAV in accordance with the AAI.

After completing step 2413, the process may continue to step 2415 where it may perform a comparison of a selected AOC of the shopper such as a selected AOC chosen from the group of desired AOC of the shopper, such as the $DSI_{DF}$, and the DSI of the vendor (i.e., DSI-V that is obtained from the DSCI-V. Accordingly, the process may obtain the DSI of the vendor that was obtained from the VEI and may compare the DSI for one or more AOCs of the vendor (e.g., subject to search settings) to the $DSI_{DF}$ (which corresponds with a SAV' which in the present embodiments is the DFA) for a fit. The results of this comparison (e.g., of the fit) may be referred to as a match score (MS) and may be represented as a numerical value (e.g., shown in percentage match such as 85%, 90%, . . . etc., match). The comparison may compare substantial portions of corresponding 3D models (e.g., corresponding to the $DSI_{DF}$ and the DSI-V) or may compare one or more locations on the corresponding AOCs to determine one or more location-based matches (e.g., a plurality of values) for one or more areas (e.g., of the 3D models based on their corresponding $DSI_{DF}$ or DSI-V). The results of the these location-based comparisons may be represented as a percentage match for a corresponding area such as: waist 95% match, thigh 20% match, pants length 98% match, etc., or as a graphical result where the results may be represented graphically as a color, highlighting, color intensity, and/or shading which may be superimposed upon corresponding areas of a rendered 3D model corresponding to DSI-V and/or the $DSI_{DF}$ (e.g., the SAV') The MS may be associated with each AOC of the vendor (or select AOCs of the vendor) and may be stored in association with the corresponding DSIC in a memory of the system such as in the SSI or VEI for later use. Thus, the shopper's Desired digiform (e.g., $DSCI_{DF}$) may be compared with digiform (DSCI-V) of AOCs for sale from the vendor (e.g., a vendor that corresponds with the VEI that was downloaded during step 2403) or a plurality of vendors as may be selected by the system, vendor, and/or shopper. To conserve resources, the process may perform this comparison or comparisons among a group of apparel (e.g., a group of AOCs) that are selected for searching such as AOC of a certain style (e.g., pants, shirts, etc.), vendor (Guzzi, Ezcada, MCMCM, etc.), etc. Thus, for example, the system may perform the comparison using AOC having of the same apparel type (e.g., such as pants) from a vendor from which the DSCI-V was obtained. After completing step 2415, the process may continue step 2417.

During act 2417, the process may select at least one AOC with the highest MS from the VET for the vendor(s). The selected at least one AOC may be referred to as MS AOC(s) (MSA(s)). In accordance with some embodiments, if two or more AOC from the VET have the same matching score, a conflict resolution algorithm may be employed to select one of these in accordance with system, vendor, and/or shopper settings. In yet other embodiments, however, there may be 1 through G (where G is an integer, that may be set by the system, vendor, shopper, etc.) AOCs that may be selected from the VEI as MSA(s) and may be selected in order of their corresponding MSs. In yet other embodiments, one or more AOCs that have an MS that is greater than a threshold value (e.g., 80% as may be set by the system, vendor, and/or user) may be selected as MSAs. The selected AOCs from the VEI may have the same style as the SAV'. Thus, if the SAV' is a shirt, the process may determine an MSA from shirts within the VEI that was searched such as the VEI of the vendor. After completing step 2417, the process may continue to step 2419.

During step 2419, the process may render a comparison image such as a 2D and/or 3D image of one or more selected MSAs (such as the MSA with the highest score determined above superimposed upon an image generated using the $DSI_{DF}$ (e.g., of the SAV') for the convenience of the shopper. This is illustrated with reference to FIG. 27 which shows a screenshot of a portion of a digiform comparison mode (DCM) screen 2700 in a cross section mode (CSM) generated and rendered by the process in accordance with embodiments of the present invention.

The screen 2700 may include one or more of a display area 2711, an action toolbar 2704, an account information area 2791, and a tools menu 2741, which may be similar to the display area 2611, the action toolbar 2604, the account information area 2691, and the tools menu 2641, respectively, of the screen 2600 of FIG. 26 with different settings and/or parameters such as activation of a software tool such as the Cross-Section mode as illustrated by a highlighting box 2743 around a Cross-Section tool selection item 2739-5 in the tools menu 2741. When the Cross-Section mode is active (e.g., on), the system may render a 3D model 2715 corresponding to the $DSI_{DF}$ of the desired AOC for fitting (e.g., the SAV') as shown in sub-window 2711S of display area 2711 and a corresponding cross sectional view 2715-CS of the 3D model 2715 in the display area 2711. These windows may be swapped using any suitable method such as a gesture. For example, in response to a user tapping the sub-window 2711S, the system may swap the display area 2711 and the sub-window 2711S and/or of the rendered images within. Thus, toggling the views. Depending upon areas of the 3D model (e.g., corresponding with the anatomy of a body of a user), an areas surroundings can be determined and a determination may be made as to whether fabric should be loose/tight around that corresponding area using any suitable method such as statistics, heuristics, or from the database which has the knowledge of relationship between an AOC and how it fits on various body parts. Such database or heuristics may be used to determine the context. For example, the database may indicate that a stockings should be tight and that cotton non-stretch pants should be loose around the same portion of the anatomy (e.g., a thigh, etc.). Thus, the database may account for user settings, system settings, fabric type (e.g., stretch, non-stretch, etc.), clothing type, parameterization values, etc. The system may provide an interface with which the shopper may select one or more planes 2718 which may intersect 3D models of one or more of the AOCs that are being compared such as the 3D model 2715 of the SAV' (e.g., xy, xz and zy which may substantially correspond with one or more anatomical planes such as transverse, coronal, and sagittal planes, respectively, in the present embodiment wherein the coronal plane 2718 is shown) and/or adjust a position of one or more of these planes relative the 3D model 2715 such that a desired cross sectional view 2715-CS of the 3D model 2715 may be formed and rendered on the screen 2700 for the convenience of the shopper. A coordinate system for the planes may be set automatically by the system and may thereafter be adjusted by the system in accordance with an input of the shopper.

The system may further determine a corresponding cross sectional view 2719-CS of a 3D model of the MSA (or a selected MSA) and render this cross sectional view superimposed upon the cross sectional view 2715-CS (which is a line image) of the 3D model 2715 (which is a line image) as shown in an overlying image 2730. Accordingly, the system may fit the 3D model of the MSA to the 3D model 2715 of the SAV' such that similar cross sections may be obtained and superimposed upon each other to graphically illustrate a fit between the SAV' and the MSA. Accordingly, the system may further provide an interface with which the shopper may adjust a relative position between a coordinate system of the planes and the SAV'. If two or more MSAs are compared to the SAV' the process may perform the same actions on each of the MSAs and may superimpose their respective cross sectional views upon the cross sectional view 2715-CS as discussed above.

In yet other embodiments, however, graphical methods may be employed to illustrate the determined match between the SAV' and the MSA for the convenience of the shopper. In accordance with embodiments of the present invention, the process may determine a match score (MS) and render the MS 2720 as shown using any suitable method(s). Methods to select, determine, and/or render the MS, are discussed above with respect to step 2415. An MS settings selection item 2721 may be selected to view different methods, applications, algorithms, and/or third-party applications (third-party plugins, etc.) which may be selected and/or adjusted by the shopper to determine and/or render the MS. In some embodiments, two or more methods may be employed to determine corresponding MSs and the system may render these MSs for the convenience of the shopper with identification of methods employed. Accordingly, the system may adjust methods, algorithms, settings, and/or inputs employed to determine the MS in a way that is customizable in accordance with system and/or shopper settings. It is further envisioned that in some embodiments, the system may employ a learning method in which feedback from a user may be input to adjust methods, algorithms, settings, and/or inputs employed to determine the MS.

In some embodiments when two or more MSAs are selected and in accordance with system settings, selection items such as corresponding directional arrows 2745 may be rendered for selection by the shopper. In response to selection of a corresponding one of the directional arrows 2745, the system may repeat the rendering and comparisons for each of the MSAs in order of score such as from lowest to highest or vice versa (depending upon system and/or shopper settings) in response to selection of corresponding ones of the directional arrows 2745.

The action toolbar 2704 may include information related to functionality of the current screen 2700 as indicated in a functionality area 2740 which may include an identifier such as "Compare" which may be indicative of a comparison functionality (CF) mode being active and configured to provide functionality to compare at least first and second AOCs such as the SAV' and the selected MSA, respectively, with each other and render the overlying image 2730.

With regard to identification of the AOC being compared, these AOC may be identified in corresponding areas of the action toolbar 2704 which may indicate information associated with a corresponding AOC such as type, source, and identification information 2701-1 (e.g., "Desired" and corresponding SUID such as comfort jeans) and 2701-2 (e.g., store and corresponding identifier such as id or stock no.) that may identify the corresponding AOC such as the SAV' and the MSA, respectively. Legends 2731-1 and 2731-2 may identify the corresponding AOC. Information selection items 2703-1 and 2703-2 may be selected by the shopper and in response the process may provide additional detailed information related to the corresponding AOC such as one or more of DSCI (or portions thereof), such as MI, SUID, alteration history, AAI, match score (MS), and/or other associated information. Similarly, file selection items 2705-1 and 2705-2 may be provided selected by the shopper and the system may render information related the SSI (e.g., LRA of the shopper) and VEI of the vendor (e.g., an identification of AOCs for sale by the vendor), respectively. The process may provide selection items such as a delete section item 2747, a cart selection item 2749, and an apparel information selection item 2751, which in response to selection by the shopper, the system may delete the current MSA (from the listing of MSA this act may also modify the SSI to indicate that this apparel was viewed and deleted from listing), add the current MSA to a shopping cart of the shopper, and obtain further information regarding the MSA, respectively.

It is also envisioned that the process may provide a user score selection item 2753 in which the shopper may modify this score and submit this score as feedback to the system which may then store this score in a memory of the system in association with the MS and SSI for later use. This may be an instant form of feedback. Other forms of feedback, however, are also envisioned.

Referring back to the flowchart 2400, after completing step 2419, the process may continue to step 2421 where the process may obtain feedback from the shopper (e.g., user feedback) with regard to one or more AOCs such as one or more of the MSAs. This feedback may include feedback such as may be provided when the shopper deletes the current MSA, adds the current MSA to the shopping cart, or views further information regarding the current MSA. Thus, the feedback may be obtained over a period of time and may be employed to train the system to the shopper.

In accordance with some embodiments, the process may generate an identification tag for a corresponding MSA (e.g., the current AOC) and/or shipping and handling instructions which may be used to ship the corresponding AOC to the shopper for testing. Then, the shopper may scan the tag and enter further information regarding the corresponding AOC and an application of the system may generate one or more windows for the shopper to provide further feedback, update the system, provide a review of the corresponding apparel, and/or return the corresponding apparel. Thus, the shopper may easily and conveniently, provide feedback regarding one or more corresponding AOC. After completing step 2421, the process may continue to step 2423.

During step 2423, the process may update one or more of the VEI and SSI in accordance results of the system and/or information received by, generated by, calculated by, determined by, and/or input into the system. After completing act 2423, the process may continue to at 2425 where it may end.

Referring back to FIG. 26, with regard to the software tools 2639, these tools may include one or more of a hand tool selection item 2639-1; a measure tape tool selection item 2639-2, an elasticity tool selection item 2639-3, a fold tool selection item 2639-4, a cross section tool selection item 2639-5, and a virtual alteration mode (VAM) selection item 2639-6 (generally 2639-x) each of which may be selected (e.g., by the shopper) to toggle corresponding software tool modes, such as a hand tool selection mode, a measure tape tool mode (MTTM), an elasticity tool mode (ETM), a fold tool mode (FTM), a cross section mode (CSM), and a virtual alteration mode (VAM), respectively, on (e.g., active) or off (e.g., not active). Depending upon system configuration and/or settings, one or more of the software tool modes may have different modes and/or settings when other software tool modes are activated.

When one or more of the software tools selection items 2639-x is selected (e.g., by selecting a corresponding selection item 2639-x or automatically), the process may, in response, toggle a mode of the selected software tool 2639-x on or off and may highlight the selected software tool selection item 2639-x accordingly to indicate its status such as active (e.g., on) or inactive (e.g., off) using any suitable method such as the highlight box 2643 or other suitable highlighting (e.g., color, intensity, contrast, hues, blinking, indicators (e.g., on/off sliders), etc.) as may be set by the system, vendor, and/or shopper. For example, it is envisioned that any suitable highlighting may be employed to indicate a status (e.g., on/off, active/inactive) of a corresponding software tool mode. It is envisioned that when the status of certain software tool modes is active, other software tool modes may be deactivated and inactive until the status of the corresponding software tool mode is inactive, in accordance with system, vender, and/or shopper settings.

When the hand tool mode is on, the process may rotate, move, or zoom-in or zoom-out in response to corresponding input gestures such as may be input by the shopper on touchscreen of the system or elsewhere. For example, in accordance with embodiments of the present invention in response to a sliding gesture (e.g., such as may occur when the shopper moves a finger across the display area 2611) on at least a portion of the 3D model 2615, the 3D model may be moved in a current plane in the direction of the detected movement of the finger. For example, in accordance with embodiments of the present invention in response to the shopper moving a finger across the display area 2611 in an area that is off of the 3D model 2615, the process may rotate the 3D model about a corresponding axis of a current coordinate system (as illustrated by arrow 2635) such as about an x axis in response to detected movement of the finger in the direction of arrow 2639 and about an z axis in response to detected movement of the finger in the direction of arrow 2633 of current coordinate system (having x, y, and z axes) as illustrated by arrow 2635. In response to a gesture such as a multi-touch gesture (e.g., a zoom gesture which may be referred to as a pinch-out gesture) a pinching-out gesture on the display area 2611, the system may zoom-out on a current view of the 3D model 2615 (e.g., by rescaling the rendered 3D model accordingly). Similarly, in response to a detected multi-touch gesture, such as a pinching-out gesture (e.g., a zoom gesture) on the display area 2611, the system may zoom-in on a current view of the 3D model 2615 (e.g., by rescaling the rendered 3D model accordingly). In some embodiments, the rotate and/or movement gestures may be toggled on or off by tapping on the display area 2611. Thus, the hand tool selection item 2239-1 may be configured to provide the shopper with the ability to rotate, move, and/or zoom in or out using various touchscreen gestures. In some embodiments, the gestures may be mapped to actions in accordance with system, vendor, and/or shopper settings and stored in a memory of the system for later use. In some embodiments the 3D model 2615 may be coupled to the coordinate system and an interface may be provided to relocate the coordinate system relative to the 3D model 2615.

When the measure tape tool mode is on (e.g., active), the process may monitor inputs of the shopper such as gestures and in response, may determine one or more of a gesture, a location (or area) of the gesture in relation to the 3D model 2615, and an associated context (e.g., measurement context such as a linear measurement, a circumferential measurement, etc.). Thus, the system may determine a measurement context based upon a selected location relative to the 3D model 3615 and system settings such as a measurement context table stored in a memory of the system. Accordingly, one or more locations relative to an anatomical model may be mapped by the system, shopper, and/or vendor and the system may update the measurement context table accordingly. The system may then determine measurement context based upon a selected location relative it the 3D model 3615 and the mapped-out locations stored in the measurement context table. Thus, the system may set forth predefined measurement contexts based upon a reference 3D anatomic model to which input selections may be matched. In accordance with some embodiments, to determine context, the system may compare the one or more of the determined gesture and/or the current location relative to the 3D model 2615, to a reference 3D anatomical model to which one or more of gesture(s), location(s), and corresponding context(s) may be mapped. Then, the process may determine a match, or a closest match, and then may set the context accordingly.

Parameters such as location, gestures, and/or contexts of the reference 3D model may be set by the system, vendor, and/or shopper and stored in a memory of the system for later use. In some embodiments, the process may use a look-up table or artificial intelligence to determine at least context in accordance with location and/or gestures. In yet other embodiments, the shopper may double click on the display area 2611 to toggle context (e.g., circumference, linear length, etc.). Thus, in response to these determinations, the process may determine and/or render measurements corresponding to the input gesture, location, and/or associated context. Thus, the process may provide various dimensions and parameters of the 3D model 2615 in accordance with one or more inputs of the shopper. This may provide the shopper with an ability to measure various desired dimensions of the 3D model 2615 using any suitable selection method such as touchscreen gestures, by moving a pointer, by pointing to a location on the shopper, and/or on or at actual apparel to select a desired area or location. For example, in response to selection of a left-thigh area 2637 of the 3D model 2615, the system may determine a context (e.g., circumference) of the selected area (e.g., a thigh, etc.) using any suitable method. For example, if the selected area is a thigh, the process may determine a corresponding context and measurement at the selected area and may render this information as an arrow 2616 depicting circumference and corresponding measurement information 2617 (e.g., indicative of actual measurement information of the actual apparel which was digiformed). This depiction and measurement may correspond with the determined context. For example, if the context relates to a length, the process may depict a straight arrow and a corresponding length may be calculated and rendered. The measurement process may be repeated one or more times. Depending upon system settings (as may be set by the system, vendor, and/or user and stored in a memory of the system), each time a new measurement is taken, the process may discontinue rendering the previous measurement or may continue to render the previous measurement(s) or may stop rendering the previous measurement(s) if, for example, it is determined that they may interfere with a rendering current measurement. In yet other embodiments, the time a new measurement is rendered, the process may or may not discontinue rendering the previous measurement based upon system settings as may be set by the system, vendor, and/or shopper. Information related to these measurements may be stored in memory of the system and rendered by the system in response to a request by, for example, the shopper.

Selected areas may be compared with defined context that may be stored in a memory of the system in association with a general location on an AOC and corresponding context such as circumference, length (linear), inseam, neck size, chest size, waist, etc. For example, in response to the waist being selected, the process may determine a corresponding context (e.g., circumference) and may determine circumference (e.g., waist size) at the waist of the 3D model 3616 and may render this information (e.g., waist size) and in association with a depiction of the corresponding measurement (e.g., circumference at waist). In some embodiments, in response to a multi-touch pinch type gesture, the process may determine a length and/or circumference depending upon context. For example, in response to a pinch from the waist to the end of a pant leg, the system may determine that the context is length and may determine a linear length across this area.

In some embodiments, the system may respond to a two-finger multi-touch gesture to determine one or more of location, context, and measurement. For example, in response to detecting a two-finger gesture with one touch at or near the waist and the other touch at or near the end of pant leg of the 3D model 2615, the system may provide a length of the corresponding pant leg of the 3D model 2615. Similarly, in response to detecting placement of a finger on waist and another on the end of pant leg, the system may provide a length of the corresponding pant leg of the 3D model 2615. Thus, the Measure Tape tool mode may be responsive to single touch or multi-touch gestures. Gestures, associated actions, location, context, and/or apparel type may be stored in a memory of the system for later use.

It will be assumed that the dimensions of the 3D model 2615 may be indicative of the actual physical dimensions of the scanned AOC from which the corresponding DSCI was derived. In some embodiments it is envisioned that the process my interpolate and/or may scale to determine dimensions that may represent actual or near actual physical dimensions. Thus, alterations of the 3D model may be represented as actual physical dimensions and/or parameters (e.g., elasticity). It is further envisioned that the $DSCI_{DF}$ may be employed to form an actual garment with the desired shopper size and shape.

Accordingly, in response to selection of an area on the 3D model 2615, such as the thigh area as shown, the process may determine the area and a context of this area and may automatically morph into a corresponding measurement. The measure tape tool selection item 2639-2 may be selected to activate (e.g., toggle on) a measure tape mode (MTTM) that may be context sensitive and may determine context of a desired measurement based upon one or more user and/or system settings. For example, when activated the MTTM may automatically morph into appropriate measurement (straight line, circular etc.) in accordance with location of the 3D model. For example, when a desired location is at a thigh, the system may determine that a circumference of the thigh is desired and the measure tape tool may morphed into an arrow 2616 at the thigh indicating a circumference and render corresponding measurement information 2617 at the corresponding location relative to the 3D model 2615. In some embodiments, the measurement and the corresponding graphic indicator may toggle between measurements in response to selection (e.g., by tapping, etc.) at a location such as may occur at a waist location relative to the 3D model where the system may toggle the measure tape tool to indicate measurements related to the corresponding location such as waist (circumference), inseam, and/or length, which may be determined and/or rendered sequentially in response to selection (e.g., by tapping) on the waist. One or more of these measurements, however, may be determined and/or rendered in response to selection at other areas of the 3D model and/or directly by way of a user request (e.g., using a context-sensitive search such as "what is the waist size?", etc.).

In some embodiments, tapping on the display area 2611 when the measure tape tool mode is active may morph the measure tape tool between contexts such as circumference (or circular) and linear measurement contexts (e.g., to measure a waist and a length, respectively, or other suitable area) as may be desired and these measurements may be rendered on the display area 2611 in a location that corresponds with the measurement for the convenience of the shopper.

With regard to the elasticity tool mode (ETM), when this mode is active (e.g., on), the system may render elasticity information related to the 3D model 2615 (e.g., the current apparel). Generally, when the elasticity tool mode is active, the system may, render elasticity information about the 3D model on a display screen of the system using any suitable method such as color-coding a surface of the 3D model to indicate elasticity. For example, a color pallet (e.g., from red to violet and/or portions thereof) or intensity may be matched to a relative elasticity of the 3D model and applied to a surface of the rendered 3D model to graphically indicate corresponding levels of elasticity at a corresponding location on the surface of the rendered 3D model for the convenience of the shopper. In yet other embodiments, rather than using a color pallet to indicate relative elasticity, the process may employ other methods to indicate relative elasticity of an area on the 3D model such as color coding, color intensity, shading, graphical indicators, and/or highlighting to indicate corresponding levels of elasticity of the 3D model and applied to the 3D model as discussed above. It is also envisioned that the system may determine and render information related to pressure at different levels of stretching using one or more colors to indicate different detected pressures.

When the 3D model is displayed with another 3D model of another AOC, this tool may render a difference in elasticity between these two AOCs under varying stretching loads using color coding to illustrate the difference.

Depending upon system settings, when the VAM mode is active, it is envisioned that the Elasticity tool mode may provide an interface with which the shopper may virtually stretch the 3D model at a selected location using any suitable input such as touchscreen gestures and, in response, the system may determine expected changes in form, shape, and/or size and/or pressure exerted by the corresponding AOC under such conditions and render this information in association with the 3D model for the convenience of the shopper. For example, in response to a pinching-in gesture on the 3D model, the system may increase elasticity and/or shrink the 3D model at a corresponding location. Conversely, in response to a pinching-out gesture on the 3D model, the system may decrease elasticity and/or expand the 3D model at a corresponding location. The system may then update corresponding DSCI accordingly.

With regard to the fold tool mode, when this mode is on, the system may respond to user inputs and/or gestures to fold, squish and/or rearrange the 3D model in one or more desired areas and/or positions. Accordingly, the fold tool may provide an interface with which the shopper may fold, compress, and/or rearrange the 3D model in various positions. The fold tool mode may be on (e.g., active or activated) while one or more other software tools 2639 are also on in the modified position.

With regard to the cross section tool, when this mode is on, the system may, in response to inputs of the shopper, take a cross section of the 3D model 2615 and form a corresponding cross sectional view of the 3D model 2615. Then, the system may render either or both of the 3D model 2615 and the cross sectional view in the display area 2611. For example, the system may render the cross sectional view side-by-side with the 3D model 2615 in the display area 2611. The system may provide an interface for the shopper to select one or more planes which may intersect the 3D model 2615 (e.g., xy, xz, and zy which may substantially correspond with one or more anatomical planes such as transverse, coronal, and sagittal planes, respectively, in the present embodiment) and/or adjust a position of these planes relative the 3D model 2615 such that a desired cross section may be obtained where the corresponding plane intersects the 3D model 2615 and a corresponding cross sectional view of the 3D model 2615 may be formed and rendered on the display for the convenience of the shopper. This cross sectional view of the 3D model 2615 may be rendered as a 2D model. One or more of the software tools (e.g., using corresponding software mode) may be switched to a 2D mode such that they still be operative upon the 2D model similarly to their operation on the 3D model 2615.

With regard to the virtual alteration mode (VAM), when this mode is on, the system may interact with the user using a UI of the system such as a touch screen, voice commands, gestures, etc. to perform virtual alterations to the 3D model 2615. In the present embodiments, these changes may be saved as a new 3D model and may be referred to as a desired fitting DSI ($DSI_{DF}$) which may be saved in a memory of the system in association with the current user's (e.g., the shopper's account such as Samantha's account) such as in the SSI of the corresponding shopper. These changes may be assumed to capture a desired fitting for a desired AOC as may be set forth in the $DSI_{DF}$ a may be stored as the $DSCI_{DF}$ in association with, or independently of, the DSCI from which it was derived. The system may further track alterations to corresponding 3D models and associate these changes to the corresponding $DSCI_{DF}$ that was at least in part derived from the DSCI. In some embodiments the DSCI may include the $DSCI_{DF}$ or they may be stored separately in the corresponding SSI.

Thus, the $DSI_{DF}$ may represent a desired AOC that may be considered a desired virtual AOC. It is envisioned that the system may further keep track of any changes to the original DSI, $DSI_{DF}$, DSCI, and/or $DSCI_{DF}$ as may be desired in the same or separate files.

While several software tools are discussed, it is envisioned that other software tools and/or other software tool modes may be provided as may be set by the system, vendor, and/or shopper. In some embodiments, the software tools may be selected and rendered or otherwise provided in accordance with information associated with a corresponding AOC such as type and/or source information 2801 (e.g., Desired, vendor owned, shopper owned, etc.) of the AOC being viewed. Thus, different AOC types/sources may have different software tools and/or a different software tool sets (e.g., a group or subgroup of software tools that may be activated) available. Thus, software tools for each type of AOC may be selected by one or more of the system, vendor, and/or provider and may be stored in accordance with system settings or corresponding DSCI as may be desired.

Figure 28:
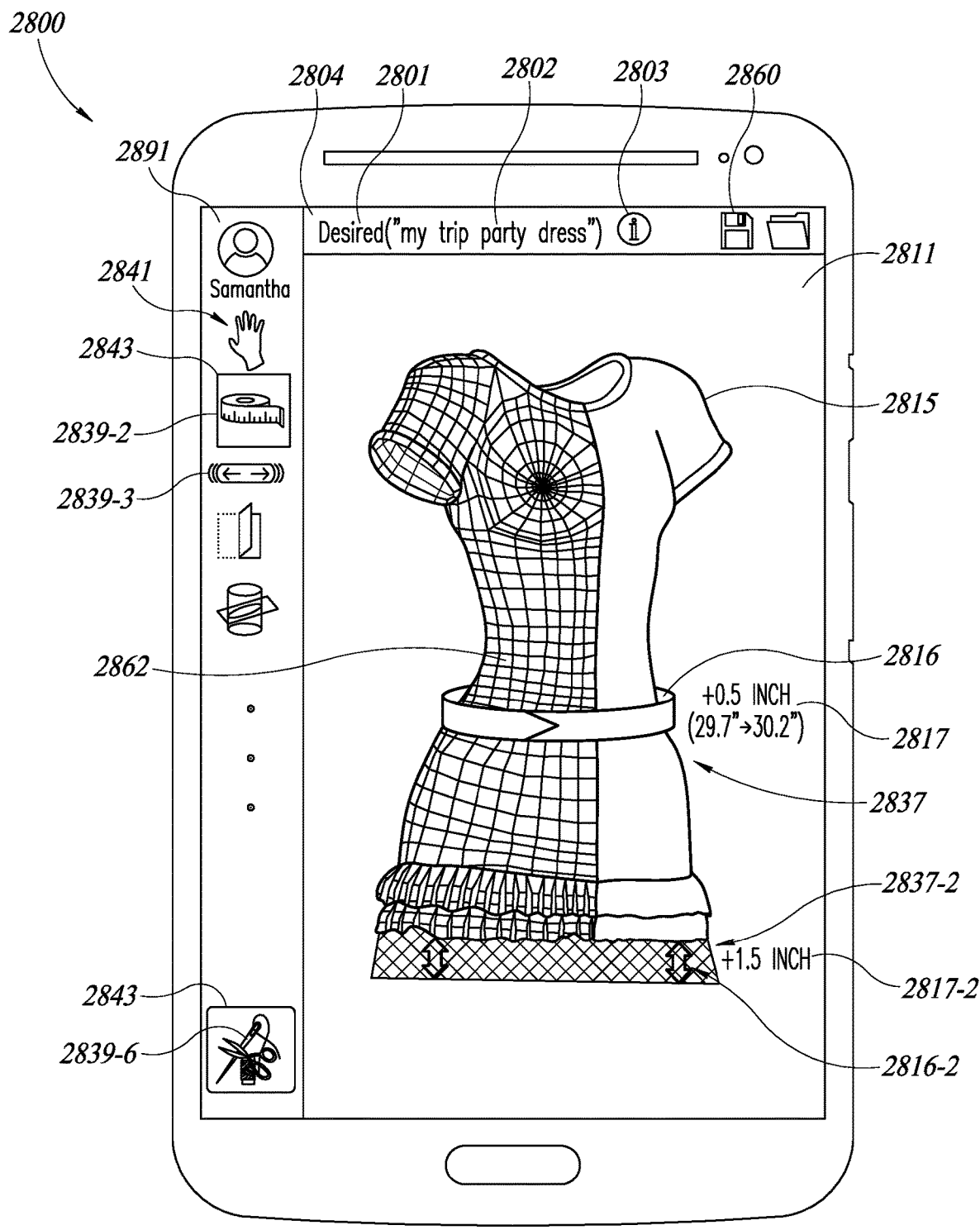
FIG. 28 is a screenshot of a portion of a digiform visualization mode (DVM) screen illustrating a rendering of a 3D model of an AOC in a VAM in accordance with embodiments of the present invention.

A screenshot of a portion of a digiform visualization mode (DVM) screen 2800 illustrating a rendering of a 3D model 2815 of an AOC in a VAM in accordance with embodiments of the present invention is shown in FIG. 28. The DVM screen 2800 may include one or more of a display area 2811, an action toolbar 2804, an account information area 2891, and a tools menu 2841, which may be similar to the display area 2611, the action toolbar 2604, the account information area 2691, and the tools menu 2641, respectively, of the screen 2600 of FIG. 26. The present embodiments may show activation of different functionality for software tool modes when other software tools modes are active. For example, when the MTTM is activate (e.g., turned on) and the VAM is inactive (e.g. off) as shown with reference to FIG. 26, the MTTM may provide an indication of a type of measurement (e.g., circumference as indicated by arrow 2616) and a corresponding measurement (e.g., 2617) at the selected location such as the waist 2837 of the 3D model 2815. With reference to FIG. 28, when the MTTM and the VAM modes are both active (as illustrated by highlighting of MTTM and VAM selection items 2839-2 and 2839-6, respectively, as indicated by highlighting boxes 2843 as shown), the MTTM mode may similarly provide an indication of measurement (e.g., arrow 2816) and a corresponding measurement (e.g., 2617) at the selected location (e.g., in response to the shopper selecting the corresponding location) such as the waist 2837, however, the MTTM may now include functionality such that the system may now be responsive to change the indicated measurement in accordance with input of the shopper. For example, in response to receiving an input gesture (e.g., from the shopper) such as a pinch-type gesture (e.g., in or out) at or near the arrow 2816, the system may adjust the corresponding measurement (2817) accordingly (e.g., increase corresponding measurement for pinch-out-type gestures, and decrease corresponding measurement for pinch-in-type gestures). Here, touchscreen gestures may be employed to stretch the tape indicator 2816 at the waist of the desired apparel (e.g., as indicated by arrow 2837) resulting in a half-inch (e.g., 0.5 inch) increase of that dimension from 29.7 inches to 30.2 inches as shown. Thus, the system may be operative to render either or both of the original dimension(s) and modified dimension(s) after alteration. The system may then be operative to change the 3D model accordingly. In some embodiments, changes may be entered using other input methods such as entry such as a direct keyboard entry and the system may update a corresponding dimension accordingly. After updating the measurement in response to a request of the shopper, the system may update the corresponding DSI accordingly.

It is envisioned that the drawing may be represented mathematically using any suitable function such as a 3D B-spline surface comprising an isoparametric mesh. It is possible to render such a mesh superimposed upon a surface of the body/fabric in a 3D model representing an AOC. Changing the lines in the mesh has the effect of shrinking/stretching fabric of the 3D model. There may be a direct mathematical relation between the isolines and the shape of the surface of the mesh. The software may render the isolines such that a user may select and move them on a rendering device of the system such as a display. Accordingly, a CAD software operating in accordance with embodiments of the present system may be employed to perform these actions.

Other alterations may also be made to the 3D model 2815. For example, in response to selection of a lower portion of the 3D model 2815 (e.g., a hem as indicated by arrow 2837-2), the system may determine context of this area as linear (e.g., as opposed to circumferential) and may generate an arrow 2816-2 (e.g., illustrating a linear measurement) and a corresponding measurement 2817-2. In response to an input of the shopper (e.g., using multi-touch gesture(s) such a pinch-type gestures or other gestures), the system may adjust the length of the arrow 2816-2 and the corresponding measurement 2817-2 accordingly. For example, in this example, the shopper has lengthened the 3D model 2815 (e.g., the dress) linearly by 1.5 inches (e.g., +1.5 inches) as rendered by the system to lower the hem of the 3D model 2815 by 1.5 inches. Thereafter, the system may update the corresponding DSI accordingly.

Similarly, when the ETM and the VAM are both active (e.g., by selecting an Elasticity tool selection item 2639-3), it is envisioned that the ETM may provide an interface with which the shopper may virtually stretch or shrink the 3D model 2815 using gestures (e.g., a multi-touch gesture (e.g., pinch-type gestures) such as a pinch-in-type gesture to increase elasticity and a pinch-out-type gesture to decrease elasticity) at selected location(s) corresponding to the gesture(s) using any suitable input such as touchscreen gestures and, in response, the system may determine expected changes in form, shape, and/or size and/or pressure exerted by the apparel under such conditions (e.g., in accordance with the elasticity) and render this information in association with the 3D model for the convenience of the shopper. The system may superimpose and render a 3D mesh 2862 comprising vertices and lines upon the 3D model which may be acted upon when making changes to the 3D model 2815.

Thus, when the VAM is active, certain software tool modes such as the MTTM and ETM may continue to provide contextual measurements and/or enhanced functionality to modify corresponding measurements in response to inputs from the shopper. Similarly, their corresponding software tool selection items, such as the MTTM and VAM selection items 2839-2 and 2839-6, respectively, may be selected to specify the desired alterations and/or current properties. For example, the MTTM mode may render current measurements and in response to a tap gesture when the VAM mode is active, the MTTM mode may, in response to an input gesture (e.g. a multi-touch gesture such as a pinch type gesture) alter the current measurements in accordingly.

With regard to the action toolbar 2804, this toolbar may include information associated with a corresponding apparel such as type and/or source information 2801 (e.g., desired) and associated SUID 2802 (e.g., "my trip party dress") that may identify the current apparel (e.g., which is a virtual apparel in the present embodiments as it is of a desired type). An information selection item 2803 may be selected by the shopper and, in response, the process may provide additional detailed information related to the current apparel such as details about this desired digiform (e.g., $DSCI_{DF}$), such as original identification (e.g., original SUID), original digiform (e.g., DSCI), history of modifications (e.g., AM), etc. When changes are made to the current AOC, the system may render a save selection item 2860 which, in response to selection thereof, the system may update DSI associated with the current AOC in accordance with these changes. In accordance with embodiments of the present system, if the currently apparel is not a desired apparel, the system may request an SUID and store these changes as a desired AOC (e.g., $DSCI_{DF}$).

Figure 29:
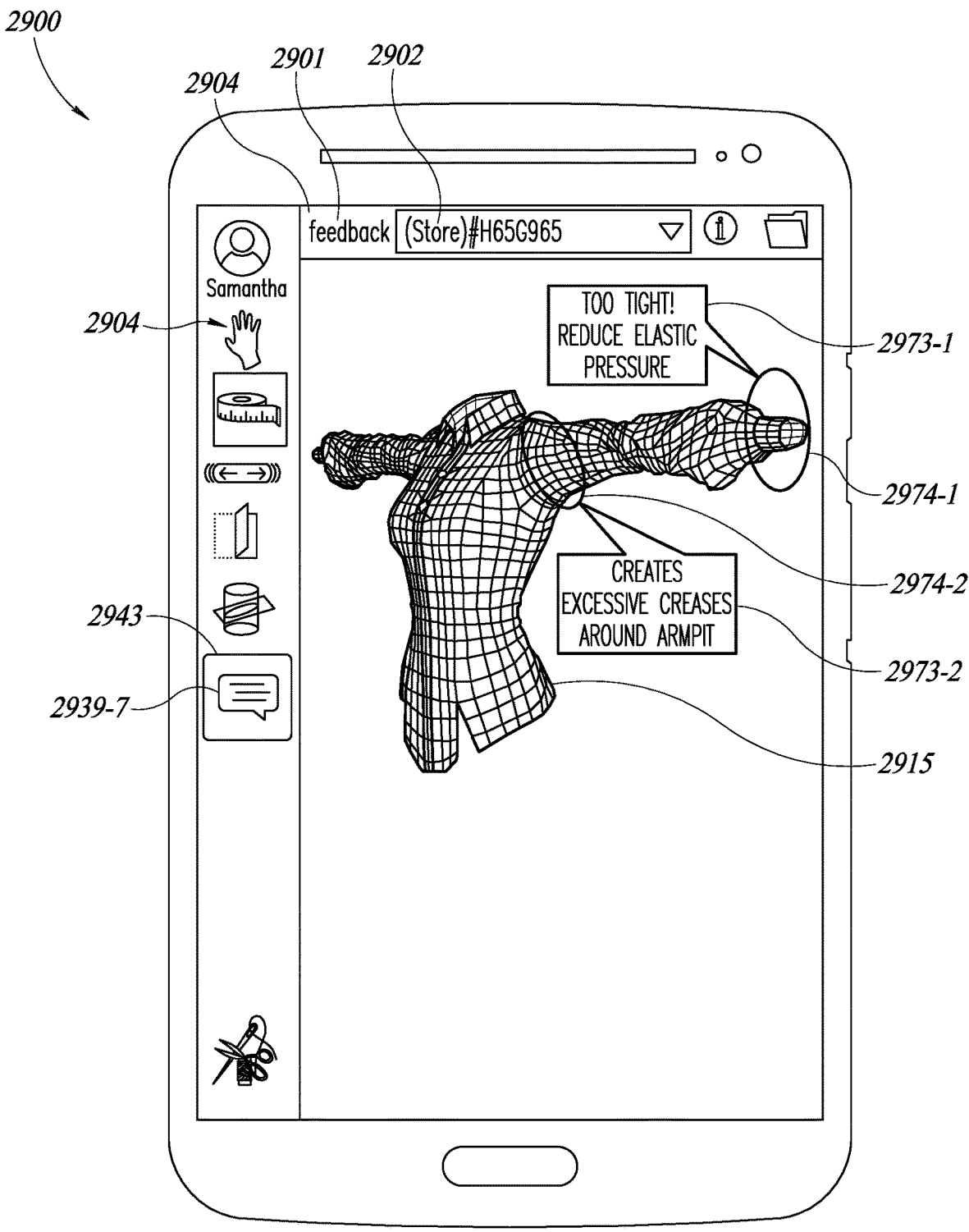
FIG. 29 is a screenshot of a portion of a digiform visualization mode (DVM) screen in a comments-mode generated and rendered by the process in accordance with embodiments of the present invention.

A screenshot of a portion of a digiform visualization mode (DVM) screen 2900 in a comments-mode generated and rendered by the process in accordance with embodiments of the present invention is shown in FIG. 29. The software tool mode may include the comments mode. The comments mode may be toggled on or off (e.g., active or inactive, respectively) in response to selection of a comments mode selection item 2939-7. For example, in response to the shopper selecting the comments model selection item 2939-7 to activate it, the system comments mode may be activated. Thereafter, in response to the shopper selecting an area of a 3D model 2915 the system may select the corresponding area(s) and contextually generate area markers 2974-1 and 2974-2 and may provide associated selection boxes 2973-1 and 2973-2, respectively, in which the shopper may enter one or more comments (e.g., Too tight, reduce elastic pressure; creates excessive creases around armpit) regarding the corresponding selected areas on the 3D model 2915. Thereafter, the system may employ a natural language translator to translate these comments and apply them to the 3D model 2915 and update the DSCI accordingly. An action toolbar 2904 may provide information related to the 3D model 2915 such as type/source information 2901 identification such as SUID 2902. In response to the VAM being selected, these comments may be translated using a context-sensitive search engine and corresponding design changes may be incorporated into the 3D model 2915. Thereafter the DSIC for the corresponding 3D model 2915 may be updated accordingly. Thus, the shopper may also use VAM to specify desired changes as a part of providing feedback.

Figure 30:
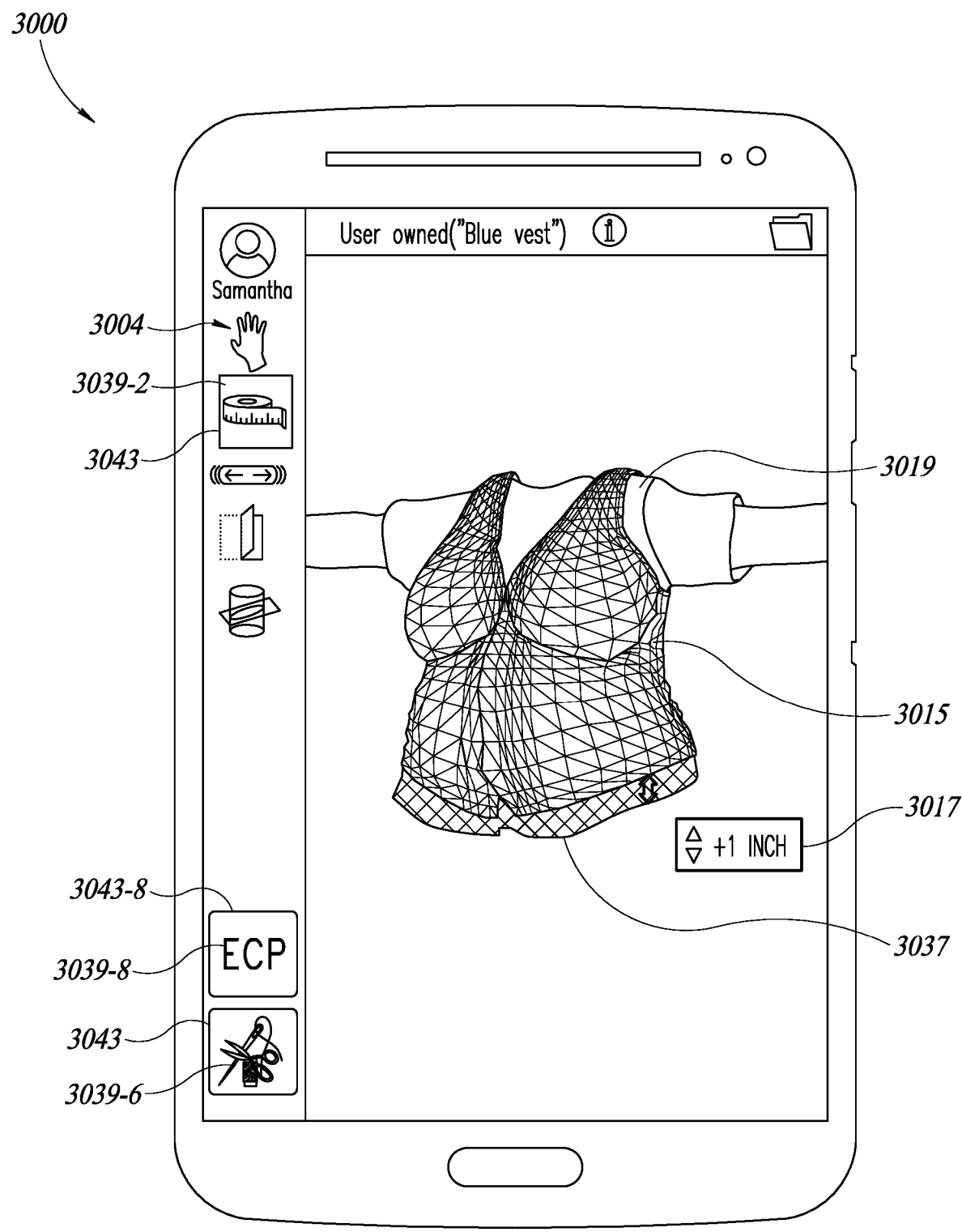
FIG. 30 is a screenshot of a portion of a digiform visualization mode (DVM) screen in a VAM generated and rendered by the process in accordance with embodiments of the present invention.

A screenshot of a portion of a digiform visualization mode (DVM) screen 3000 in a VAM generated and rendered by the process in accordance with embodiments of the present invention is shown in FIG. 30. When the MTTM and the VAM modes are both active (as illustrated by highlighting of MTTM and VAM selection items 3039-2 and 3039-6, respectively, as indicated by highlighting boxes 3043 as shown), the MTTM mode may provide an indication of measurement (e.g., arrow 3016) and a corresponding measurement (3017) in response to selection of a desired location (e.g., in response to the shopper selecting the corresponding location) such as a hem 3037 of a rendered 3D model 3015 of an AOC such as a user owned blue vest as identified in an action toolbar 3004. Then when an estimated customer physique (ECP) mode (ECPM) is active, as indicated by highlight box 3043-8 situated about an ECPM selection item 3039-8 in an action toolbar 3004, the 3D model 3015 may be rendered as a mesh that may be draped over, or otherwise superimposed upon, an ECP 3D model 3019 for the same or similar type of apparel (e.g., a shirt, pants, vest, etc.) as may be determined by the system. The ECP 3D model 3019 may be generated in accordance with ECP model information (ECPMI) that may be stored in a memory of the system as DSCI in association with the SSI of the shopper and may be recalled by the system from the memory in response to activation of the ECPM. The ECPMI from which the ECP 3D model 3019 was derived may be updated by the system after each use of the system such that it may be trained to a calculated physique of the shopper automatically by the system. By viewing the ECP 3D model 3019 with the 3D model 3015 (as a mesh) it may be easier for the shopper to visualize alterations such as a lengthening of the hem 3037 of the 3D model 3015 by one inch as indicated by the arrow 3016 and the corresponding measurement 3017. This may provide for an easier method for the shopper to make decisions with regard to alterations on the SAF such as lengthening of the hem as illustrated. The system may further update corresponding $DSCI_{DF}$ in accordance with changes or alterations to the 3D model 3015.

Figure 31:
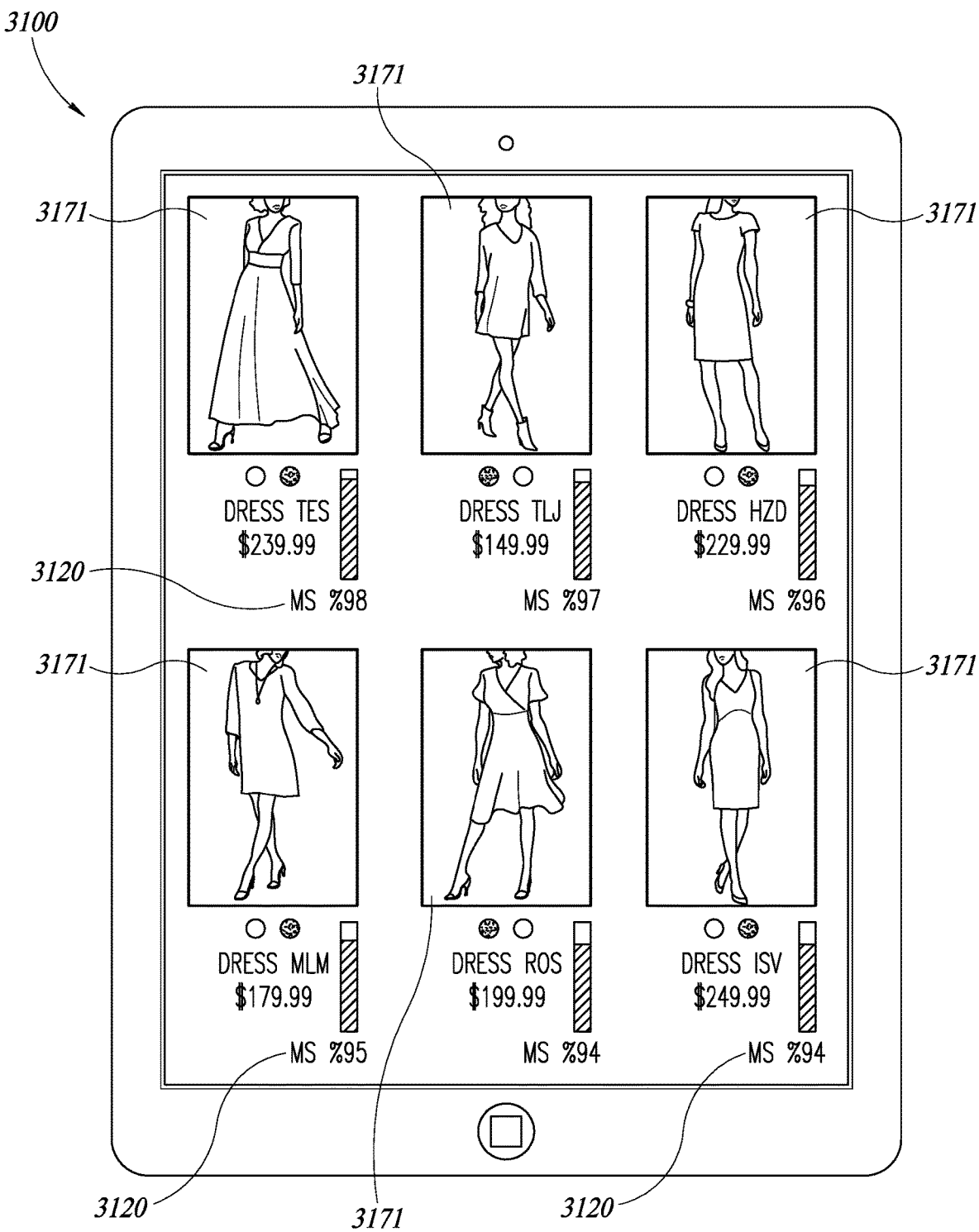
FIG. 31 is a screenshot of a portion of a screen incorporating digiform functionality generated and rendered by the process in accordance with embodiments of the present invention.

A screenshot of a portion of a screen 3100 incorporating digiform functionality generated and rendered by the process in accordance with embodiments of the present invention is shown in FIG. 31. The screenshot 3100 may include a listing of one or more AOCs 3171 including corresponding matching scores (MSs) 3120 that may be arranged in an order of degree of match, such as percentage match, for clothing (e.g., AOCs) of a select vendor (e.g., a retailer such as ABC stores). Other arrangements, however, are also envisioned as may be set by the system, vendor, and/or shopper.

The system may passively or actively select the one or more vendors and operate in accordance with embodiments of the system. For example, the system may communicate with a server of the system to obtain VET for a selected vendor(s). This communication may occur in response to, for example: the shopper visiting a website of a vendor in which case this vendor may be set as a selected vendor; a US of the shopper detected to be within a threshold distance of an establishment (e.g., retail store, etc.) of a vendor in which case the system may select this vendor as a selected vendor; a request of the shopper to select the vendor (e.g., give me digiform of MayZees women's shirts, etc.) and, in response the system may set this vendor as a selected vendor; an ID tag of an apparel of the vendor being scanned in which case a vendor identified on the ID tag may be set as the selected vendor; or any other suitable condition(s) as may be set by the system, vendor, and/or shopper. Once the vendor is selected, the system may obtain VET for the selected vendor from a memory of the system. Thereafter this VET may be processed to determine one or more matching scores for DSCI for one or more AOCs of the selected vendor in accordance with the DSCI of one or more desired AOCs of the vendor. The system may thereafter render the matching score(s) in accordance with embodiments of the present invention.

In some embodiments, it is envisioned that the system may select one or more vendors in response to a request from the shopper (e.g., show me all of retail store X's women's shirts that fit me). Location and distances may be determined using any suitable location device or methods such as (e.g., Global Positioning System (GPS), triangulation, etc.).

For example, in response to a vendor being selected, the system may communicate with a memory of the system to obtain the VET for this vendor. This VET may include information related to for one or more AOCs that the vendor may have for sale with corresponding digiform information in accordance with optional parameters or filters that may be set by the system, vendor, and/or user (e.g., women's shoes, etc.) and which may be stored in the SSI of the shopper. Then, the system may determine a matching score (MS) in accordance with a selected digiform (e.g., a desired AOCs $DSCI_{DF}$) of the shopper for each for each of these AOCs. AOCs that are above a threshold matching score (e.g., 94%, etc.) as may be set by the system, vendor, and/or shopper, may be rendered for the convenience of the shopper on a rendering device of the system such as a rendering device of the shopper's US. To conserve resources, in some embodiments, the system may transmit the SSI of the shopper to a processor of the vendor for processing while in other embodiments, the system may transmit the VET from the vendor to the US of the shopper for processing.

If it is determined that the vendor does not have any AOCs for sale with an MS that is greater than a threshold value, the system may inform the shopper (e.g., "Macy's™ has no clothing with your desired fit at this location, etc.). The system may further provide a selection item for the shopper to set a desired threshold level.

In accordance with embodiments of the present system, it should be appreciated that clothing with a desired fit may be recommended without shoppers having an understanding of clothing size format (e.g., of clothing size) and/or being aware of, or remembering, digiform information when attempting to find clothing of a desired type and/or fit. Rather, embodiments of the prevent invention may analyze digiform information associated with a vendor and the shopper to find a desired fit for the shopper. More particularly, embodiments of the prevent invention may access the digiform information of a vendor's clothing and may determine a matching score indicative of a size match between the vendor's clothing and a desired clothing (e.g., AOC) of the shopper which may be a virtual AOC. Results of this comparison may be rendered as a graphical comparison on a display of the system for the convenience of the shopper. In accordance with embodiments of the present system, the results of this comparison may be rendered using a two- or three-dimensional (e.g., 2D or 3D) representation(s) on a rendering device of the system such as on a display of a user station (US) using one or more overlaying models such as 3D overlaying models. It is envisioned that information related to a simplified match number such as a match score (MS) which may also be known as a matching score may be generated by the system and may reflect, for example, a percentage match between the DSC of the tried apparel (e.g., TA) and the corresponding desired AOC (DA). Embodiments of the prevent invention may provide for a user, such as a shopper, to express desired modifications and/or alterations of one or more AOCs graphically on, for example, a display of the system. Information related to these desired AOC may then be used by the system to search for clothing of a vendor that may match the shoppers desired clothing fit.

Figure 32:
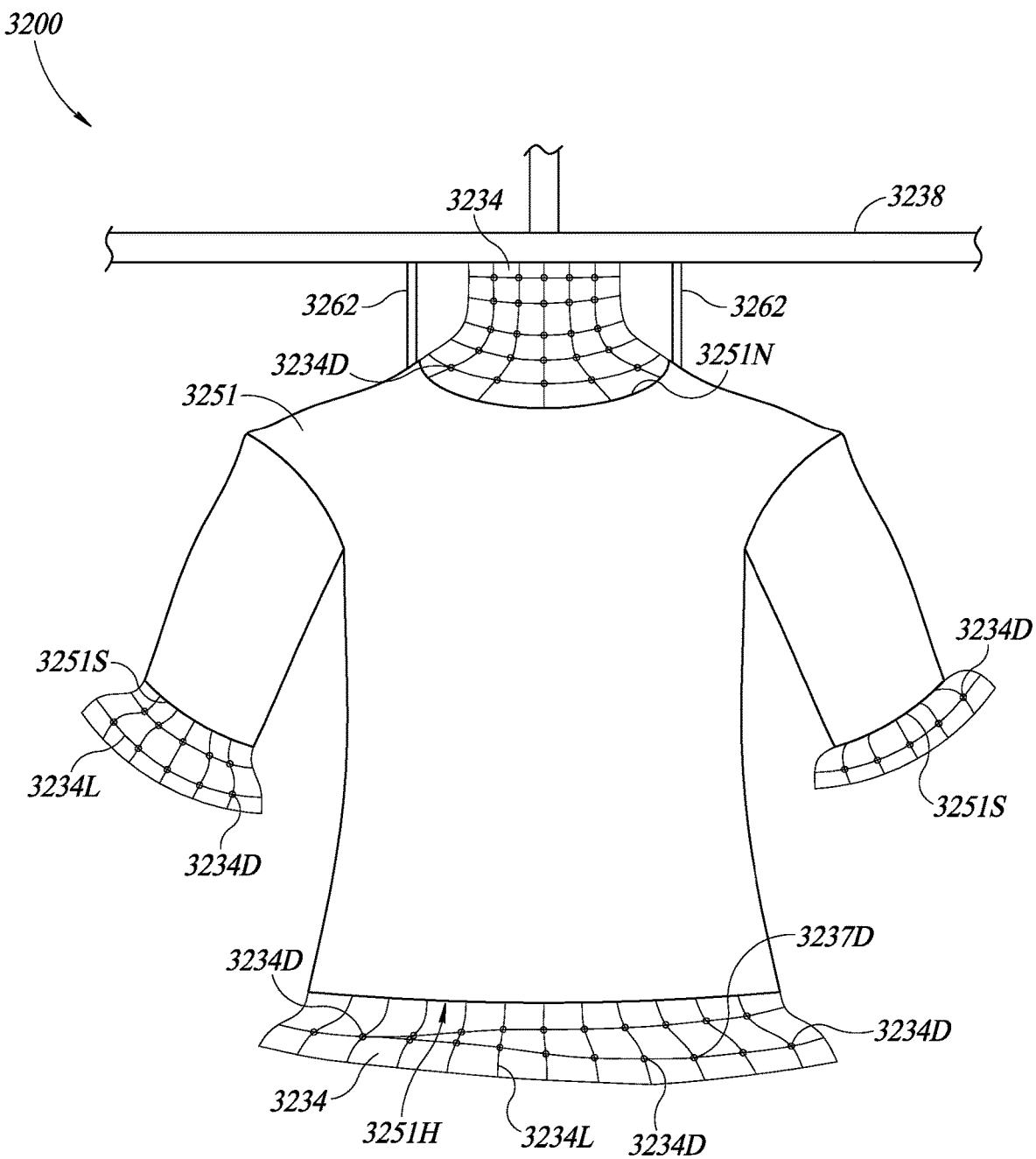
FIG. 32 is a detailed front view of a portion of an AE in an expanded orientation within an AOC 3251 in accordance with embodiments of the present invention.

A detailed front view 3200 of a portion of an AE 3234 in an expanded orientation within an AOC 3251 in accordance with embodiments of the present invention is shown in FIG. 32. Apparel couplers 3262 may couple the AOC 3251 (such as a shirt, etc.) to an APS 3238 which may support the AOC 3251. The AE 3234 may receive an OPF from an FDU and may be situated within a cavity of the AOC 3251 having one or more openings such as a neck opening 3251N, sleeve openings 3251S, and a hem opening 3251H. The AE 3234 may include any suitable pattern that may be recognized by the system, such as a mesh including lines 3234L coupled to nodes or dots 3234D, and may extend beyond the one or more openings of the AOC 3251 such that the system may capture an image of the AOC 3251 and the AE 3238 which may extend therefrom and may employ any suitable method such as image analysis, artificial intelligence, etc., to distinguish the AOC 3251 from the AE 3238. Accordingly, the process may determine a periphery of the AOC 3251 at its one or more openings such as the neck opening 3251N, sleeve openings 3251S, and the hem opening 3251H through image analysis techniques. In yet other embodiments, the system may determine locations at which the AE 3238 may suddenly increase in size which increase may be indicative of areas in which the AE 3258 may extend though an opening of the one or more openings of the AOC 3251. Accordingly, the system may determine corresponding openings and/or a periphery of the AE 3258 using this information.

It is envisioned that a user, such as a shopper in the present embodiments, may desire to quickly and easily scan one or more AOCs and receive corresponding MS information in real-time when shopping in a physical establishment such as a brick-and-mortar (B&M) shop (e.g., a retail store, warehouse or factory facility, and/or the like). This may be useful when the shopper is searching through racks of clothing for an AOC with a desired fit. Accordingly, embodiments of the present system may scan ID tags of AOCs on clothing racks AOCs, determine MSs for these AOCs, and select AOCs with an MS that is determined to be greater than, or equal to, a threshold value (e.g., 96%, etc.), and render a representation of the selected AOCs with their corresponding MSs on a US of the shopper. AOCs with MSs below the threshold value may be discarded. In this regard, a software tool mode known as a scan mode (SM) may be provided and, when activated (e.g., on) may scan the ID tags of AOCs, may determine MS information for one or more of the scanned ID tags, and render MS information in association with information related to one or more of the scanned AOCs for the convenience of the shopper. An embodiment of an SM in accordance with embodiments of the present system will now be discussed in further detail below with respect to FIG. 33A which shows a perspective view 3300 of a shopper 3301 shopping using a system operating in accordance with embodiments of the present invention. A detailed screenshot of a portion of the scan mode (SM) screen 3300B generated and rendered in accordance with embodiments of the present system is shown in FIG. 33B. A detailed screenshot of a portion of a digiform comparison mode (DCM) screen 2700 in a cross section mode (CSM) generated and rendered in accordance with embodiments of the present invention is shown in FIG. 33C. A detailed screenshot of a portion of a locate mode screen 3300D generated and rendered in accordance with embodiments of the present system is shown in FIG. 33D. These Figures will now be described in more detail.

Figure 33A:
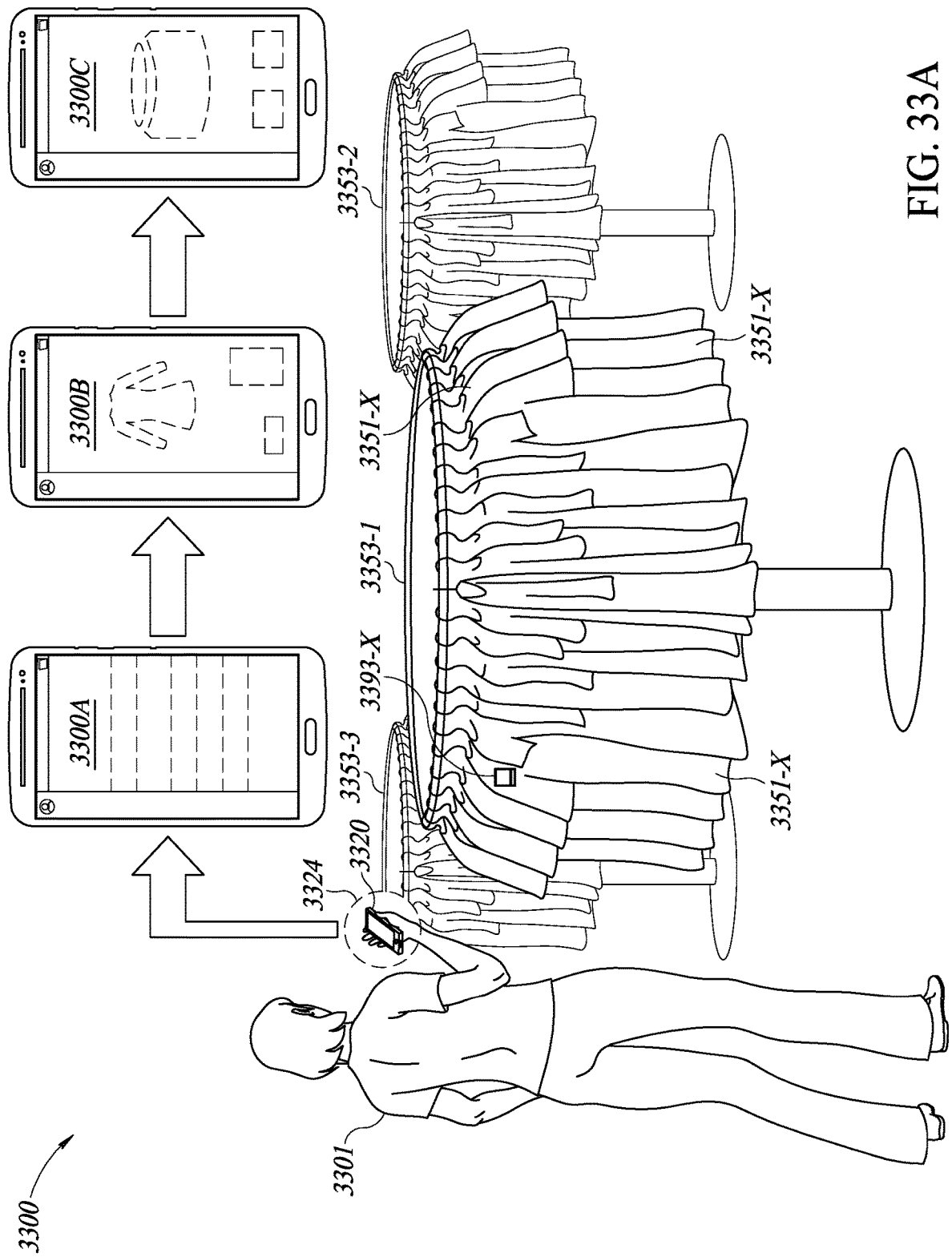
FIG. 33A shows a perspective view of a shopper shopping using a system operating in accordance with embodiments of the present invention.
Figure 33B:
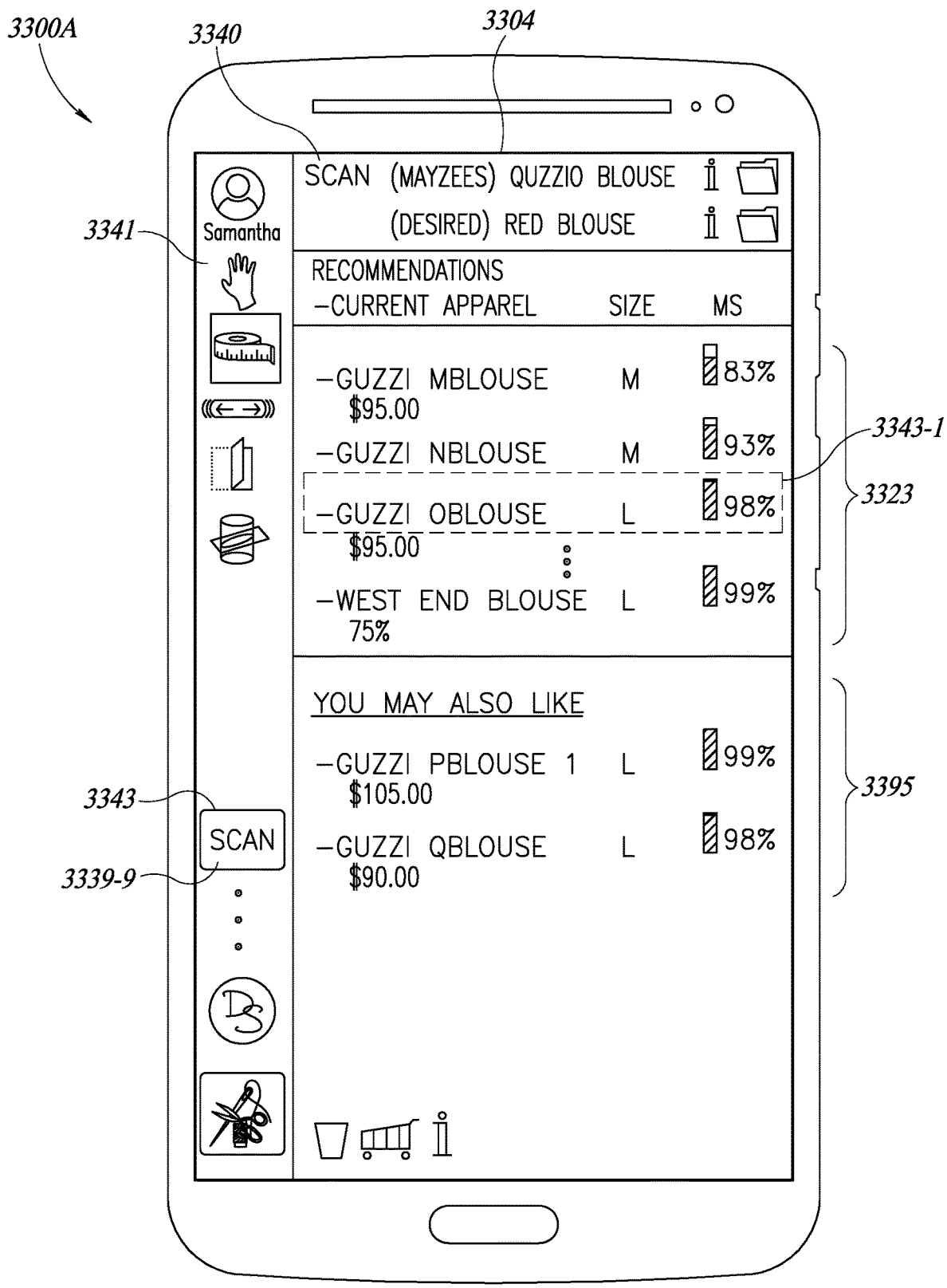
FIG. 33B shows a detailed screenshot of a portion of the scan mode (SM) screen generated and rendered in accordance with embodiments of the present invention.
Figures 33C, 33D:
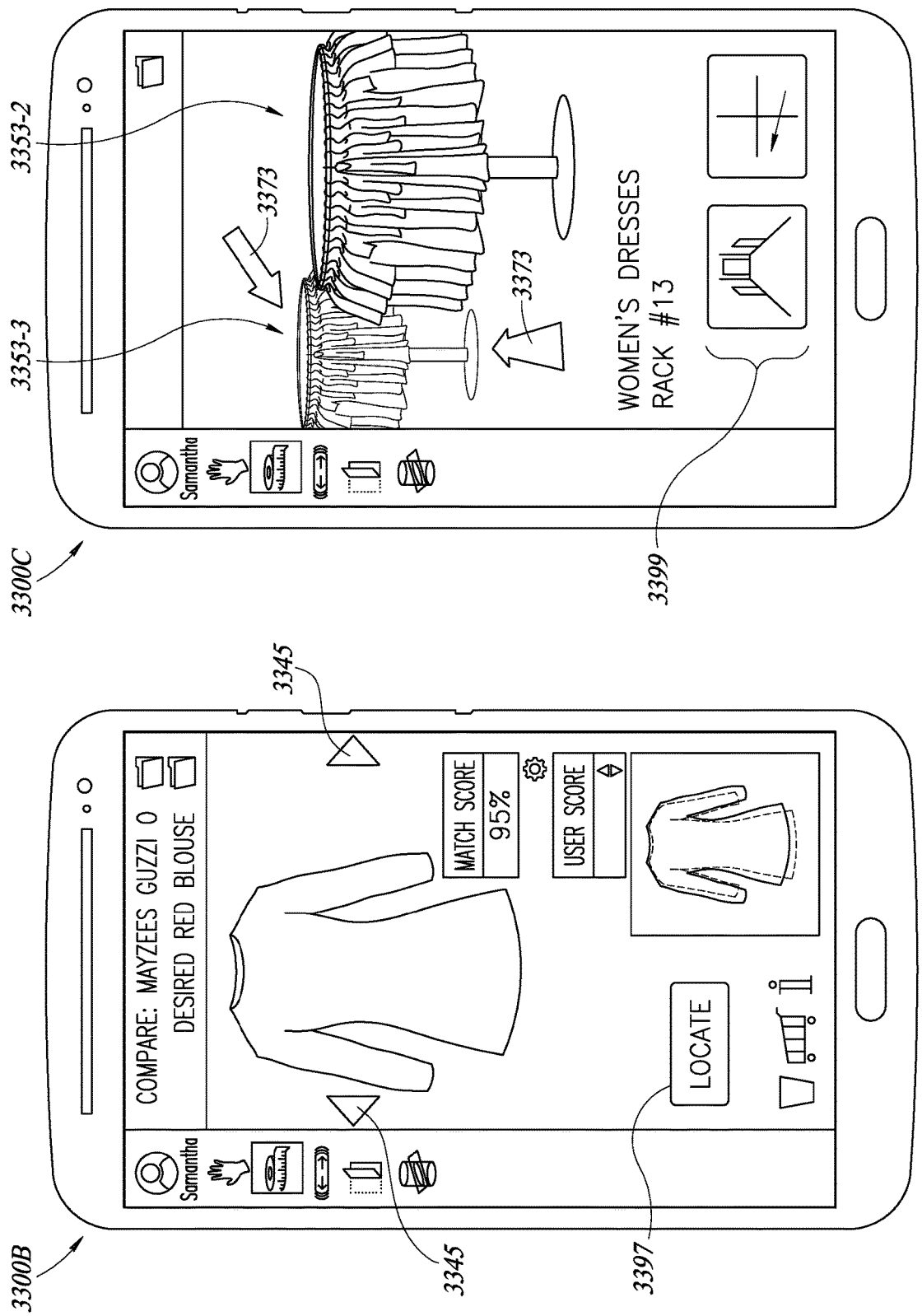
FIG. 33C shows a detailed screenshot of a portion of a digiform comparison mode (DCM) screen in a Cross Section mode (CSM) generated and rendered in accordance with embodiments of the present invention.
FIG. 33D shows a detailed screenshot of a portion of a locate mode screen generated and rendered in accordance with embodiments of the present invention.

For example, with reference to FIG. 33A, the shopper 3301 may be located in a B&M environment such as an apparel store (e.g., MayZees stores in the current embodiments, etc.) having one or more clothing racks 3353-1 through 3353-3 (generally 3353-*x*) each configured with one or more AOCs 3351-*x* having corresponding ID tags 3393-*x*. The US 3324 may include an AIDC scanner 3320 configured to read the ID tags 3393-*x* of the AOCs 3351-*x* when the SM is activated (e.g., on) and the ID tag 3393-*x* is within range or view of the AIDC scanner 3320 (depending upon type of sensor(s) employed for scanning (e.g., NFC, optical, etc.)). For the sake of clarity, it will be assumed that NFC sensors may be employed in the present embodiments. In use, the shopper may activate the SM using any suitable method or methods such as by selecting an SM selection item (SCAN) 3339-9 from a tools menu 3341 rendered on the screen 3300A of the US 3324. In response to selection of the SM selection item 3339-9, the US 3324 may activate the SM (as indicated by highlighting box 3343 which indicates that the SM mode is activated (e.g., on)) and may scan one or more ID tags 3393-*x* of one or more corresponding AOCs 3351-*x* when in proximity to a corresponding ID tag 3393-*x*. For example, the US 3324 may scan the ID tags 3393-*x* when within range of a corresponding ID tag 3393-*x* of the ID tags 3393-*x*. It is envisioned that selection of the SM selection item 3339-9 may toggle the SM on or off (activated and deactivated, respectively) and vice versa.

When the SM is activated (e.g., on), the shopper 3301 may swing the US 3324 past a plurality of AOCs 3351-*x* on a corresponding clothing rack 3353-*x* and the AIDC scanner 3320 of the US 3324 may automatically read the ID tags 3393-*x* that are in proximity to it. Once an ID tag 3393-*x* is read, the system may obtain corresponding DSCI from a memory of the system such as from VEI of a corresponding vendor as may be identified through information obtained from the ID tag 3393-*x* (e.g., MayZees stores, etc.) and/or from settings stored in a memory of the system which may be set by the system and/or user. In yet other embodiments, the ID tag may include the DSCI in its memory. Thereafter, the system may obtain the DSI and MI from the DSCI of the scanned AOC. Each time an ID tag 3393-*x* of a corresponding AOC 3351-*x* is scanned, the system may obtain corresponding location information, associate this location information with the MI of the corresponding AOC 3351-*x*, and/or store this information in a memory of the system for later use. For example, this location information may be employed at a later time to location the corresponding AOC 3351-*x* in B&M shop. Users such as shoppers or vendors may contribute to the location information which may then be updated in real time.

It is further envisioned that the system may obtain SSI for the shopper 3301 from a memory of the system. This SSI may include information related to desired fitting of AOCs such as $DSCI_{DF}$ (e.g., desired fitting AOCs of the shopper) from which $DSI_{DF}$ may be obtained. Then, the system may compare the DSI of each of the scanned AOCs with the $DSI_{DF}$ of a corresponding type of apparel (e.g., shirts, pants, etc.) and generate an MS for each of the scanned AOCs. The system may activate a comparison functionality mode each of these comparisons. Thus, if the scanned AOC is a pair of pants, the system may obtain $DSCI_{DF}$ and corresponding $DSI_{DF}$ for a pair of pants and if the AOC is a shirt, the system may obtain $DSCI_{DF}$ and corresponding $DSI_{DF}$ for a shirt. It is further envisioned that the shopper may select one or more AOCs from its LRA for comparison. For example, in the current embodiments, it will be assumed that only AOCs of a blouse type were scanned and the selected the $DSI_{DF}$ corresponds similarly. It is envisioned that the shopper or system may set default $DSCI_{DF}$ for each time of clothing (e.g., shirts, pants, blouses, skirts, etc.).

Once the MS is determined for each scanned AOC 3393-*x*, the system may determine one or more AOCs 3393-*x*, which have a MS that is greater than, or equal to, a threshold value (e.g., 96%, etc.) as may be set by the system and/or shopper. Then, the system may render information related to each AOC 3393-*x* that is determined to have a MS that is greater than or equal to the threshold value, such information which may be rendered may include, for example, one or more of name, price, and/or color (e.g., obtained from the MI) and associated MSs (illustrated as a percent) as illustrated in a list of scanned clothing (LSC) 3323.

It is also envisioned that the system may obtain DSCI-V and determine MSs for AOCs which have not just have had ID tags scanned by the shopper. For example, the system may determine MS for other AOCs (these AOCs may be referred to as unscanned clothing (e.g., AOCs which have not had their ID tags just scanned)) that are listed in the VEI of the current vendor and may be of the same type (e.g., blouses, etc.) as the AOCs which have just had their ID tags scanned by the shopper. Then, the system may determine one or more unscanned ID AOCs, which have a MS that is greater than, or equal to, a threshold value (e.g., 96%, etc.) as may be set by the system and/or shopper. Then, the system may render information related to each of the unscanned AOCs that is determined to have a MS that is greater than or equal to the threshold value, such as name, price, and/or color (e.g., obtained from the MI) and associated MSs (illustrated as a percent) as illustrated in a list of unscanned clothing (LUSC) 3395.

An action toolbar 3304 may include information related to functionality of a current screen 3300A as indicated in a functionality area 3340 which may include an identifier such as "SCAN' which may be indicative of the SM being active and configured to provide functionality to compare at least a first and second AOCs such as a current scanned apparel and a selected desired apparel, respectively, and may render and corresponding identification information 3301-1 (e.g., "MayZees Guzzi O") and 3301-2 (e.g., "desired Red Blouse") 2701-2, respectively.

The shopper may select one or more of AOCs listed in the LSC 3323 or LUSC 3395 to view further information related to the selected AOC. For example, assuming the shopper has selected the GUZZI O Blouse as illustrated by highlighting 3343-1 in the LSC 3323, the system may, in response, generate and render a 2D or 3D model of the selected apparel in a suitable mode such as a comparison mode (CM) wherein the 2D or 3D model of the selected AOC may be rendered in relation to a 2D or 3D model of the desired AOC with which it was compared to determine the corresponding MS as illustrated in the screen 3300B which may be similar to the CM screen illustrated in FIG. 27.

The system may further render a location selection item in association with one or more of the AOCs such as location selection item 3397. In response to selection of the location selection item 3397, the system may enter a locate mode (LM) and determine a location of a corresponding AOC in accordance with location information associated with the corresponding AOC which may be stored in a memory of the system. Then, the system may determine a current location of the MS 3324 of the shopper 3301 and determine and render guidance information such shown in the screen 3300D which shows guidance information such as arrows 3373 which may guide the shopper 3301 to a location of the selected AOC as illustrated in the screen 3300C. The guidance information may be presented using any suitable method such as a planar map, an augmented reality (AR) map (as shown) or any suitable map or mapping methods as may be set by the system and/or shopper or other user. In yet other embodiments, the map may be generated in accordance with virtual reality (VR) methods.

In some embodiments, the guidance information may be transmitted to one or more US such as to US of the vendor so that an associate of the vendor may locate the desired rack and/or AOC for the convenience of the shopper. This may be desirable when the AOC may be located in an area that the shopper may not access such as a stock room and the like. Accordingly, a user (e.g., the shopper and/or vendor) may set a system configuration to provide guidance information to desired USs such as to a US of the shopper and/or to a US of the vendor. Further, the guidance information may be rendered in accordance with access restrictions such that it may not guide the shopper to areas that are preferably inaccessible to the shopper such as a stock room for employees of the vendor. Accordingly, access restrictions may be associated with locations and/or users.

Accordingly, embodiments of the present system may determine one or more AOCs which may fit the shopper with a desired fit, render a representation of one or more of these AOCs, and may provide guidance information for obtaining the desired AOC in a B&M environment.

It is further envisioned that embodiments of the system may form and/or update location information which may be obtained from one or more USs of users of the system and store this information in association with a corresponding AOC. It is also envisioned that embodiments of the system may determine a location of a US of a user and a selected AOC and may determine and render guidance information to a location of the AOC.

In accordance with embodiments of the present invention, there is provided an apparatus to measure digiform of a given AOC. The apparatus may be configured to capture a highly detailed measurement of an existing AOC dimensions and/or elasticity as digital data. This data may be saved as digiform information and may be referred to as digiform. A process of obtaining a digiform from a physical AOC (e.g., a ready-made apparel) may be referred to as digiforming or a digiforming operation. It envisioned that embodiments of the present system may utilize digiform information to reduce the number of unsuccessful fitting trials which may result in costly returns to a vendor. It is also envisioned that embodiments of the present invention may interact with a shopper to determine a desired fit of an article of clothing and may recommend one or more articles of clothing (AOCs) based upon this desired fit so as to provide for an enhanced shopping experience while resulting in cost reductions for vendors.

Accordingly, embodiments of the prevent invention may provide a user-friendly system that provides for a user such as a shopper to express what the user would like in an apparel with few if any alterations. Embodiments of the prevent invention may generate and render information which a user may easily view on a rendering device of the system using a comparison with an existing familiar AOC.

It is envisioned that the user may interact with the rendered information to cause the system to respond accordingly and generate information which may be used to modify and/or generate information which may be used to modify a digital representation of an existing AOC and/or generate a digital representation of desired AOC. The system may employ simple graphical interfaces and methods in with which a user may interact to express a desired apparel fit using simplified graphical methods (e.g., gestures) and/or natural language such as "I would like an apparel that just fits like this, with half an inch more at the waist." The system may then provide or otherwise recommend an AOC with the correct fit and/or may generate information which may be employed by the system to form a new apparel which may correspond with the input of the user.

In accordance with embodiments of the present invention, digiform information of an AOC that a user has tried on may be employed to aid in the correct or desired fitment of an AOC to the user. Accordingly, even when a user tries out a new AOC and does not get a desired fit, embodiments of the prevent invention may provide an easy method for a user to express and/or specify what the user needs or otherwise desires with reference to the digiformed AOC. Such information may be provided by the user as a natural language such as "I need it a bit tighter under the bust." Accordingly, the system may employ a natural language engine including a voice-to-text (VTT) engine which may perform voice to text processing and the like.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus for ascertaining a desired fit for at least one original article of clothing (AOC) for a user, comprising:
    at least one memory;
    at least one rendering device comprising at least one display;
    at least one controller operative to:
        obtain digital size certificate information (DSCI) comprising original digital size information (DSI) related to at least one of form of the at least one AOC and corresponding identification information related to the at least one AOC from the at least one memory;
        reconstruct a first digital 3D model of the at least one AOC in accordance with the original DSI without requiring human body profile information;
        render the first digital 3D model on the at least one rendering device which includes a user interface;
        modify the first digital 3D model in accordance with alterations desired by the user and input via said user interface to generate a modified second digital 3D model separate from and in addition to said first digital 3D model;
        generate desired fitting DSI (DSIDF) in accordance with the modified second digital 3D model, said DSIDF separate from and in addition to said original DSI;
        store the DSIDF in the at least one memory; and
        provide a comparison of fully viewable cross-sectional overlaid image views between said first digital 3D model and said modified second 3D digital model fully overlaid over each other based on DSI.

2. The apparatus according to claim 1, wherein the at least one controller is operative to render a measurement related to at least one location in response to the user selecting the at least one location on the first or second 3D model.

3. The apparatus according to claim 2, the at least one controller is operative to modify the rendered measurement in accordance with an input of the user and modify the DSIDF accordingly.

4. The apparatus according to claim 1, wherein the at least one controller is operative to obtain DSI for a plurality of articles of clothing of a vendor (DSI-V).

5. The apparatus according to claim 1, wherein the at least one controller is operative to provide the user at least one of a virtual fitting, visual comparison, and numerical comparison with one or more AOCs based upon a comparison of DSCI thereof.

6. The apparatus according to claim 1, wherein the at least one controller is operative to render a determined match score (MS) for each of the plurality of articles of clothing of the vendor.

7. The apparatus according to claim 1, wherein at least one AOC includes a corresponding ID tag able to be read by a scanner for retrieving DSI information.

8. The apparatus according to claim 1, wherein the controller is operative to render at least one surface of the first or second digital 3D model using colors to indicate elasticity information.

9. A method of ascertaining a desired fit for at least one original article of clothing (AOC) for a user, the method performed by at least one controller, the method comprising acts of:
configuring the at least one controller to:
obtain digital size certificate information (DSCI) comprising original digital size information (DSI) related to at least one of form of the at least one AOC of the user and corresponding identification information related to the at least one AOC from a memory;
reconstruct a first digital 3D model of the at least one AOC in accordance with the DSI without requiring human body profile information;
render the first digital 3D model on at least one rendering device comprising at least one display and a user interface;
modify the first digital 3D model in accordance with alterations desired by the user and input via said user interface to generate a modified second digital 3D model separate from and in addition to said first digital 3D model;
generate desired fitting DSI (DSIDF) in accordance with the modified second digital 3D model, said DSIDF separate from and in addition to said original DSI;
store the DSIDF in the memory;
provide a visual comparison of fully viewable cross-sectional overlaid image views of a plurality of 3D models including at least said first digital 3D model and said second digital 3D model simultaneously fully overlaid over each other; and
determine a match score (MS) by comparing 3D models represented as DSI of at least one AOC of a vendor with that of at least one AOC of the user.

10. The method according to claim 9, wherein the at least one controller is operative to render a measurement related to at least one location in response to the user selecting the at least one location on the 3D model.

11. The method according to claim 10, wherein the at least one controller is operative to modify the rendered measurement in accordance with an input of the user and modify the DSIDF accordingly.

12. The method according to claim 9, wherein the at least one controller is operative to obtain DSI for a plurality of articles of clothing of a vendor (DSI-V).

13. The method according to claim 9, wherein the at least one controller is operative to provide the user at least one of a virtual fitting, visual comparison, and numerical comparison with one or more AOCs based upon a comparison of DSCI thereof.

14. The method according to claim 9, wherein the at least one controller is operative to render the determined match score (MS) for each of the plurality of articles of clothing of the vendor.

15. The method according to claim 13, wherein the at least one controller is operative to select one or more articles of clothing of the vendor that have a match score (MS) that is greater than a threshold value.

16. The method according to claim 9, further comprising rendering at least one surface of the first or second digital 3D model using colors to indicate elasticity information.

17. A method of ascertaining a desired fit for at least one original article of clothing (AOC) for a user, the method performed by at least one controller, the method comprising acts of:
configuring the at least one controller to:
obtain digital size certificate information (DSCI) comprising original digital size information (DSI) related to at least one AOC and from a memory;
reconstruct a first digital 3D model of the at least one AOC of the user in accordance with the DSI without requiring human body profile information;
render the first digital 3D model on at least one rendering device comprising at least one display and a user interface;
modify the first digital 3D model in accordance with alterations desired by the user and input via said user interface to generate a modified second digital 3D model separate from and in addition to said first digital 3D model;
generate desired fitting DSI (DSIDF) in accordance with the modified second digital 3D model, said DSIDF separate from and in addition to said original DSI;
store the DSIDF in the memory;
provide visual comparison of fully viewable cross-sectional views between two or more 3D models including at least said first digital 3D model and said second digital 3D model overlaid over each other; and
determine a match score (MS) by comparing DSI of at least one AOC of a vendor with that of at least one AOC of the user.

18. The method according to claim 17, wherein the at least one controller is operative to render a measurement related to at least one location in response to the user selecting the at least one location on the first or second 3D model.

19. The method according to claim 18, wherein the at least one controller is operative to obtain DSI for a plurality of articles of clothing of a vendor (DSI-V).

20. The method according to claim 19, wherein the at least one controller is operative to provide the user at least one of a virtual fitting, visual comparison, and numerical comparison with one or more AOCs based upon a comparison of DSCI thereof.

\* \* \* \* \*